(12) United States Patent
Ely et al.

(10) Patent No.: US 6,788,221 B1
(45) Date of Patent: Sep. 7, 2004

(54) SIGNAL PROCESSING APPARATUS AND METHOD

(75) Inventors: David T. Ely, Harston (GB); Andrew N. Dames, Cambridge (GB)

(73) Assignee: Synaptics (UK) Limited, Cambridgeshire (GB)

( * ) Notice: Subject to any disclaimer, the term of this patent is extended or adjusted under 35 U.S.C. 154(b) by 0 days.

(21) Appl. No.: 09/220,354

(22) Filed: Dec. 24, 1998

Related U.S. Application Data

(63) Continuation of application No. PCT/GB97/01762, filed on Jun. 30, 1997.

(30) Foreign Application Priority Data

| Jun. 28, 1996 | (GB) | ............................................. 9613673 |
| Dec. 24, 1997 | (GB) | ............................................. 9727356 |

(51) Int. Cl.[7] .......................................... H03M 11/00
(52) U.S. Cl. ............................. 341/20; 341/5; 341/111; 340/870.34; 336/124; 336/130; 324/207.17; 178/20.04
(58) Field of Search ............................. 341/20, 5, 15, 341/111; 340/870.34; 336/129, 130; 324/207.17; 178/18.06, 18.07, 20.04

(56) References Cited

U.S. PATENT DOCUMENTS

| 2,145,742 A | 1/1939 | Wechsung |
| 2,867,783 A | 1/1959 | Childs |
| 2,942,212 A | 6/1960 | Mynall |

(List continued on next page.)

FOREIGN PATENT DOCUMENTS

| DE | 1134848 | 8/1962 |
| DE | 3500121 A1 | 7/1986 |
| DE | 3620412 A1 | 12/1987 |

(List continued on next page.)

OTHER PUBLICATIONS

Patent Abstracts of Japan, vol. 010, No. 009, (P–420), Jan. 14, 1986 & JP 60 165512 A (Toshiba KK), Aug. 28, 1985.
Klatt, "Phase of Digital Data Fixes Shaft Angle", Electrical Design News, vol. 16, No. 12, Jun. 15, 1971, pp. 53–56, XP002045871.
Patent Abstracts of Japan, vol. 15, No. 37 (P–1159), Jan. 29, 1991 & JP 02 275314 A (Omron Tateisi Electron Co), Nov. 9, 1990.

(List continued on next page.)

Primary Examiner—Michael Horabik
Assistant Examiner—Albert K. Wong
(74) Attorney, Agent, or Firm—Nixon & Vanderhye P.C.

(57) ABSTRACT

Processing circuitry is provided for processing signals received from, for example, sense coils forming part of a position encoder used to encode the relative positions of two relatively moveable members. The position encoder is such that each of the plurality of signals from the sense coils varies sinusoidally with the relative position of the members but out of phase with respect to each other. The processing circuitry comprises mixers for multiplying each of the received signals with one of a corresponding plurality of periodic time varying signals, each having the same predetermined period and a different predetermined phase, and an adder for adding the signals from the mixers. The phase of the mixing signals are chosen so that the output signals from the adder contains a single periodic component having the predetermined period whose phase varies with the relative position of the two members. Preferably, a reference channel is provided in order to allow for compensation of common phase errors in both channels. The period time varying signals multiplied with each of the signals from the position encoder preferably comprise a two or three level square wave signal having a number of transitions designed to reduce the low order harmonic content of the mixing signals.

64 Claims, 29 Drawing Sheets

U.S. PATENT DOCUMENTS

| | | |
|---|---|---|
| 3,219,956 A | 11/1965 | Newell et al. |
| 3,297,940 A | 1/1967 | Mulligan et al. |
| 3,482,242 A | 12/1969 | Hargrove .................... 341/116 |
| 3,647,963 A | 3/1972 | Bailey |
| 3,772,587 A | 11/1973 | Ferrand et al. |
| 3,812,481 A | 5/1974 | Stednitz |
| 3,851,242 A | 11/1974 | Ellis |
| 3,895,356 A | 7/1975 | Kraus |
| 3,898,635 A | 8/1975 | Kulterman |
| 3,906,436 A | 9/1975 | Kurauchi et al. |
| 3,962,663 A | 6/1976 | Visser |
| 4,005,396 A | 1/1977 | Fujiwara et al. |
| 4,014,015 A | 3/1977 | Gundlach |
| 4,065,850 A | 1/1978 | Burr et al. |
| 4,081,603 A | 3/1978 | Davis et al. |
| 4,092,852 A | 6/1978 | Fowler et al. |
| 4,094,572 A | 6/1978 | Burr et al. |
| 4,097,684 A | 6/1978 | Burr |
| 4,150,352 A | 4/1979 | Pomella et al. |
| 4,156,192 A | 5/1979 | Schedrovitsky et al. |
| 4,210,775 A | 7/1980 | Rodgers et al. |
| 4,223,300 A | 9/1980 | Wiklund |
| 4,255,617 A | 3/1981 | Carau, Sr. et al. .............. 341/5 |
| 4,341,385 A | 7/1982 | Doyle et al. |
| 4,423,286 A | 12/1983 | Bergeron |
| 4,425,511 A | 1/1984 | Borsh |
| 4,482,784 A | 11/1984 | Whetstone |
| 4,504,832 A | 3/1985 | Conte |
| 4,507,638 A | 3/1985 | Brosh |
| 4,532,376 A | 7/1985 | Rockwell |
| 4,577,057 A | 3/1986 | Blesser |
| 4,593,245 A | 6/1986 | Vierti et al. |
| 4,609,776 A | 9/1986 | Murakami et al. |
| 4,642,321 A | 2/1987 | Schoenberg et al. |
| 4,693,778 A | 9/1987 | Swiggett et al. |
| 4,697,144 A | 9/1987 | Howbrook |
| 4,697,244 A | 9/1987 | Murakami et al. |
| 4,704,501 A | 11/1987 | Taguchi et al. |
| 4,709,209 A | 11/1987 | Murakami et al. |
| 4,711,026 A | 12/1987 | Swiggett et al. |
| 4,711,977 A | 12/1987 | Miyamori et al. |
| 4,723,446 A | 2/1988 | Saito et al. |
| 4,734,546 A | 3/1988 | Landmeier |
| 4,737,698 A | 4/1988 | McMullin et al. |
| 4,786,765 A | 11/1988 | Yamanami et al. |
| 4,820,961 A | 4/1989 | McMullin |
| 4,848,496 A | 7/1989 | Murakami et al. |
| 4,868,443 A | 9/1989 | Rossi |
| 4,878,553 A | 11/1989 | Yamanami et al. |
| 4,891,590 A | 1/1990 | Hammel et al. |
| 4,893,077 A | 1/1990 | Auchterlonie |
| 4,902,858 A | 2/1990 | Yamanami et al. |
| 4,963,703 A | 10/1990 | Phillips |
| 4,975,546 A | 12/1990 | Craig |
| 4,985,691 A | 1/1991 | Pulyer et al. |
| 4,999,461 A | 3/1991 | Murakami et al. |
| 5,013,047 A | 5/1991 | Schwab |
| 5,028,745 A | 7/1991 | Yamanami et al. |
| 5,041,785 A | 8/1991 | Bogaerts et al. |
| 5,082,286 A | 1/1992 | Ryan et al. |
| 5,088,928 A | 2/1992 | Chan |
| 5,129,654 A | 7/1992 | Bogner |
| 5,136,125 A | 8/1992 | Russell |
| 5,177,389 A | 1/1993 | Schalk |
| 5,188,368 A | 2/1993 | Ryan |
| 5,381,091 A | 1/1995 | Kobayashi et al. |
| 5,406,155 A | 4/1995 | Persson |
| 5,434,372 A | 7/1995 | Lin |
| 5,486,731 A | 1/1996 | Masaki et al. |
| 5,619,431 A | 4/1997 | Oda ........................... 702/150 |
| 5,625,239 A | 4/1997 | Person et al. |
| 5,646,496 A | 7/1997 | Woodland et al. .......... 318/632 |
| 4,878,533 A | 9/1997 | Yamanami et al. |
| 5,693,993 A | 12/1997 | Ito et al. |
| 5,748,110 A | 5/1998 | Sekizawa |
| 5,783,940 A | 7/1998 | Kolomeitsev |
| 5,815,091 A | 9/1998 | Dames |
| 6,124,708 A | 9/2000 | Dames |
| 6,249,234 B1 * | 6/2001 | Ely et al. ...................... 341/20 |

FOREIGN PATENT DOCUMENTS

| | | |
|---|---|---|
| EP | 0159191 A2 | 10/1985 |
| EP | 0182085 A3 | 5/1986 |
| EP | 0182085 A2 | 5/1986 |
| EP | 0209513 A1 | 6/1986 |
| EP | 0218745 | 4/1987 |
| EP | 0313046 | 4/1989 |
| EP | 0537458 | 4/1993 |
| EP | 0552001 A1 | 7/1993 |
| EP | 0554900 | 8/1993 |
| EP | 0607694 A1 | 7/1994 |
| EP | 0657917 A1 | 6/1995 |
| EP | 0675581 A1 | 10/1995 |
| EP | 0680009 | 11/1995 |
| EP | 0680009 A2 | 11/1995 |
| EP | 0709648 A2 | 5/1996 |
| EP | 0716390 | 6/1996 |
| EP | 0743508 A2 | 11/1996 |
| EP | 0772149 | 5/1997 |
| FR | 1325017 | 3/1962 |
| FR | 2298082 | 8/1976 |
| FR | 2682760 | 4/1993 |
| GB | 851543 | 10/1960 |
| GB | 1122763 | 8/1968 |
| GB | 1452132 | 10/1976 |
| GB | 2012431 A | 7/1979 |
| GB | 2021273 A | 11/1979 |
| GB | 2042183 A | 9/1980 |
| GB | 2059593 A | 4/1981 |
| GB | 2064125 A | 6/1981 |
| GB | 2074736 A | 11/1981 |
| GB | 1604824 | 12/1981 |
| GB | 2103943 A | 3/1983 |
| GB | 2141235 A | 12/1984 |
| JP | 02-248816 | 10/1990 |
| WO | WO 92/12401 | 7/1992 |
| WO | WO 94/25829 | 11/1994 |
| WO | 95/31696 | 11/1995 |
| WO | WO 95-31696 | 11/1995 |
| WO | WO 96/03188 A1 | 2/1996 |
| WO | 97/14935 | 4/1997 |
| WO | WO 98/00921 | 1/1998 |

OTHER PUBLICATIONS

Patent Abstracts of Japan, vol. 10, No. 32 (E–379), Feb. 7, 1986 & Jp 60 189231 A (Matsushita Denki Sangyo KK, Sep. 1985.

McDonnel, "The Use of Inductosyn to Digital Converters in Linear Control Systems", Automation, vol. 10, No. 11–12, Nov. 1975–Dec. 1975, pp. 31–32.

Electronics Letters, vol. 11, No. 1, Jan. 9, 1975, pp. 5–6, Gordon, Digital xy Position Indicator Using Walsh Functions.

Pulle et al, "A New Magnetoresistive Based Sensor for Switched Reluctance Drives" Proceedings of the Annual Power Electronics Specialists Conference (PECS), Toledo, Jun. 29–Jul. 3, 1992, vol. 2, No. Conf, 23, Jun. 29, 1992, pp. 839–843, Institute of Electrical and Electronics Engineers.

* cited by examiner

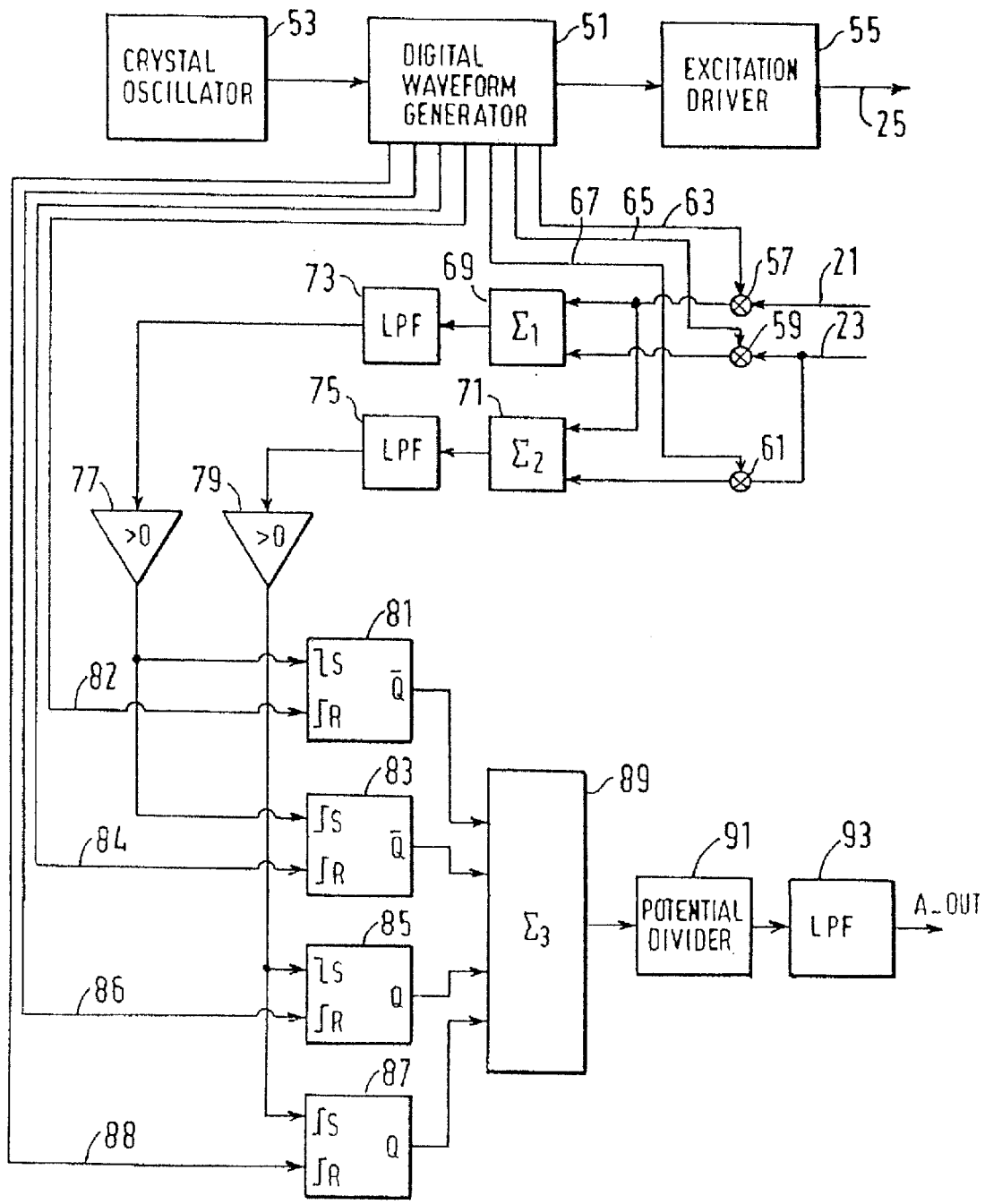

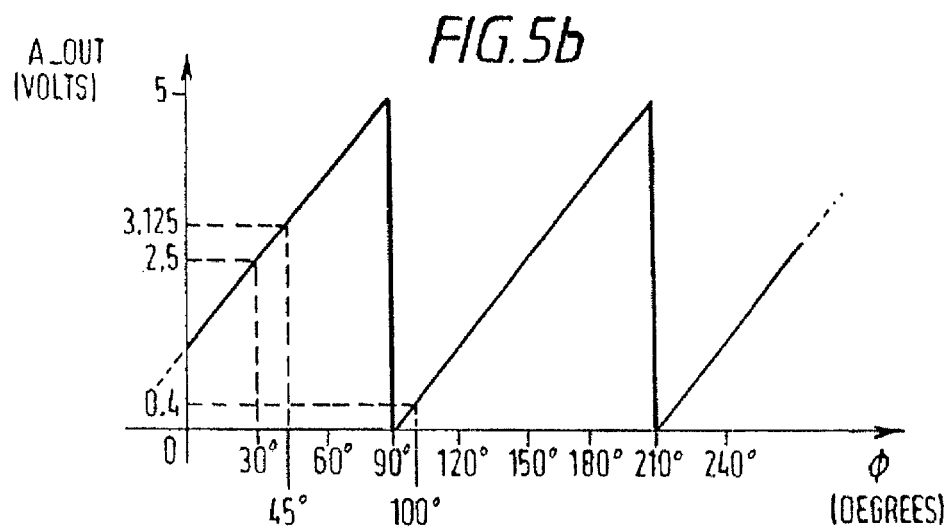
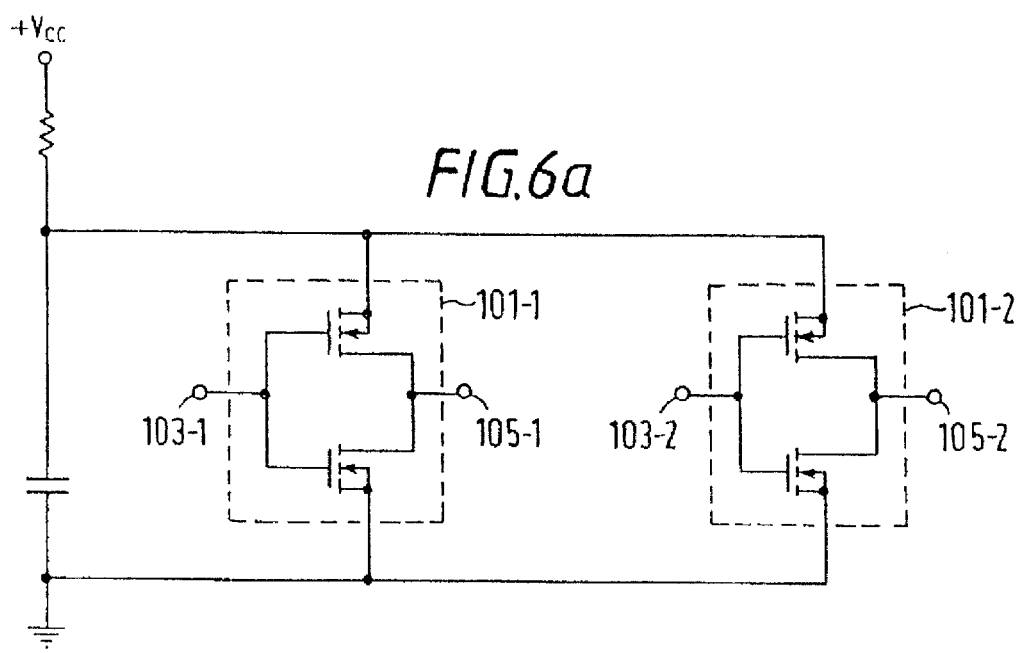

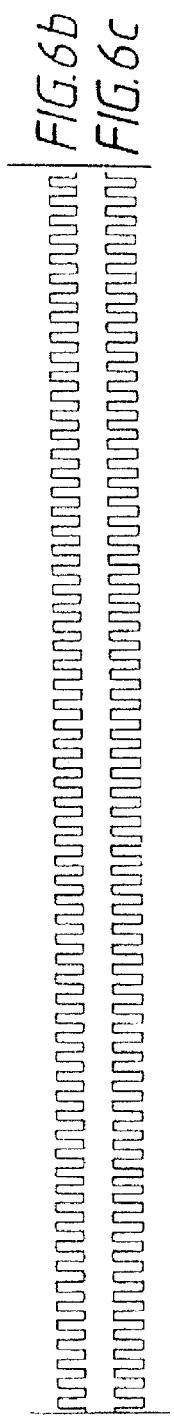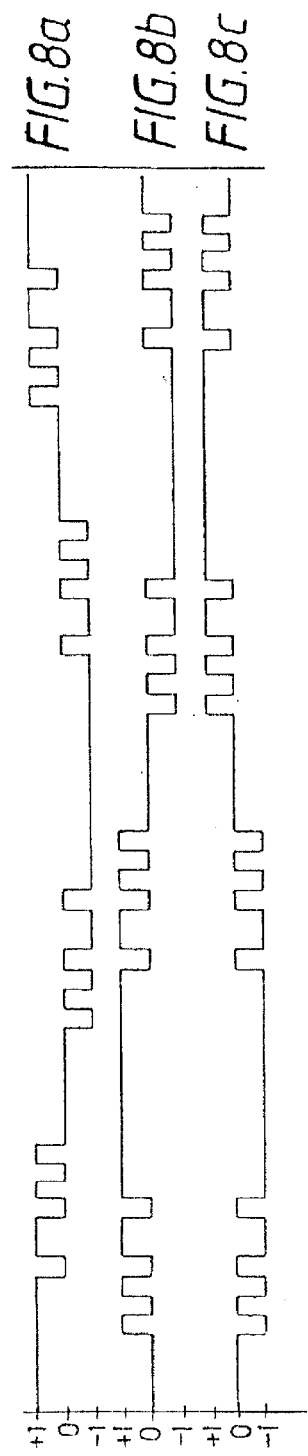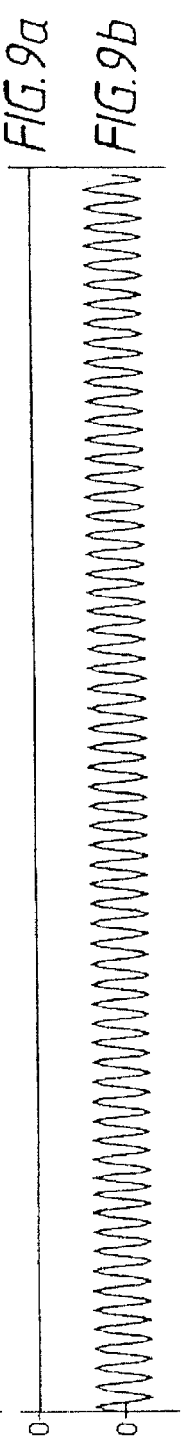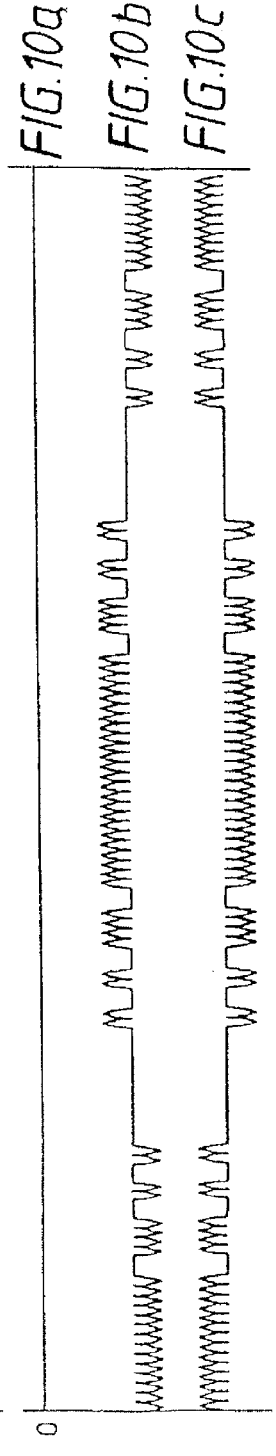

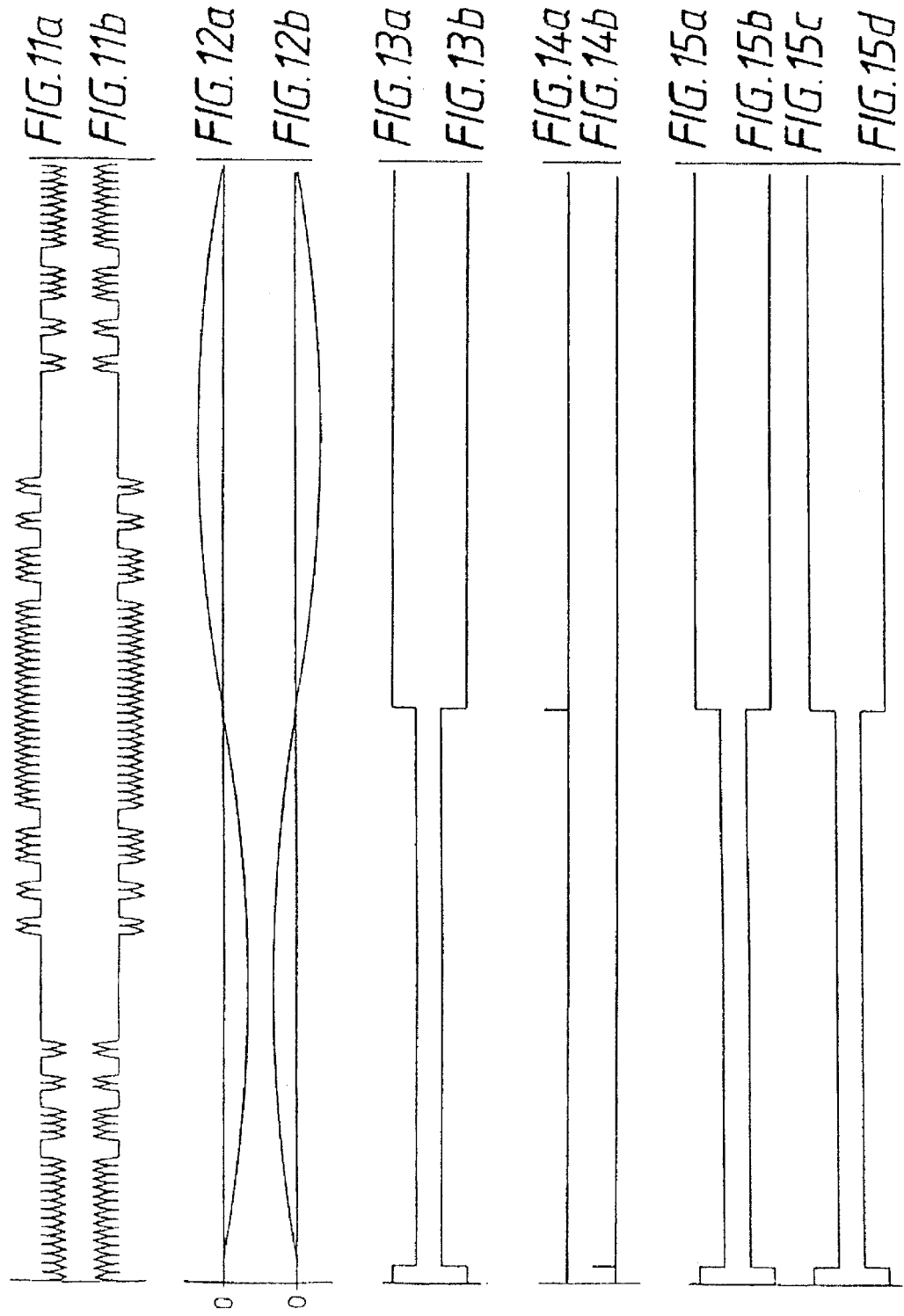

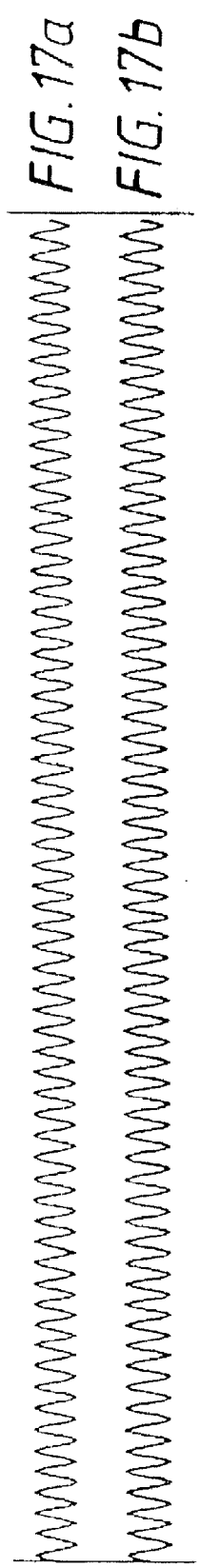
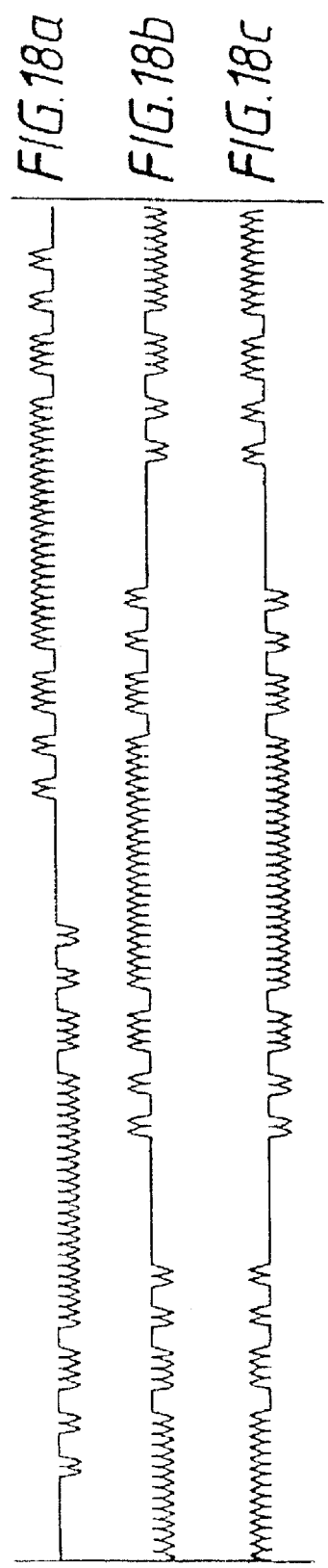

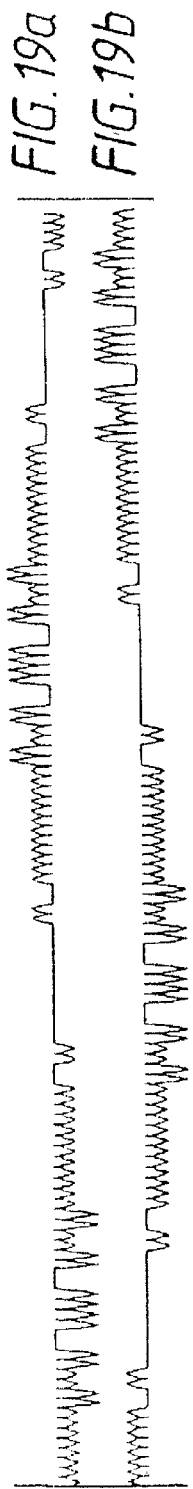
FIG.19a
FIG.19b
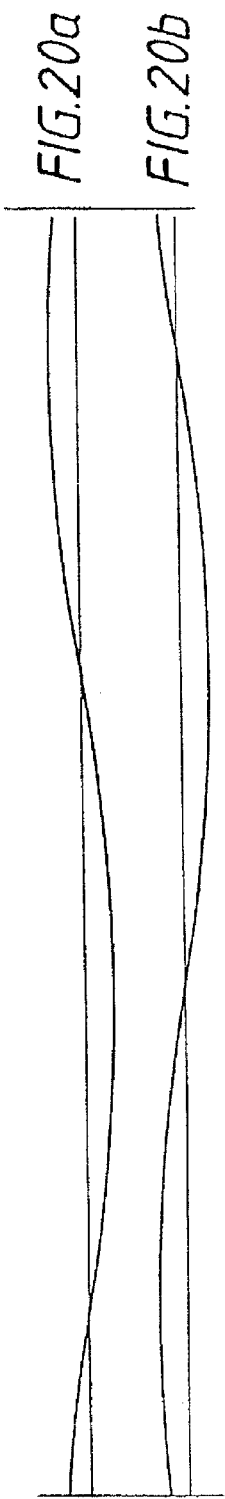
FIG.20a
FIG.20b
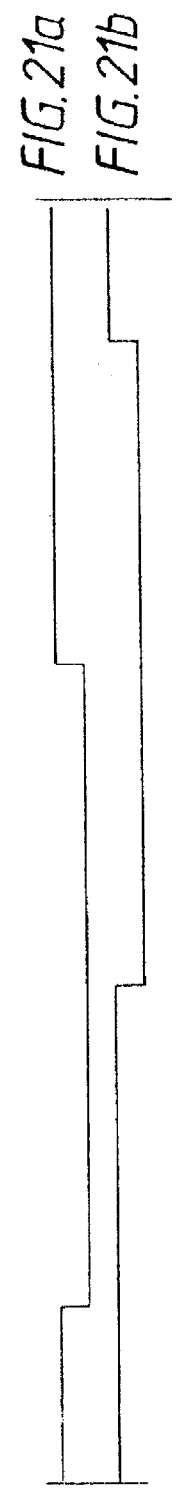
FIG.21a
FIG.21b
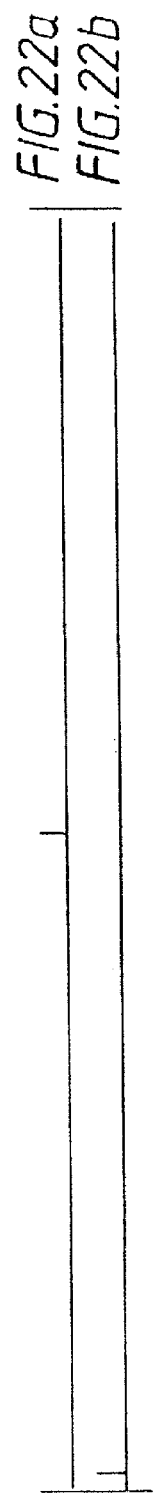
FIG.22a
FIG.22b
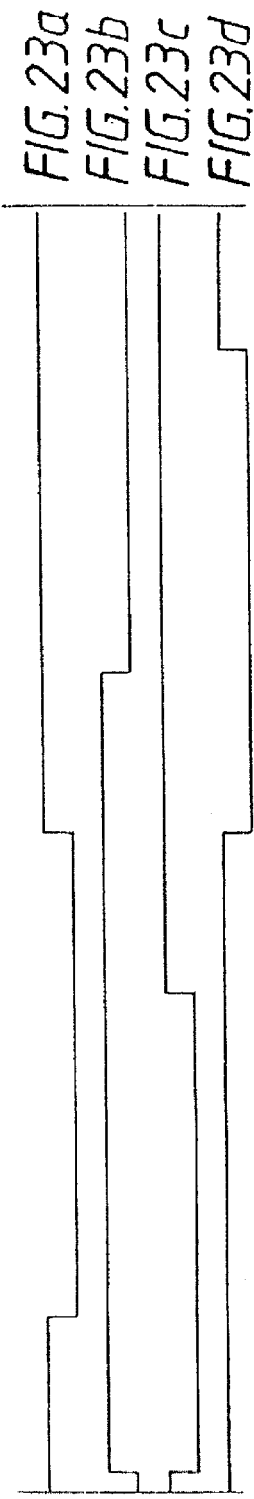
FIG.23a
FIG.23b
FIG.23c
FIG.23d

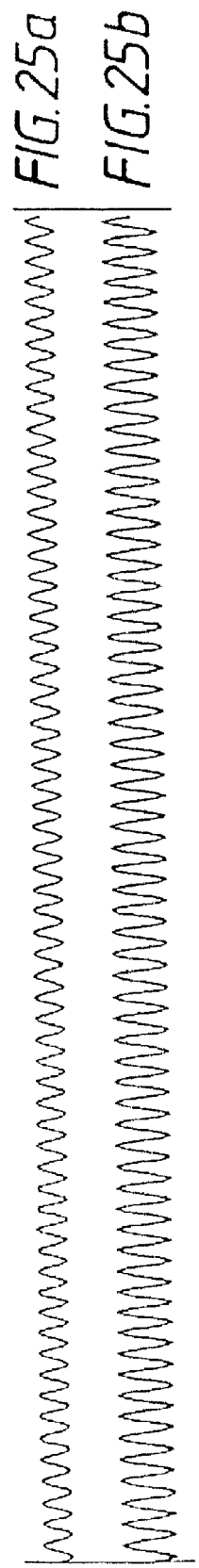
FIG. 25a
FIG. 25b
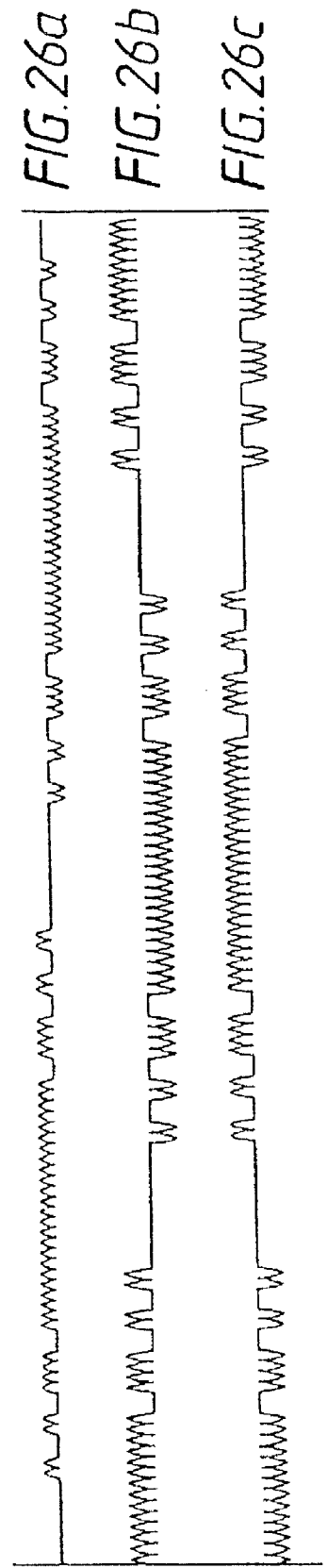
FIG. 26a
FIG. 26b
FIG. 26c

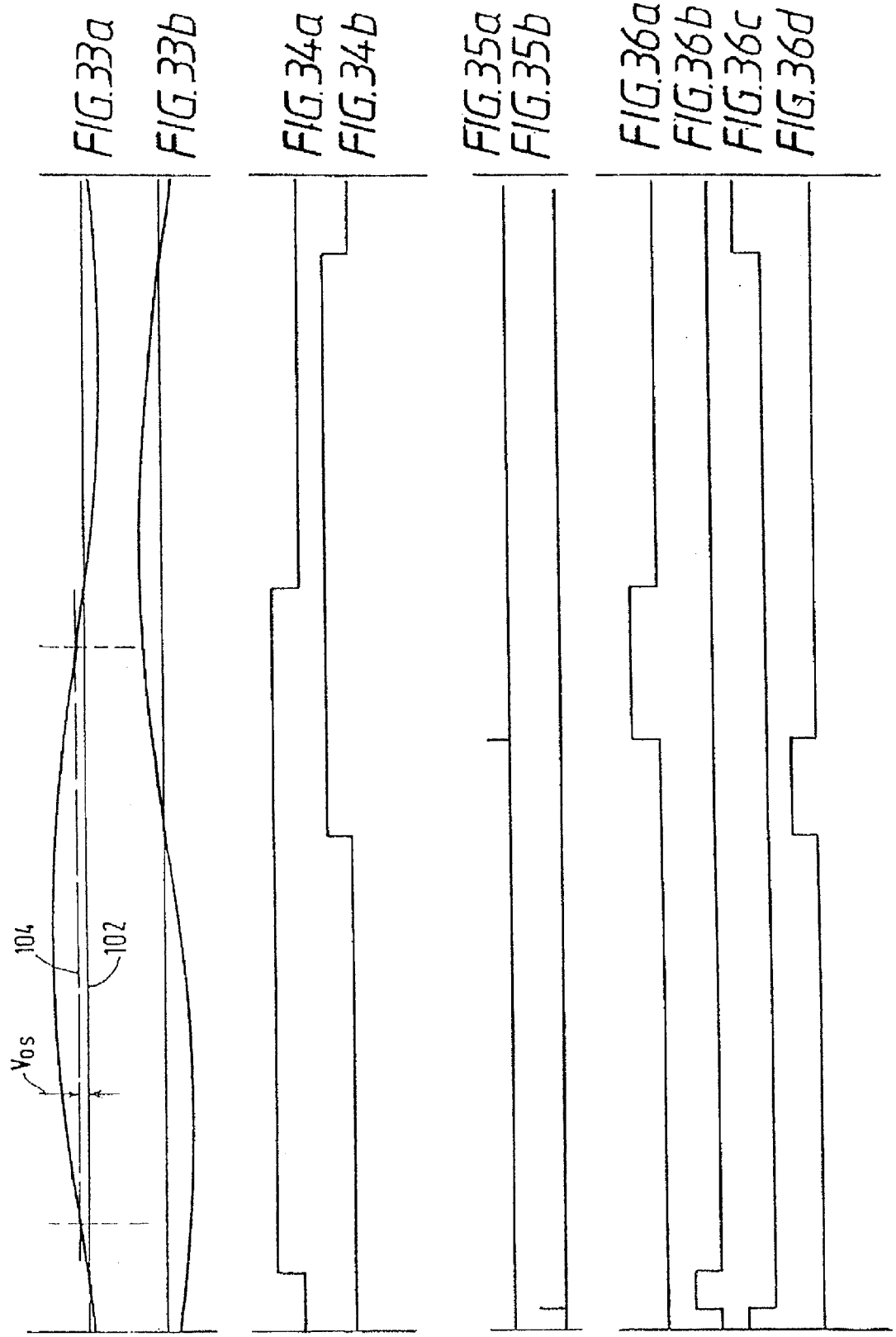

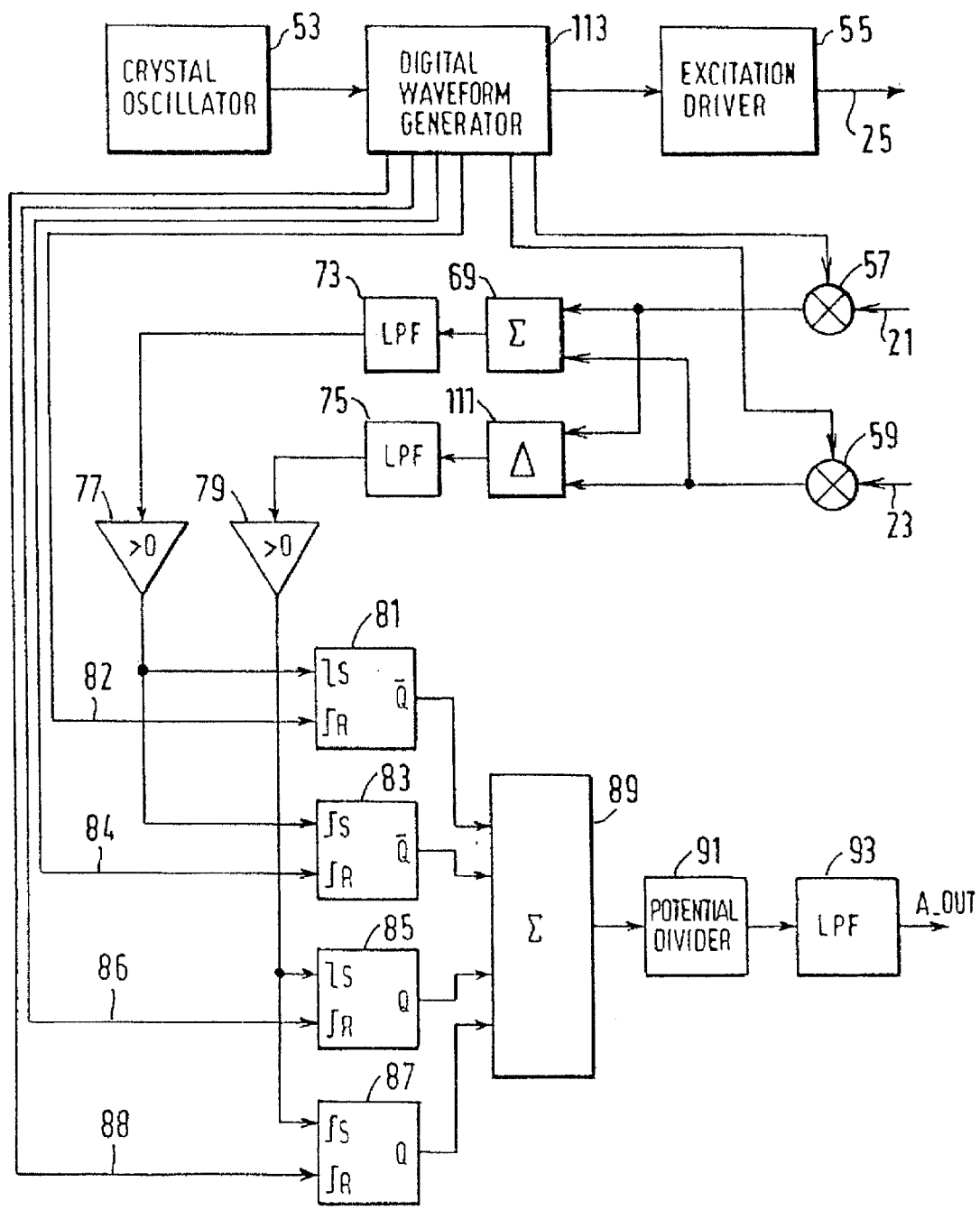

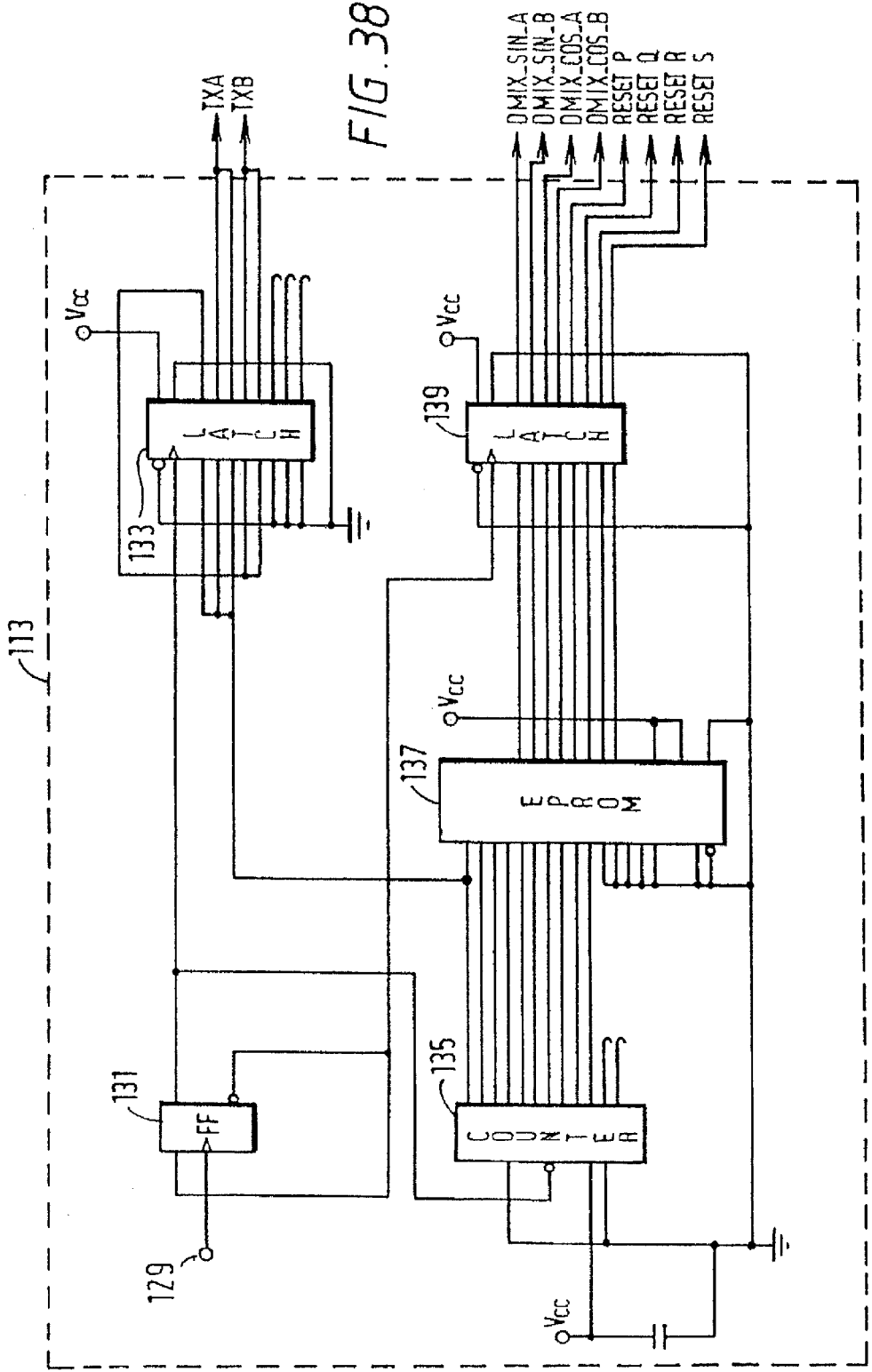

SIGNAL PROCESSING APPARATUS AND METHOD

This application is a continuation to PCT/GB97/01762 filed Jun. 30, 1997.

The present invention relates to an apparatus and method for processing signals. The present invention may be used, for example, to determine the position of two relatively movable members from signals received from a position encoder used to determine their relative positions, wherein the positional information is encoded within the amplitude of a number of carrier signals output from the position encoder.

Many types of non-contact linear and rotary position encoders have been proposed for generating signals indicative of the position of two relatively movable members. Typically, one of the members carried one or more sense coils and the other carries one or more magnetic field generators. The magnetic field generators and the sense coils are arranged such that the amount of magnetic coupling between the magnetic field generators and the sense coils varies as a function of the relative position of the two members.

In some of these non-contact position encoders, the sense windings and the magnetic field generators are designed to try and make the output signal vary linearly with the relative position between the two members, since this reduces complexity of the signal processing required to determine the positional information. However, it is difficult to design a system which is exactly linear and they are usually relatively sensitive to variations in the gap between the sense coils and the magnetic field generators. The applicant's earlier International Patent Application WO95/31696 discloses several examples of similar non-contact position encoders in which the output signal from each sense coil varies sinusoidally as a function of the relative position of the two movable members. However, in order to derive the positional information, complex processing of the received signals is required. In particular, where two phase-quadrature sense coils are used, the signal from each is demodulated and a ratiometric arc-tangent calculated in order to obtain the positional information. Although the ratiometric arc-tangent calculation reduces the system's sensitivity to variation in the gap between the two relatively movable members, it requires complex processing calculations which are usually performed by a microprocessor under software control. Further, the above-mentioned arc-tangent calculation has to be performed each time a position measurement is required in order to generate an output signal. This prevents instant and continuous monitoring of position.

An aim of the present invention is to provide an alternative method and apparatus for processing signals which vary sinusoidally with the relative position between the two relatively movable members.

According to one aspect the present invention provides processing circuitry for processing signals received from a position encoder used to determine the relative position between two relatively movable members in which the received signals are combined with an intermediate frequency signal having a phase which depends upon the phase of the received signal.

According to another aspect, the present invention provides a processing apparatus for processing a number of signals received from a position encoder used to encode the relative positions of a number of relatively movable members, wherein each of the received signals varies in a similar manner with said relative position but having differing phases, the apparatus comprising: means for combining each of the received signals with a respective one of a corresponding number of the periodically varying signals, each varying in a similar manner but with a different predetermined phase; and means for adding the combined signals to provide an output signal, and wherein the predetermined phases of said periodically varying signals are determined so that said output signal from said adding means contains a single periodically varying component whose phase varies with said relative position.

According to another aspect, the present invention provides a method of processing a number of signals received from a position encoder used to encode the relative positions of a number of relatively movable members, wherein each of the received signals varies in a similar manner with said relative position, but out of phase with respect to each other, the method comprising the steps of: combining each of the received signals with a respective one of a corresponding number of periodically varying signals, each varying in a similar manner but with a different predetermined phase; and adding the combined signals to provide an output signal, and wherein the predetermined phases of the periodically varying signals are determined so that the output signal contains a single periodically varying component whose phase varies with said relative position.

The present invention also provides a position detector comprising a number of sensing circuits, each extending over a measurement path and being offset from each other; generator means, being mounted for relative movement over the measurement path, for generating a signal in each of the sensing circuits which varies as a function of the relative position between said generating means and the sensing circuit, whereby, the phase of each of said generated signals is different due to the offset between each of said sensor circuits over said measurement path; means for combining each of the received signals with a respective one of a corresponding number of periodically varying signals, each varying in a similar manner but with a different predetermined phase; and means for adding the signals from the combining means to provide an output signal; wherein said predetermined phases of said periodically varying signals are determined so that said output signal from said adding means contains a single periodic component whose phase varies with the relative position between said generator means and said sensing circuit.

According to another aspect, the present invention provides an apparatus and method for processing a plurality of signals which vary sinusoidally with the value of a variable and out of phase with respect to each other, the apparatus comprising: means for multiplying each of the signals with a respective one of a corresponding plurality of periodic time varying signals, each having the same period and a different phase and combining the signals from the multiplying means to provide an output signal; wherein (1) the phases of said periodic time varying signals are determined so that the output signal from the combining means comprises a single periodic component having said predetermined period whose phase varies with the value of said variable; and (2) each of the periodic time varying signals comprises a signal having a discrete number of levels and a number of transitions between the levels within each period which are arranged within the period so as to reduce the energy content in at least the third harmonic component of the digital signal. By multiplying the input signals in this way, the requirement imposed on the remaining components of the processing circuitry can be relaxed. In particular, low pass filters to remove the higher order harmonics do not have to have a sharp cut off response and hence can be made using simpler filter technology.

According to another aspect, the present invention provides an apparatus and method for processing a plurality of input signals which vary sinusoidally with the value of a variable and out of phase with respect to each other, the apparatus comprising means for multiplying each of the input signals with a respective one of a corresponding plurality of periodic time varying signals each having the same period and different phase; means for combining the signals from the multiplying means to provide an output signal; wherein the predetermined phase of the periodic signals are determined so that the output signal from the combining means contains a single periodic component having the predetermined period whose phase varies with the value of said variable; a comparator for comparing said output signal with a reference voltage to generate a square wave signal which varies with the value of said variable; a first circuit responsive to the leading edge of the square wave signal output by the comparator to generate a first signal having a value which varies with the phase of the output signal from the combining means and hence with the value of the variable; a second circuit responsive to the trailing edge of the square wave signal to generate a second signal which varies with the phase of the output signal from the first combining means and hence with the value of the variable over one period of the sinusoidal variation; and second means for combining the first and second output signal values from the first and second circuits to provide a combined output signal having a value which varies with the value of the variable. By providing different circuits which are responsive to the different edges of the square wave signal output by the comparator and by combining the signals from these circuits, errors caused by an offset voltage in the comparator can be reduced.

According to a further aspect, the present invention provides an apparatus and method for processing a plurality of signals each of which vary sinusoidally with the value of a variable and out of phase with respect to each other, the apparatus comprising: means for multiplying each of the signals with a respective one of a corresponding plurality of periodic time varying signals, each having the same predetermined period and a different predetermined phase; first means for combining the signals from the multiplying means to provide an output signal; wherein said predetermined phases of said periodic time varying signals are determined so that the output signal from the first combining means contains a single periodic component having the predetermined period whose phase varies with the variable; first processing circuitry for processing the output signal from the first combining means to generate an output signal having a value which varies with the phase of the output signal from the combining means and hence with the value of the variable; second processing circuitry for processing a period time varying signal having said predetermined period to generate an output signal having a value which varies with the phase of the periodic time varying signal which is processed; and second combining means for combining the output signal from the first and second processing circuitry to provide a combined output signal having a value which varies with the value of the variable. By providing first and second processing circuitry and combining the output from the circuitry in this way, common phase errors in both processing circuitry can be removed.

The processing circuitry can be used to process the signals from a position encoder having a number of spaced sense coils. In this case, the sense coils are preferably evenly spaced over the measurement path and the predetermined phases of the periodically varying signals are made equal in magnitude to the phase of the signals from the corresponding sensing circuit, since these can be easily calculated in advance.

Exemplary embodiments of the invention will now be described with reference to the accompanying drawings, in which:

FIG. 1 schematically illustrates a rotating shaft having a position encoder mounted relative thereto, for encoding the position of the rotatable shaft;

FIG. 5a is a schematic representation of excitation and processing circuitry for determining the angular position of the rotatable shaft;

FIG. 5b is a plot illustrating the way in which an output from the processing circuitry shown in FIG. 5a varies with the angular position of the rotatable shaft shown in FIG. 1;

FIG. 6a is a circuit diagram illustrating in more detail the form of an excitation driver which forms part of the excitation and processing circuitry shown in FIG. 5a;

FIG. 6b is a timing diagram illustrating the form of a first drive signal applied to the excitation drive circuit shown in FIG. 6a;

FIG. 6c is a timing diagram illustrating the form of a second drive signal applied to the excitation drive circuit shown at FIG. 6a;

FIG. 7 is a timing diagram illustrating the form of a first component of three mixing signals which are applied to a respective one of three separate mixing circuits forming part of the processing circuitry shown in FIG. 5a;

FIG. 8a is a timing diagram illustrating the form of a second component of the mixing signal applied to a first one of the three mixing circuits shown in FIG. 5a;

FIG. 8b is a timing diagram illustrating the form of a second component of the mixing signal applied to a second one of the three mixer circuits shown in FIG. 5a;

FIG. 8c is a timing diagram illustrating the form of a second component of the mixing signal applied to the third mixing circuit shown in FIG. 5a;

FIG. 9a is a timing diagram illustrating the form of a signal induced in one of the sense coils shown in FIG. 2, for a first angular position of the rotatable shaft;

FIG. 9b is a timing diagram illustrating the form of a signal induced in the other sense coil sown in FIG. 2, for the first angular position of the rotatable shaft;

FIG. 10a is a timing diagram illustrating the form of the output signal from a first one of the mixing circuits shown in FIG. 5a, when the signal shown in FIG. 9a is multiplied with the signals shown in FIGS. 7 and 8a;

FIG. 10b is a timing diagram illustrating the form of the output signal from a second one of the mixing circuits shown in FIG. 5, when the signal shown in FIG. 9b is multiplied with the signals shown in FIGS. 7 and 8b;

FIG. 10c is a timing diagram illustrating the form of the output signal from the third mixing circuit shown in FIG. 5a, when the signal shown in FIG. 9b is multiplied with the signals shown in FIGS. 7 and 8c;

FIG. 11a is a timing diagram illustrating the form of the signal output by a first adder forming part of the processing circuitry shown in FIG. 5a, when the signals shown in FIGS. 10a and 10b are input to the adder;

FIG. 11b is a timing diagram illustrating the form of the signal output from a second adder forming part of the processing circuitry shown in FIG. 5a, when the signals shown in FIGS. 10a and 10c are input to the adder;

FIG. 12a is a timing diagram illustrating the form of a filtered signal obtained by low pass filtering the signal shown in FIG. 11a;

FIG. 12b is a timing diagram illustrating the form of a filtered signal obtained by low pass filtering the signal shown in FIG. 11b;

FIG. 13a is a timing diagram illustrating the form of an output signal from a first comparator forming part of the processing circuitry shown in FIG. 5 a obtained by comparing the signal shown in FIG. 12a with ground;

FIG. 13b is a timing diagram illustrating the form of an output signal from a second comparator forming part of the processing circuitry shown in FIG. 5 obtained by comparing the signal shown in FIG. 12b with ground;

FIG. 14a is a timing diagram illustrating the form of a first reference signal generated by a digital waveform generator forming part of the processing circuitry shown in FIG. 5a;

FIG. 14b is a timing diagram illustrating the form of a second reference signal generated by the digital waveform generator shown in FIG. 5a;

FIG. 15a is a timing diagram illustrating the form of an output signal from a first latch forming part of the processing circuitry shown in FIG. 5a, when the signal shown in FIG. 13a is applied to a set input of the latch and the reference signal shown in FIG. 14a is applied to the reset input of the latch;

FIG. 15b is a timing diagram illustrating the form of an output signal from a second latch forming part of the processing circuitry shown in FIG. 5a, when the signal shown in FIG. 13a is applied to a set input of the latch and the reference signal shown in FIG. 14b is applied to the reset input of the latch;

FIG. 15c is a timing diagram illustrating the form of an output signal from a third latch forming part of the processing circuitry shown in FIG. 5a, when the signal shown in FIG. 13b is applied to a set input of the latch and the reference signal shown in FIG. 14b is applied to the reset input of the latch;

FIG. 15d is a timing diagram illustrating the form of an output signal from a fourth latch forming part of the processing circuitry shown in FIG. 5, when the signal shown in FIG. 13b is applied to a set input of the latch and the reference signal shown in FIG. 14a is applied to the reset input of the latch;

FIG. 17a is a timing diagram illustrating the form of a signal induced in one of the sense coils shown in FIG. 2, for a second angular position of the rotatable shaft;

FIG. 17b is a timing diagram illustrating the form of a signal induced in the other sense coil shown in FIG. 2, for the second angular position of the rotatable shaft;

FIG. 18a is a timing diagram illustrating the form of the output signal from a first one of the mixing circuits shown in FIG. 5a, when the signal shown in FIG. 17a is multiplied with the signals shown in FIGS. 7 and 8a;

FIG. 18b is a timing diagram illustrating the form of the output signal from a second one of the mixing circuits shown in FIG. 5a, when the signal shown in FIG. 17b is multiplied with the signals shown in FIGS. 7 and 8b;

FIG. 18c is a timing diagram illustrating the form of the output signal from the third mixing circuit shown in FIG. 5a, when the signal shown in FIG. 17b is multiplied with the signals shown in FIGS. 7 and 8c;

FIG. 19a is a timing diagram illustrating the form of the signal output by the first adder shown in FIG. 5a, when the signals shown in FIGS. 18a and 18b are input to the adder;

FIG. 19b is a timing diagram illustrating the form of the signal output from the second adder shown in FIG. 5a, when the signals shown in FIGS. 18a and 18c are input to the adder;

FIG. 20a is a timing diagram illustrating the form of a filtered signal obtained by low pass filtering the signal shown in FIG. 19a;

FIG. 20b is a timing diagram illustrating the form of a filtered signal obtained by low pass filtering the signal shown in FIG. 19b;

FIG. 21a is a timing diagram illustrating the form of the output signal from the first comparator shown in FIG. 5a obtained by comparing the signal shown in FIG. 20a with ground;

FIG. 21b is a timing diagram illustrating the form of the output signal from the second comparator shown in FIG. 5a obtained by comparing the signal shown in FIG. 20b with ground;

FIG. 22a is a timing diagram illustrating the form of the reference signal shown in FIG. 14a;

FIG. 22b is a timing diagram illustrating the form of the second reference signal shown in FIG. 14b;

FIG. 23a is a timing diagram illustrating the form of an output signal from the first latch shown in FIG. 5a, when the signal shown in FIG. 21a is applied to a set input of the latch and the reference signal shown in FIG. 22a is applied to the reset input of the latch;

FIG. 23b is a timing diagram illustrating the form of an output signal from the second latch shown in FIG. 5a, when the signal shown in FIG. 21a is applied to a set input of the latch and the reference signal shown in FIG. 22b is applied to the reset input of the latch;

FIG. 23c is a timing diagram illustrating the form of an output signal from the third latch shown in FIG. 5a, when the signal shown in FIG. 21b is applied to a set input of the latch and the reference signal shown in FIG. 22b is applied to the reset input of the latch;

FIG. 23d is a timing diagram illustrating the form of an output signal from the fourth latch shown in FIG. 5a, when the signal shown in FIG. 21b is applied to a set input of the latch and the reference signal shown in FIG. 22a is applied to the reset input of the latch;

FIG. 25a is a timing diagram illustrating the form of a signal induced in one of the sense coils shown in FIG. 2, for a third angular position of the rotatable shaft;

FIG. 25b is a timing diagram illustrating the form of a signal induced in the other sense coil shown in FIG. 2, for the third angular position of the rotatable shaft;

FIG. 26a is a timing diagram illustrating the form of the output signal from the first mixing circuit shown in FIG. 5a, when the signal shown in FIG. 25a is multiplied with the signals shown in FIGS. 7 and 8a;

FIG. 26b is a timing diagram illustrating the form of the output signal from the second mixing circuit shown in FIG. 5a, when the signal shown in FIG. 25b is multiplied with the signals shown in FIGS. 7 and 8b;

FIG. 26c is a timing diagram illustrating the form of the output signal from the third mixing circuit shown in FIG. 5a, when the signal shown in FIG. 25b is multiplied with the signals shown in FIGS. 7 and 8c;

FIG. 28a is a timing diagram illustrating the form of a filtered signal obtained by low pass filtering the signal shown in FIG. 27a;

FIG. 28b is a timing diagram illustrating the form of a filtered signal obtained by low pass filtering the signal shown in FIG. 27b;

FIG. 30a is a timing diagram illustrating the form of the first reference signal shown in FIG. 14a;

FIG. 30b is a timing diagram illustrating the form of the second reference signal shown in FIG. 14b;

FIG. 33a is a timing diagram illustrating the effect of an offset voltage in the comparator used to convert the signal shown in FIG. 28a into a corresponding square wave signal;

FIG. 33b is a timing diagram illustrating the form of the filtered signal obtained by low pass filtering the signal shown in FIG. 27b;

FIGS. 34a and 34b are timing diagrams illustrating the form of an output signal from the first comparator having an offset voltage, obtained by comparing the signals shown in FIGS. 33a and 33b respectively with the offset voltage;

FIG. 35a is a timing diagram illustrating the form of the first reference signal shown in FIG. 14a;

FIG. 35b is a timing diagram illustrating the second reference signal shown in FIG. 14b;

FIG. 36a is a timing diagram illustrating the form of an output signal from the first latch shown in FIG. 5a, when the signal shown in FIG. 34a is applied to the set input of the latch and the reference signal shown in FIG. 35a is applied to the reset input of the latch;

FIG. 36b is a timing diagram illustrating the form of the output signal from the second latch shown in FIG. 5a, when the signal shown in FIG. 34a is input to the set input of the latch and the reference signal shown in FIG. 35b is applied to the reset input of the latch;

FIG. 36c is a timing diagram illustrating the form of the output signal from the third latch shown in FIG. 5, when the signal shown in FIG. 34b is applied to the set input of the latch and the reference signal shown in FIG. 35b is applied to the reset input of the latch;

FIG. 36d is a timing diagram illustrating the form of the output signal from the fourth latch shown in FIG. 5a, when the signal shown in FIG. 34b is applied to the set input of the latch and the reference signal shown in FIG. 35a is applied to the reset input of the latch;

FIG. 37 is a schematic representation of an alternative form of excitation and processing circuitry which can be used for determining the angular position of the rotatable shaft shown in FIG. 1;

FIG. 38 is a schematic block diagram showing the form of a digital wave form generator forming part of the excitation and processing circuitry shown in FIG. 37;

FIG. 50b is a schematic diagram of a fault detection circuit which can detect a fault in the position encoder from the output signals generated by the processing circuitry shown in FIG. 50a;

Figure 1:
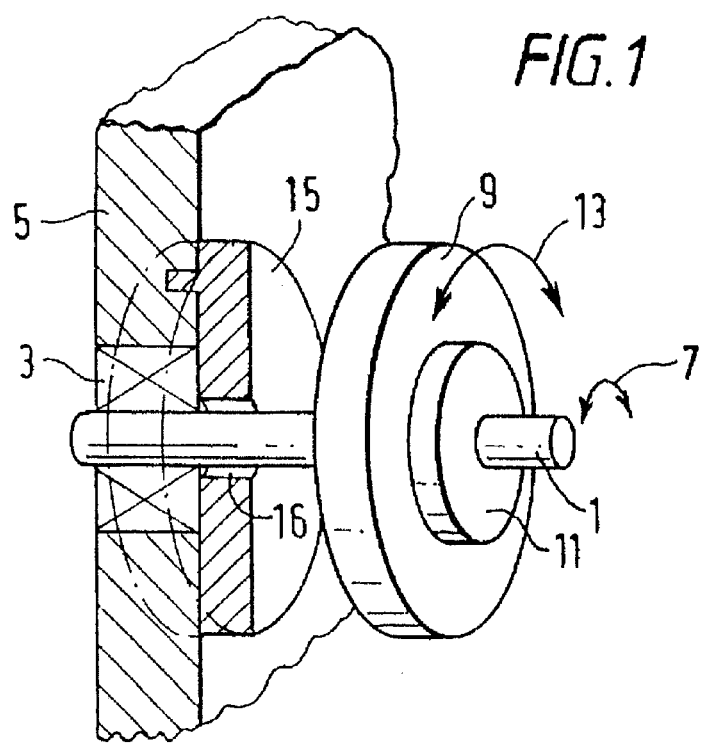
Figure 53A:
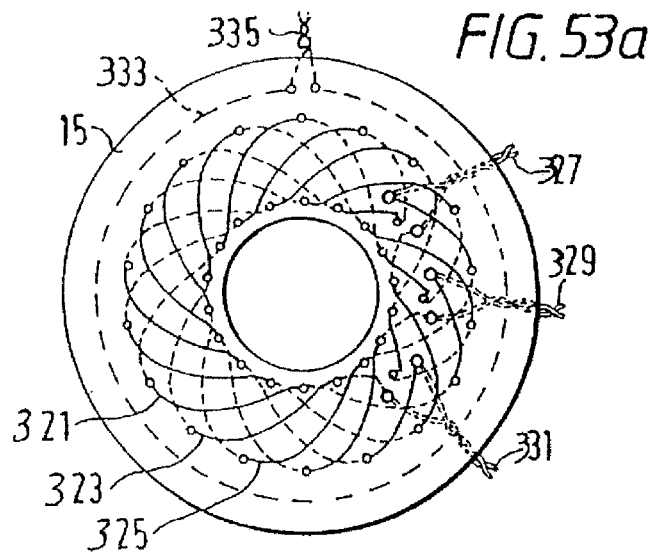
Figure 53B:
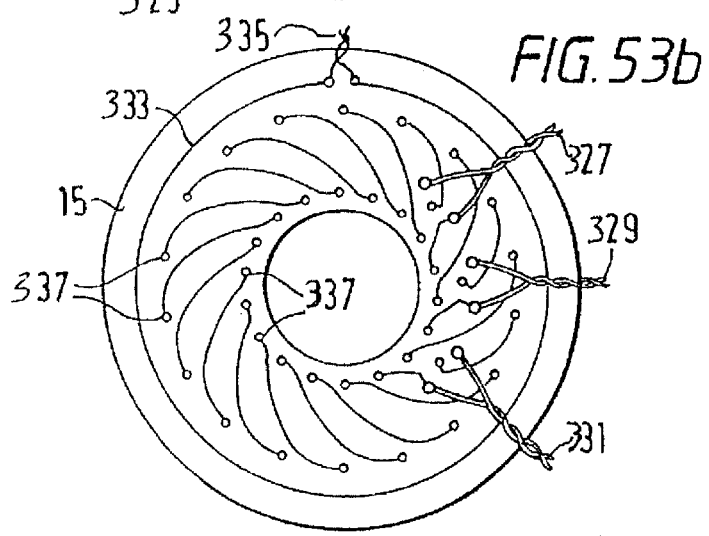
Figure 53C:
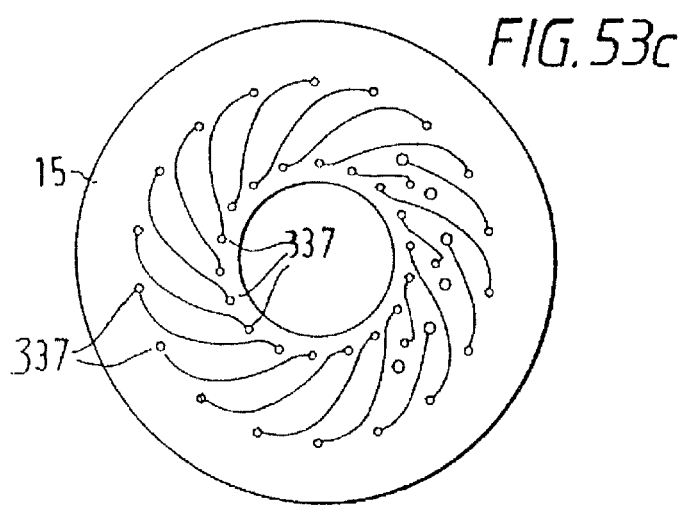
Figure 54:
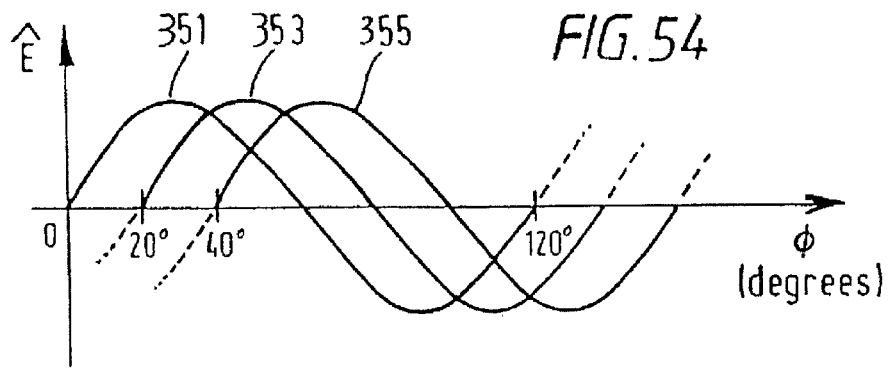
Figure 55:
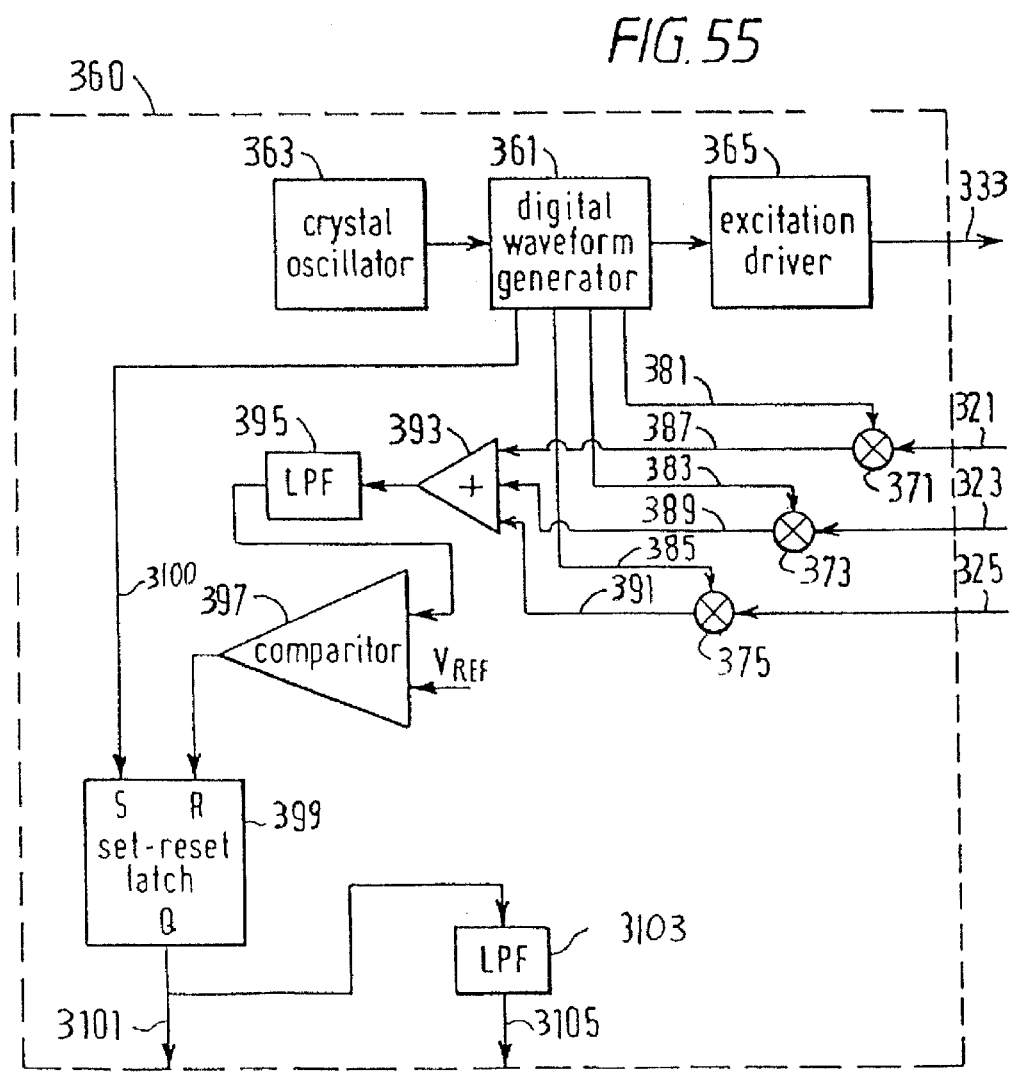
Figure 56A:
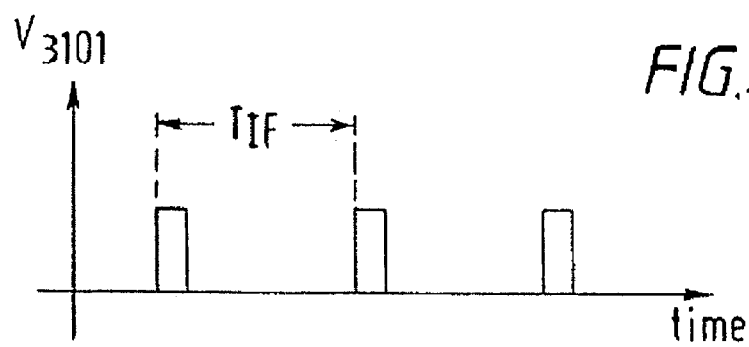
Figure 56B:
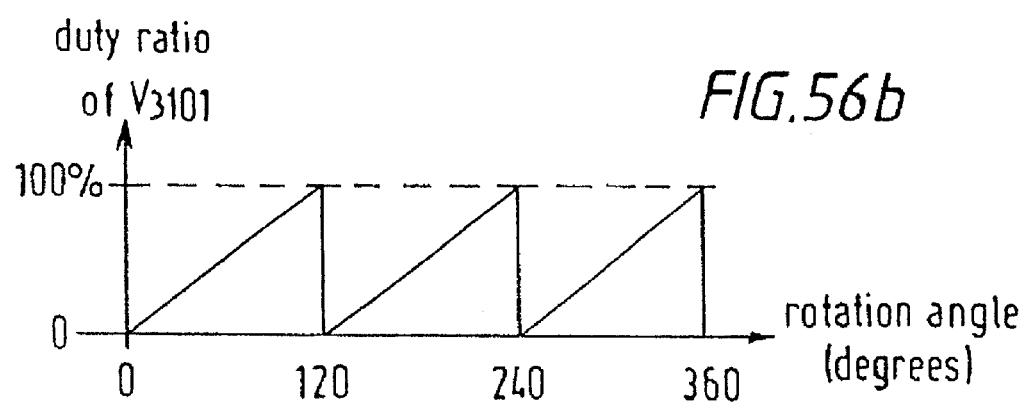
Figure 56C:
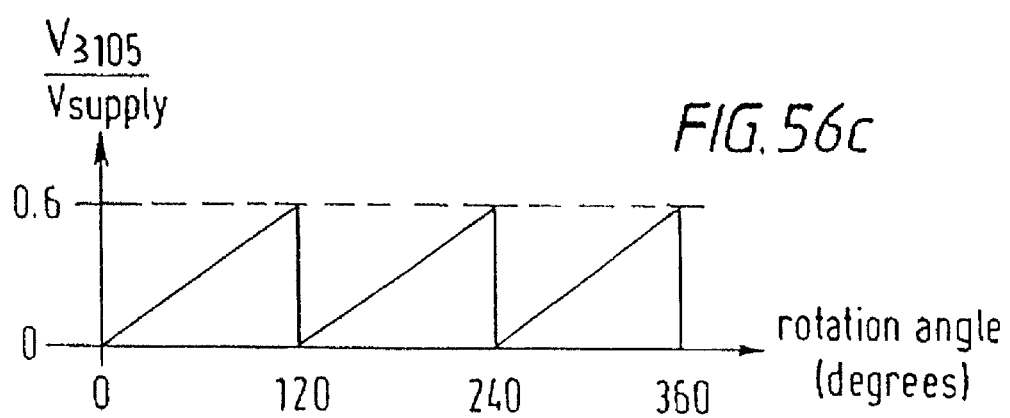
Figure 57A:
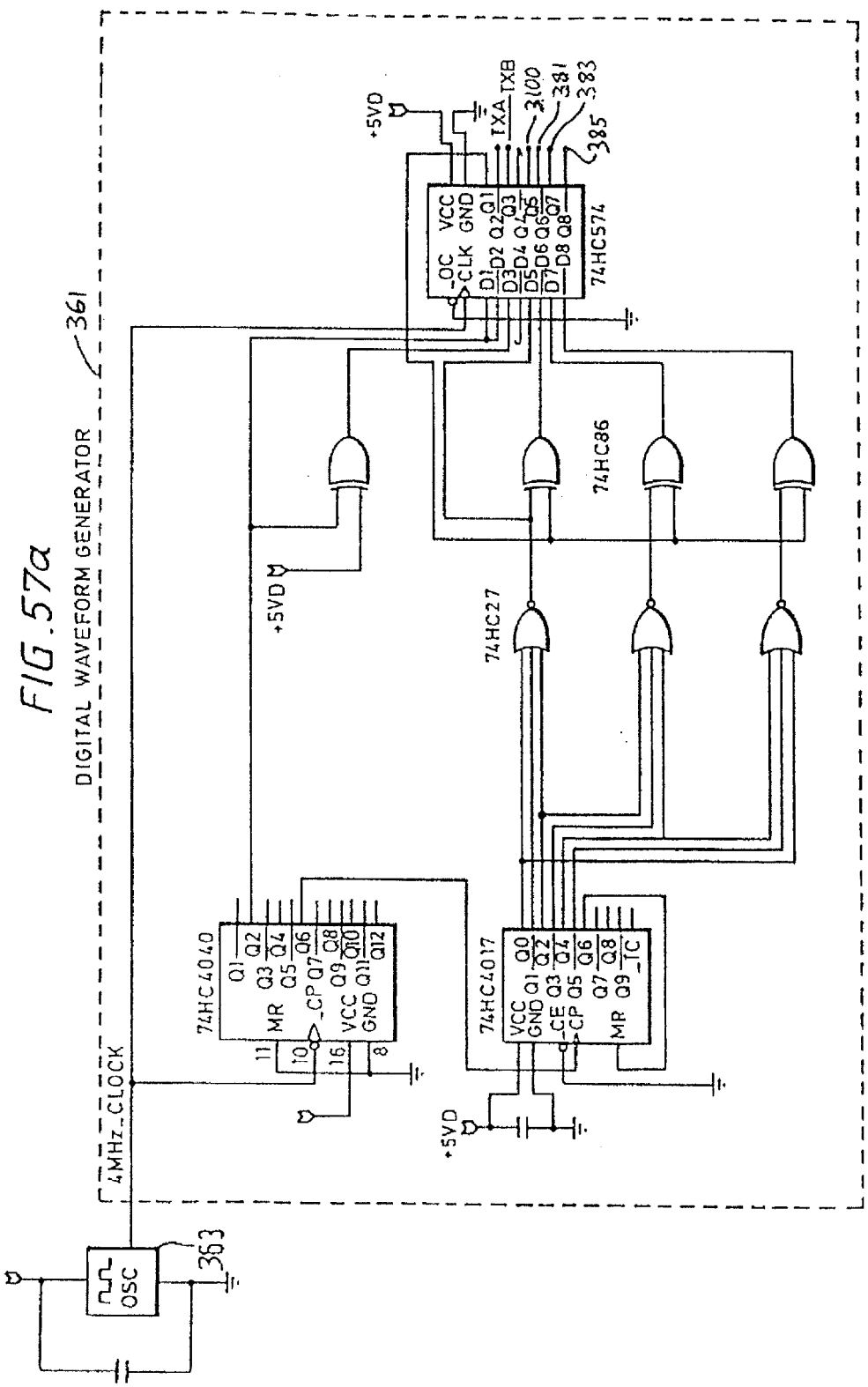
Figure 57B:
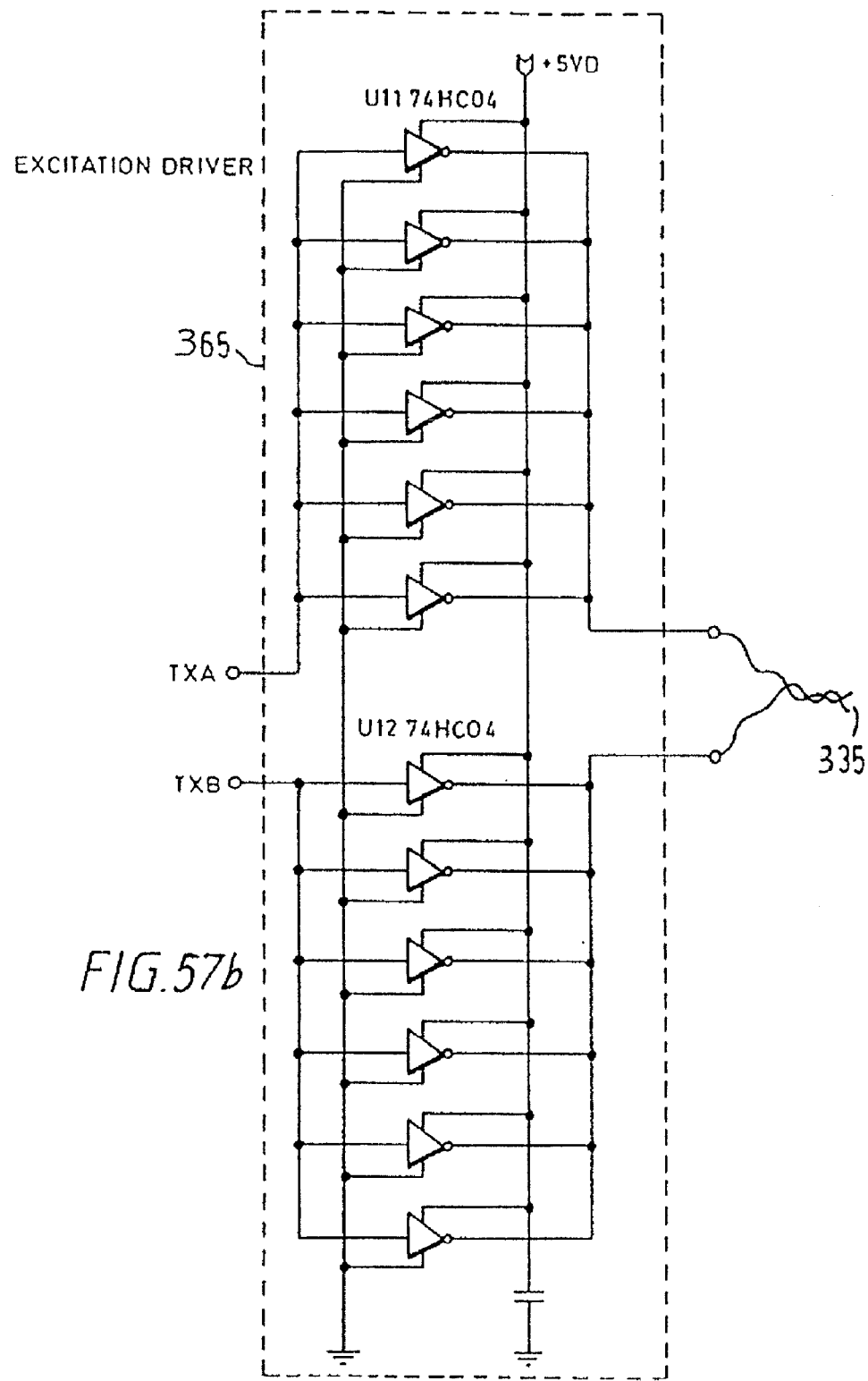
Figure 57C:
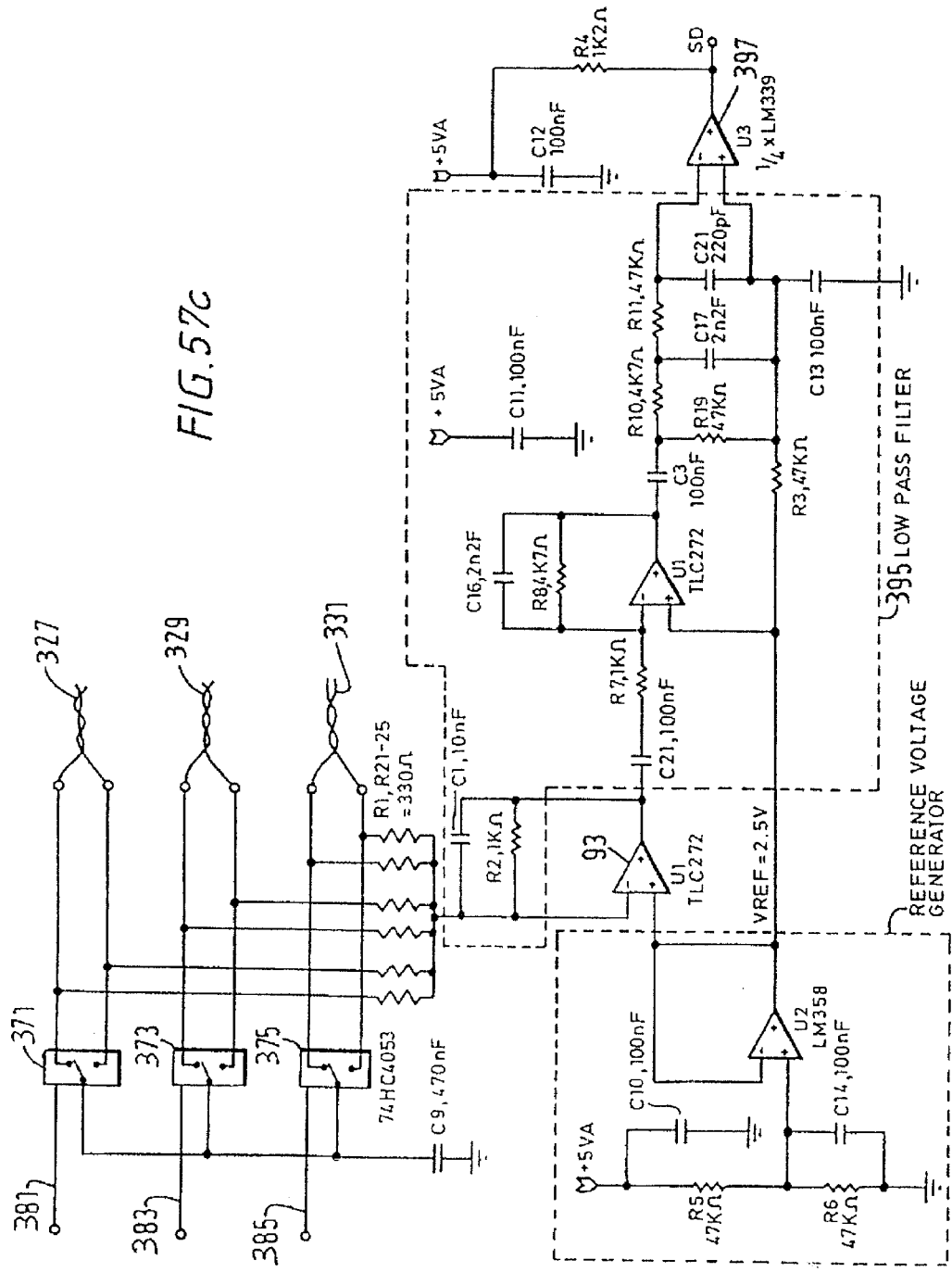
Figure 57D:
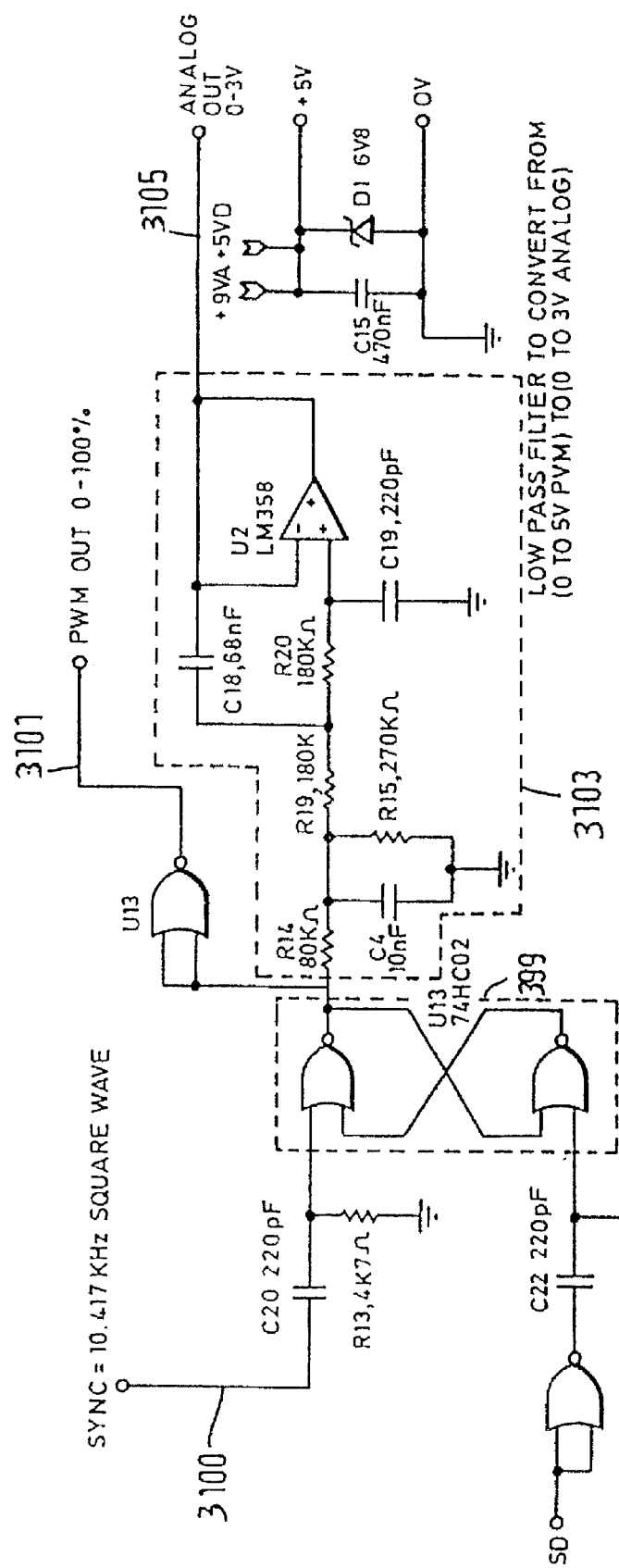

FIG. 53*a* is a schematic view of three sense coils formed on a printed circuit board which forms part of the position encoder shown in FIG. 1 according to another embodiment of the invention;

FIG. 53*b* shows a top layer of printed conductors forming part of the printed circuit board shown in FIG. 53*a*;

FIG. 53*c* shows the bottom layer of printed conductors forming part of the printed circuit board shown in FIG. 53*a*;

FIG. 54 illustrates the way in which the peak amplitude of the signal induced in each sense coil varies with the angular position of the rotatable shaft;

FIG. 55 is a schematic representation of excitation and processing circuitry embodying one aspect of the present invention for determining the angular position of the rotatable shaft;

FIG. 56*a* illustrates the way in which one of the output signals from the processing circuitry shown in FIG. 55 varies with time;

FIG. 56*b* illustrates the way in which the duty ratio of the output signal shown in FIG. 56*a* varies with the angular position of the rotatable shaft;

FIG. 56*c* illustrates the way in which the ratio of an output voltage from the processing circuitry shown in FIG. 55 to the supply voltage varies with the angular position of the rotatable shaft;

FIG. 57*a* shows a circuit diagram of a part of the excitation circuitry schematically shown in FIG. 55;

FIG. 57*b* shows a circuit diagram of the rest of the excitation circuitry schematically shown in FIG. 55;

FIG. 57*c* shows a circuit diagram of part of the processing circuitry schematically shown in FIG. 55; and FIG. 57*d* shows a circuit diagram of the rest of the processing circuitry schematically shown in FIG. 55.

FIG. 1 schematically shows a shaft 1 which is rotatable about its axis as represented by the arrow 7 and which passes through a bearing 3 provided in a support wall 5. A first printed circuit board 9 carrying a magnetic field generator (not shown) is mounted for rotation (as represented by arrow 13) with the shaft 1 via a bushing 11. A second printed circuit board 15 is fixed to the support wall 5 and has a central hole 16 through which the rotatable shaft 1 passes. The second printed circuit board 15 carries a number of sense coils (not shown) and an excitation coil (not shown). Preferably, the separation between the circuit board 9 and the circuit board 15 is between 0.1 and 4 mm in order to obtain reasonably large signals from the sense coils (not shown).

Figure 2:
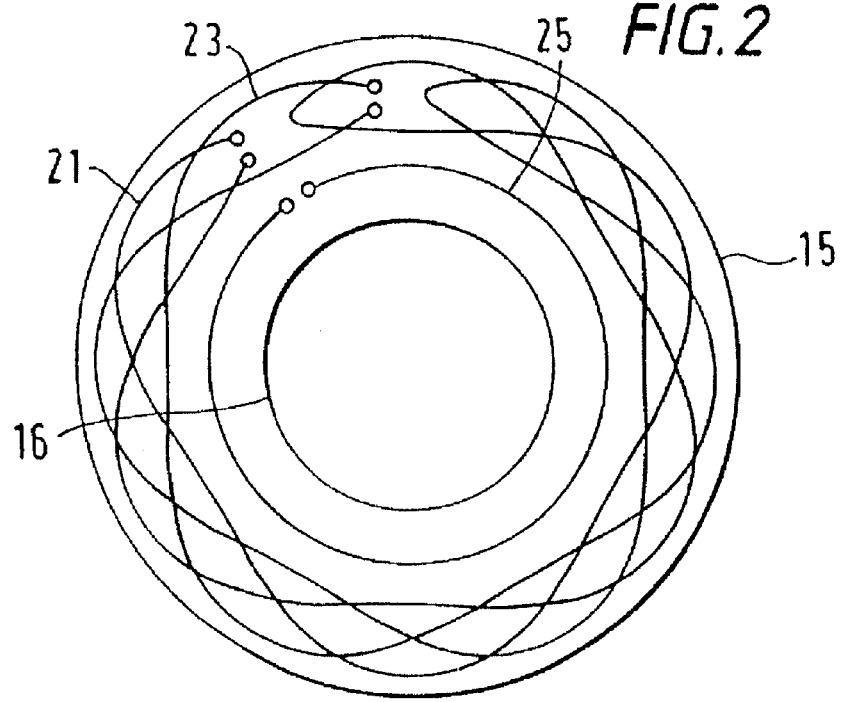
FIG. 2 is a schematic view of two sense coils formed on a printed circuit board which forms part of the position encoder shown in FIG. 1.

In this embodiment, two periodic sense coils are used which extend circumferentially around the circuit board 15. Each sense coil comprises three periods of windings and the sense coils are circumferentially staggered by 30° in the direction of rotation of the rotatable shaft 1. FIG. 2 shows the conductors on the printed circuit board 15 which form these two sense coils 21 and 23. Each sense coil 21, 23 comprises six loops of series connected conductors, connected such that adjacent loops are wound in the opposite sense. This makes the sense coils 21 and 23 relatively immune to background electromagnetic interference. The angle over which one period of each sense coil extends is 120°. The ends of the sense coils 21 and 23 are connected to processing circuitry (not shown) by respective twisted wire pairs (not shown). FIG. 2 also shows the conductor which forms the excitation coil 25 and which is connected to excitation circuitry (not shown) by a further twisted wire pair (not shown).

Figure 3:
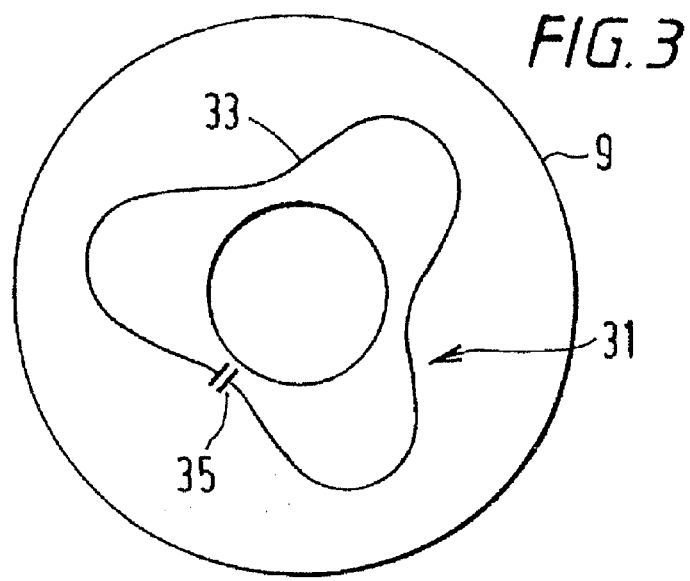
FIG. 3 illustrates the form of an electrically resonant circuit forming part of the position encoder shown in FIG. 1.

FIG. 3 shows the conductor on the printed circuit board 9 which forms the magnetic field generator. In this embodiment, the magnetic field generator comprises an electrically resonant circuit 31 having an inductor coil 33 and a capacitor 35. Other types of magnetic field generator could be used, such as a short circuit coil or a conductive plate.

The principle of operation of the position encoder formed by the sense coils 21 and 23, the excitation coil 25 and the resonant circuit 31 will now be briefly described. A more detailed explanation of the manufacture of and the principle of operation for this position encoder and similar position encoders can be found in the applicant's earlier International Patent Application WO95/31696, the content of which is hereby incorporated by reference.

In operation, an oscillating excitation current is applied to the excitation coil 25 for energising the resonant circuit 31. In response, the resonant circuit 31 generates a magnetic field which induces a respective Electro-Motive Force (EMF) in each of the sense coils 21 and 23, the amplitude of which varies sinusoidally with the relative position between the resonant circuit 31 and the respective sense coil. Preferably, the fundamental frequency of the excitation current applied to the excitation coil 25 corresponds with the resonant frequency of the resonant circuit 31, since this provides the maximum signal output.

Figure 4:
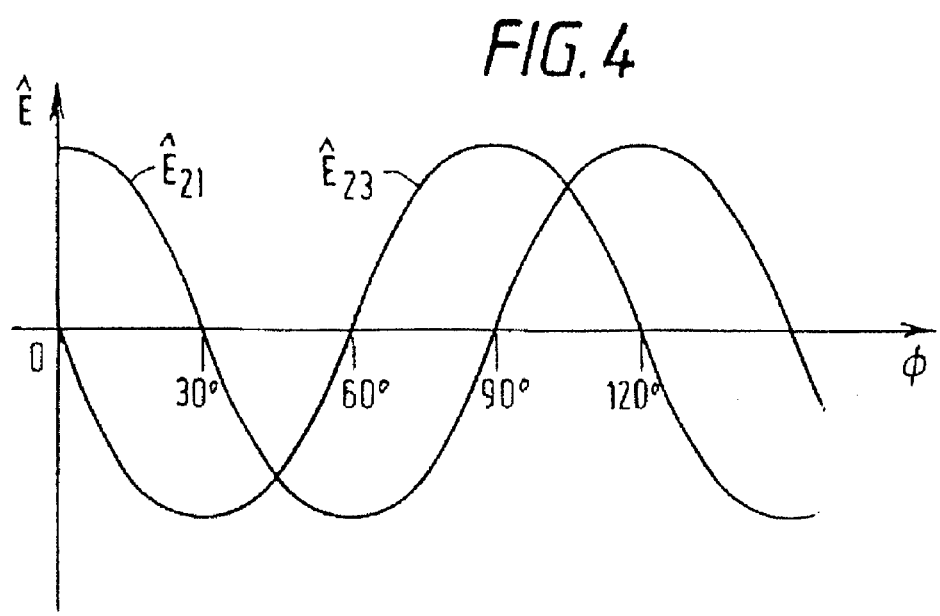
FIG. 4 illustrates the way in which the peak amplitude of the signal induced in each sense coil varies with the angular position of the rotatable shaft.

FIG. 4 illustrates the way in which the peak amplitude ($\hat{E}$) of the EMFs generated in the sense coils 21 and 23 vary with the rotation angle ($\phi$) of the resonant circuit 31. As shown, the respective peak amplitudes $\hat{E}_{21}$ and $\hat{E}_{23}$ vary sinusoidally and repeat every third of a revolution of the resonant circuit 31 (and hence of the rotatable shaft 1) and are separated by one quarter of a period from each other. Therefore, the angular position of the rotatable shaft 1 can be determined unambiguously through 120° by suitable processing of the induced signals. This position encoder would, therefore, be suitable for determining the angular position of a throttle valve in an engine, which only rotates through 90 degrees.

FIG. 5*a* schematically illustrates excitation and processing circuitry embodying one aspect of the present invention, which is used to excite the excitation coil 25 and to process the signals induced in the sense coils 21 and 23. The excitation circuitry comprises the crystal oscillator 53, the digital waveform generator 51 and the excitation driver 55. In operation, the crystal oscillator generates a clock signal which is applied to the digital waveform generator 51 which uses this clock signal to generate drive signals which are amplified and applied to the excitation winding 25 by the excitation driver 55. As described above, applying an excitation signal to the excitation coil 25 causes the resonant circuit 31 to resonate which in turn induces signals in the sense coils 21 and 23, the peak amplitudes of which depend upon the position of the rotatable shaft 1.

In this embodiment, the signals induced in the sensor coils are combined in two different ways to generate two signals whose phases vary with the positional information. These two signals are then processed in different channels (formed by the low pass filters 73 and 75, the comparators 77 and 79 and the latch circuits 81, 83 and 85, 87) to generate four pulse width modulated signals whose duty ratios vary with the positional information. The pulse width modulated signals are then combined in the adder 89 in such a way as to remove common offsets caused by phase drifts in each of the channels and to remove errors caused by voltage offsets in the comparators. The output from the adder 89 is then passed through a potential divider 91, which allows for the dynamic range of the output signal level and any offset to be set for the particular application, and then a low pass filter 93 which averages the combined signal to generate a DC voltage whose value directly depends upon the angular position of the rotatable shaft 1. As those skilled in the art will appreciate, as the shaft 1 rotates, this output signal automatically increases or decreases, depending upon the direction of rotation, thereby allowing continuous monitoring of the shaft position.

The excitation and processing circuitry shown in FIG. 5a will now be described in more detail.

The digital waveform generator 51 receives an oscillating clock signal (having, in this embodiment, a frequency of 8 MHz) from the crystal oscillator 53 and uses this clock signal to generate two square wave drive signals TXA and TXB. These drive signals are input to the excitation driver 55 where they are amplified and applied differentially across the ends of the excitation coil 25 shown in FIG. 2. FIG. 6a shows in more detail, the excitation driver 55 employed in the present embodiment. As shown, the excitation driver 55 comprises two amplification circuits 101-1 and 101-2 which are connected in parallel between the $V_{CC}$ terminal and ground. Each amplification circuit 101 comprises two low resistance (typically less than 1 ohm) MOSFET switches which are controlled by a respective one of the drive signals TXA and TXB applied to their bases. In this embodiment, drive signal TXA is applied to the input terminal 103-1 of amplification circuit 101-1 and drive signal TXB is applied to the input terminal 103-2 of amplification circuit 101-2. The signals output by the respective amplification circuits 101, at the output terminals 105-1 and 105-2 respectively, are applied to the ends of the excitation coil 25. The drive signals TXA and TXB applied to the input terminals 103 of the amplification circuits 101 are shown schematically in FIGS. 6b and 6c. As shown, the drive signals are square wave signals which are 180° out of phase with each other. In this embodiment, the frequency of the drive signals is 2 MHz.

The voltage applied to the excitation coil 25 causes a current to flow therein which in-turn generates an excitation magnetic field in the vicinity of the resonant circuit 31. This excitation magnetic field causes the resonant circuit 31 to resonate and to generate its own magnetic field which induces an EMF in each of the sense coils 21 and 23. As a result of the spatial patterning of the sense coils 21 and 23 and the resonator coil 33 (as shown in FIGS. 2 and 3), the induced EMF's will vary as the rotatable shaft 1 rotates. In particular the peak amplitude of the EMF induced in each sense coil 21 and 23 will vary sinusoidally with the rotation angle (φ) of the resonant circuit 31 (and hence of the rotatable shaft 1). Therefore, the EMF's induced in the sense coils 21 and 23 will include the following components respectively:

$$EMF_{21} = A_0 \cos[\theta]\cos[2\pi F_0 t]$$

$$EMF_{23} = A_0 \cos\left[\theta + \frac{\pi}{2}\right]\cos[2\pi F_0 t] \quad (1)$$

where $F_0$ is the frequency of the excitation signal (which is 2 MHz in this embodiment), $A_0$ is the coupling coefficient between the resonant circuit 31 and the sensor coils 21 and 23 (which depends upon the separation between each of the sensor coils 21, 23 and the resonant circuit 31 among other things) and $$\theta = \frac{2\pi\phi}{\lambda} \quad (2)$$

where λ is the repeat angle, ie. the angle over which one period of each sense coil extends (which in this embodiment equals 120°), and φ is the rotation angle of the resonant circuit 31 (and hence of the rotatable shaft 1). There is an additional phase term, in this embodiment π/2, in the amplitude component of $EMF_{23}$. This is due to the circumferential offset between the sense coils 21 and 23 (the signal induced in sense coil 21 acting as the reference phase). These phase terms of the induced signals will be referred to hereinafter as the sense signal phase.

The EMFs induced in the sense coils 21 and 23 are input to respective mixers 57 and 59, where they are multiplied with mixing signals 63 and 65 respectively. In this embodiment, each of the mixing signals 63 and 65 is generated by the digital waveform generator 51 and comprises two periodically time varying components. The first component is shown in FIG. 7 and is a square wave corresponding to the square wave voltage applied to the excitation coil 25, but having a 90° offset to compensate for a phase change which occurs due to the resonator 31. The second component is a symmetrical oscillating voltage, with a fundamental frequency ($F_{IF}$) less than that of the excitation signal, the phase of which varies depending on which of the mixers 57 and 59 it is applied to. (In particular, the phase of the intermediate signal applied to each mixer depends upon the above mentioned sense signal phase of the input signal with which it will be mixed.) The first component effectively demodulates the amplitude modulated EMF induced in the corresponding sense coil and the second component re-modulates it to an intermediate frequency $F_{IF}$. In this embodiment $F_{IF}$=3.90625 KHz and is generated by dividing the 8 MHz clock signal generated by the crystal oscillator by $2^{11}$.

The second component of mixing signal 63 is shown in FIG. 8a and the second component of mixing signal 65 is shown in FIG. 8b. As shown, the second component of mixing signal 65 lags the second component of mixing signal 63 by 90°. In this way, in this embodiment, the phase of the second component applied to each of the mixers 57 and 59 has the same magnitude as the sense signal phase of the sensed signal with which it will be mixed.

As those who are familiar with Fourier analysis of signals will appreciate, a periodic symmetrical oscillating signal, such as the signals shown in FIG. 8, can be represented by the sum of a fundamental sinusoid and higher order odd harmonics of the fundamental frequency. Therefore, the multiplication being performed in the mixers 57 and 59 can be expressed as follows:

$$M_{57} = (A_0 \cos[\theta]\cos[2\pi F_0 t]) \times (\cos[2\pi F_0 t] + ODD\ HARMONICS) \times (\cos[2\pi F_{IF} t] + ODD\ HARMONICS)$$

$$\left(A_0 \cos\left[\theta + \frac{\pi}{2}\right]\cos[2\pi F_0 t]\right) \times \quad (3)$$

$$M_{59} = (\cos[2\pi F_0 t] + ODD\ HARMONICS) \times$$

$$\left(\cos\left[2\pi F_{IF} t + \frac{\pi}{2}\right] + ODD\ HARMONICS\right)$$

Performing this multiplication and rearranging the terms (ignoring the high frequency odd harmonics and the signal at twice the frequency of the excitation signal) results in the following expressions for the outputs $M_{57}$ and $M_{59}$ of the mixers 57 and 59:

$$M_{57} = \frac{A_0}{4}(\text{COS}[2\pi F_{IF}t + \theta] + \text{COS}[2\pi F_{IF}t - \theta]) \quad (4)$$

$$M_{59} = \frac{A_0}{4}(\text{COS}[2\pi F_{IF}t + \theta + \pi] + \text{COS}[2\pi F_{IF}t - \theta])$$

These signals are then added together in the adder 69 to give:

$$V_{OUT1} = \frac{A_0}{2}(\text{COS}[2\pi F_{IF}t - \theta]) \quad (5)$$

Therefore the output signal from the adder 69 includes a single sinusoid at the intermediate frequency whose phase leads the phase of the reference intermediate frequency signal by an amount ($\theta$) which varies in dependence on the angular position ($\phi$) of the rotatable shaft 1. As those skilled in the art will appreciate, the other intermediate frequency components cancel due to the particular choice of the phase of each of the intermediate frequency mixing signals.

As mentioned above, the signals received from the sense coils 21 and 23 are mixed with different mixing signals and combined to generate two signals whose phase varies with the positional information. $V_{OUT1}$ is one of those signals. The other signal is obtained by mixing the signal induced in sense coil 23 with the mixing signal 67 in mixer 61 and by adding the output from mixer 61 with the output from mixer 57 in adder 71. Like mixing signals 63 and 65, mixing signal 67 also comprises a first component corresponding to the drive signal for demodulating the received signal and a second component at the intermediate frequency for remodulating the signal. FIG. 8c illustrates the form of the second component of mixing signal 67 used in this embodiment. As shown, the second component of the mixing signal 67 leads the second component of mixing signal 63 by 90°. Therefore, the output of the mixer 61 is given by:

$$(A_0 \text{COS}[\theta + \frac{\pi}{2}] \text{COS}[2\pi F_0 t]) \times \quad (6)$$
$$M_{61} = (\text{COS}[2\pi F_0 t] + ODD\ HARMONICS) \times$$
$$(\text{COS}[2\pi F_{IF}t - \frac{\pi}{2}] + ODD\ HARMONICS)$$

Performing this multiplication and rearranging the terms (ignoring the high frequency odd harmonics and the signal at twice the frequency of the excitation signal) results in the following expression for the output of the mixer 61:

$$M_{61} = \frac{A_0}{4}(\text{COS}[2\pi F_{IF}t + \theta] + \text{COS}[2\pi F_{IF}t - \theta - \pi]) \quad (7)$$

Adding this signal to the signal output from the mixer 57 in the adder 71 gives:

$$V_{OUT2} = \frac{A_0}{2}(\text{COS}[2\pi F_{IF}t + \theta]) \quad (8)$$

The output signal from adder 71 thus includes a single sinusoid at the intermediate frequency whose phase lags the phase of the reference intermediate frequency signal by an amount ($\theta$) which varies with the angular position ($\phi$) of the rotatable shaft 1. As those skilled in the art will appreciate, the other intermediate frequency components cancel due to the particular choice of the phase of each of the intermediate frequency mixing signals.

Therefore, as can be seen from a comparison of equations 5 and 8, the two signals $V_{OUT1}$ and $V_{OUT2}$ are both intermediate frequency signals whose phases vary in opposite directions with the angular position of the shaft 1.

As mentioned above, the output from each of the adders 69 and 71 will also contain high frequency odd harmonic components of the intermediate frequency. This is because the second components of the mixing signals 63 and 65 are not perfect sine waves because they would be difficult to implement and would be impractical in a simple low-cost circuit. Low pass filters 73 and 75 are therefore needed to filter out these harmonic components from the signals output from adders 69 and 71. In this embodiment, the second signal components shown in FIG. 8 have been designed in order to reduce the energy within the lower order harmonics, since this reduces the constraints placed on the operating characteristics of the low pass filters 73 and 75. This is achieved by increasing the number of transitions in the signal in the vicinity where the lower order harmonics would have most effect, ie away from the peaks of the fundamental frequency $F_{IF}$.

The sinusoidally varying signals output from the low pass filter 73 and 75 are then converted into corresponding square wave signals by comparing them with ground (zero volts) in the comparators 77 and 79 respectively. The latches 81, 83, 85 and 87 are then used to convert the outputs of the comparators 77 and 79 into pulse-width modulated signals whose duty ratios vary monotonically with the angular position ($\phi$) of the rotatable shaft 1 through 120°. In this embodiment, this is achieved by comparing the output from each comparator 77 and 79 with two reference signals which also repeat at the intermediate frequency $F_{IF}$.

More specifically, the output signal from comparator 77 is applied to the set input of latches 81 and 83 and reference signals 82 and 84, which are generated by the waveform generator 51, are input to the reset inputs of the latches 81 and 83. In this embodiment, the set input of latch 81 is sensitive to the trailing edge of the output signal from comparator 77 and the reset input is sensitive to the leading edge of the reference signal 82. Similarly, the set input of latch 83 is sensitive to the leading edge of the output signal from comparator 77 and the reset input is sensitive to the leading edge of the reference signal 84. In this way, the output from latch 81 will be a pulse-width modulated signal whose duty ratio is dependent upon the time delay between the leading edge of the reset signal 82 and the trailing edge of the square wave output by the comparator 77 and the output of latch 83 will be a pulse-width modulated signal whose duty ratio is dependent upon the time delay between the leading edge of the reset signal 84 and the leading edge of the square wave output by the comparator 77. In a similar manner, the output from the comparator 79 is applied to latches 85 and 87, where it is compared with reference signals 86 and 88 generated by the waveform generator 51. As with the latches 81 and 83, latches 85 and 87 are arranged so that latch 85 outputs a pulse-width modulated signal whose duty ratio is dependent upon the time delay between the leading edge of the reference signal 86 and the trailing edge of the square wave output by the comparator 79 and so that the latch 87 outputs a pulse-width modulated signal whose duty ratio is dependent upon the time delay between the leading edge of the reference signal 88 and the leading edge of the square wave output by the comparator 79.

The inverted output ($\overline{Q}$) from the latches 81 and 83 and the non-inverting output (Q) from latches 85 and 87 are input to the adder 89 where the four pulse width modulated signals are added together. In this way, the output from latch 81 is added to the output from latch 83 and this signal is subtracted from the sum of the output from latch 85 and the output from latch 87. As will be described in more detail below, the adding of these signals in this way removes any common phase offset generated in the two processing channels and removes any errors which may be caused by a voltage offset in one or both of the comparators 77 and/or 79.

Correction for errors caused by comparator offset is achieved by passing the output from the comparator into two latches, one which is triggered upon the falling edge of the signal output by the comparator and one which is triggered by the leading edge of the signal output by the comparator, and by adding the outputs from the two latches together. In this way, if there is an offset in the comparator, then the duty ratio of the signal output by one latch will increase and the duty ratio of the signal output by the other latch will decrease by a similar amount. Therefore, adding the output signals from the two latches results in a signal having the same average duty ratio. However, this correction will only work if the comparator offset does not cause the leading or trailing edge to be moved into an adjacent intermediate frequency period. Therefore, errors would arise, in this embodiment at sensor angles of around 90° and −30°, since at these locations the trailing or leading edges might end up in the wrong IF period.

Correcting for common phase offsets in the two channels is achieved by subtracting the signals from each channel. As those skilled in the art will appreciate, subtracting signals from the channels will remove the common offsets but will not remove the position information since, in this embodiment, the positional phase variations in the two channels have opposite polarity. Therefore, when the signals from the two channels are subtracted, the position phase variations in each channel add together. However, as those skilled in the art will appreciate, the dual-channel approach of this embodiment will not take into account phase errors which are not common to each channel, but these errors can be minimised by careful matching of the components in each channel.

The signal output by the adder 89 is then passed through a potential divider 91 which can be configured for the required output voltage variation and offset. The signal output by the potential divider is then filtered by a low pass filter 93 to generate an output voltage (A_OUT) which equals the average value of the signal output by the potential divider 91. In this embodiment, this output signal A_OUT varies linearly between 0 and 5 volts and repeats every 120° of rotation of the rotatable shaft 1. As shown in FIG. 5b, the potential divider 91 is arranged so that when φ equals 90°, A_OUT equals zero volts.

The system described above typically achieves linearity of better than +/−0.1%, even when measured with varying input signal levels from 800 mV r.m.s down to 100 mV r.m.s, i.e. a dynamic range of 8:1.

The operation of the above embodiment will now be illustrated with reference to the signal diagrams shown in FIGS. 9 to 36, which illustrate the form of some of the signals in the processing circuitry when the rotatable shaft 1 is at three different positions—the first position corresponds to φ=30°; the second position corresponds to φ=45°; and the third position corresponds to φ=100°. The timing diagrams shown in these Figures have been simplified by reducing the number of excitation pulses per intermediate frequency period to 64 instead of 512. This makes the diagrams simpler to view, since both the intermediate frequency and the excitation frequency signals can be seen together. In the Figures, exactly one intermediate frequency period is illustrated. The waveform sequence is repeated for the next period, and so on. Since the excitation frequency is 2 MHz and the intermediate frequency is 3.90625 kHz, the actual intermediate frequency period is therefore 256 µs.

φ=30°

FIGS. 9a and 9b show the form of the signals induced in the sense coils 21 and 23 respectively, when φ=30°. As shown there is no signal induced in sense coil 21 since, as shown in FIG. 4, when φ corresponds to 30°, the peak amplitude of the signal induced in sense coils 21 is zero. In contrast, there is a signal induced in the sense coil 23 and, as shown in FIG. 4, when the rotatable shaft is at an angle of 30°, the signal induced in sense coil 23 has its peak value at this position.

FIG. 10a shows the output from the mixer 57. Since there is no signal induced in sense coil 21, the output from mixer 57 is also zero. FIG. 10b shows the output from the mixer 59, which is generated by mixing the signal shown in FIG. 9b with the drive signal shown in FIG. 7 and the intermediate frequency signal shown in FIG. 8b. Similarly, FIG. 10c shows the output from mixer 61 which is generated by multiplying the signal shown in FIG. 9b with the drive signal shown in FIG. 7 and the intermediate frequency signal shown in FIG. 8c.

As mentioned above, the output from the mixers 57 and 59 are added together in the adder 69. FIG. 11a shows the form of the signal output by the adder 69. As shown, this signal is the same as the signal output by the mixer 59 shown in FIG. 10b, since there is no output from mixer 57. Similarly, the output from adder 71, as shown in FIG. 11b, is the same as the output from mixer 61 shown in FIG. 10c. The outputs from the adders 69 and 71 are then filtered by the low pass filters 73 and 75 and the filtered output signals from the low pass filters 73 and 75 are shown in FIGS. 12a and 12b respectively. In this embodiment, as can be seen from a comparison of the signals shown in FIGS. 11 and 12, the low pass filters 73 and 75 introduce a phase delay of 90° to the input signals. The filtered signals shown in FIG. 12 are then passed through comparators 77 and 79 where they are compared with ground. FIGS. 13a and 13b show the resulting square wave output from the comparators 77 and 79 respectively.

As mentioned above, the square wave signal shown in FIG. 13a, which is the output signal from comparator 77, is applied to the set input of latches 81 and 83 and the square wave signal shown in FIG. 13b, which is the output signal from comparator 79, is applied to the set input of latches 85 and 87. FIG. 14a shows the form of the reference signal 82 applied to the latch 81 and FIG. 15a shows the form of the pulse width modulated signal output by the latch 81 from its inverting output ($\overline{Q}$). As shown, the leading edge of the reference signal shown in FIG. 14a causes the output from the latch 81 to change from a zero level to a high level, and the falling edge of the comparator output signal shown in FIG. 13a causes the output level of $\overline{Q}$ to be reset back to a low level. FIG. 14b shows the form of the reference signal 84 input to the reset input of latch 83. FIG. 15b shows the resulting inverted output from latch 83. As shown, upon the leading edge of the reference signal 84, the output from latch 83 changes state from a low level to a high level and only returns to a low level upon the leading edge of the square wave signal output by comparator 77, shown in FIG. 13a.

Figure 16:
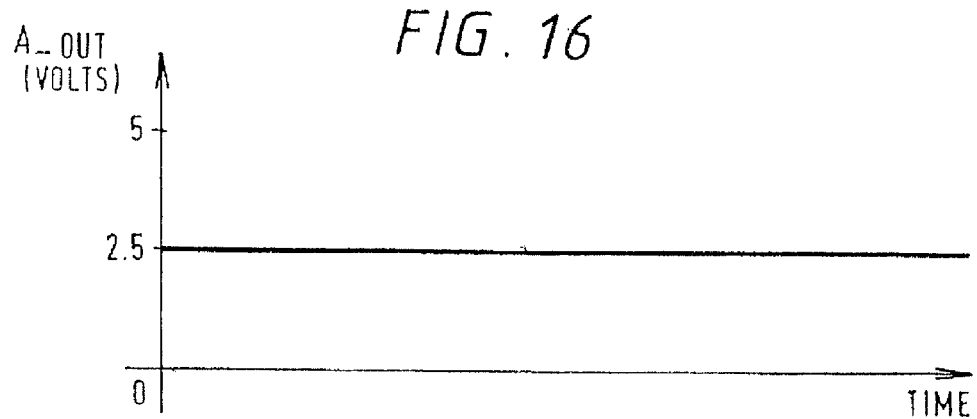
FIG. 16 is a plot of the output voltage obtained by combining the signals shown in FIGS. 15a to 15d and filtering the combined signal.

In a similar manner, the square wave signal output by comparator 79, which is shown in FIG. 13b, is applied to the set inputs of latches 85 and 87. In this embodiment, the reference signal 86 is the same as reference signal 82, which is shown in FIG. 14a, and reference signal 88 is the same as reference signal 84, which is shown in FIG. 14b. The output signals from the latches 85 and 87 are therefore shown in FIGS. 15c and 15d. As shown in FIG. 5b, in this embodiment, the potential divider 91 is arranged so that when φ is equal to 30°, the DC voltage output by the low pass filter 93 is equal to 2.5 volts, which is shown in FIG. 16.

φ=45°

FIGS. 17a and 17b show the form of the signals induced in the sense coils 21 and 23 when the rotatable shaft is at an angle corresponding to φ=45°. As shown and as can be confirmed with reference to FIG. 4, at φ=45°, the peak amplitudes of the signals induced in sense coils 21 and 23 have the same value. Therefore, the signals shown in FIGS. 17a and 17b are the same.

FIG. 18a shows the form of the signal output by the mixer 57 when the signal shown in FIG. 17a is mixed with the drive signal shown in FIG. 7 and the intermediate frequency signal shown in FIG. 8a. Similarly, FIG. 18b shows the output of the mixer 59 which is formed by mixing the signal shown in FIG. 17b with the drive signal shown in FIG. 7 and the intermediate frequency signal shown in FIG. 8b. Similarly, FIG. 18c shows the output signal from the mixer 61 formed by mixing the signal shown in FIG. 17b with the drive signal shown in FIG. 7 and the intermediate frequency signal shown in FIG. 8c. The signals shown in FIGS. 18a and 18b are then added together in adder 69 to generate the signal shown in FIG. 19a and the signal shown in FIGS. 18a and 18c are added together in adder 71 to generate the signal shown in FIG. 19b. These signals are then filtered by the low pass filters 73 and 75 to generate the filtered signals shown in FIGS. 20a and 20b.

Figure 24:
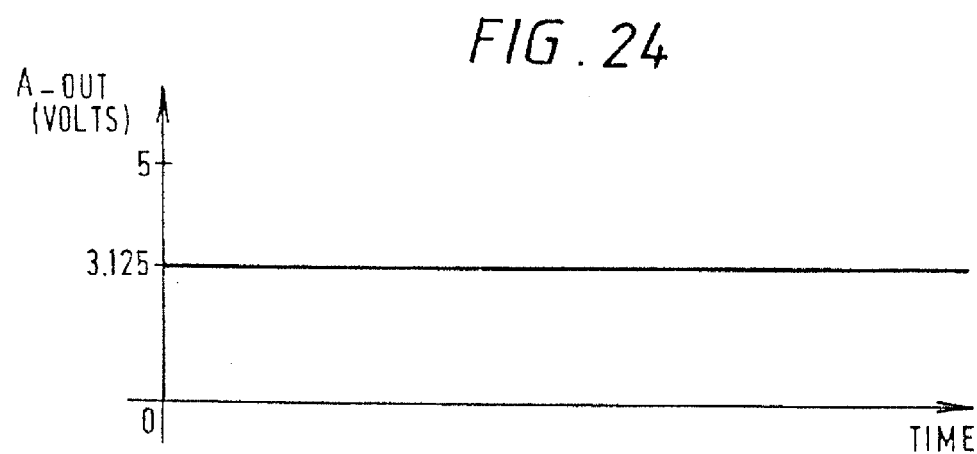
FIG. 24 is a plot of the output voltage obtained by combining the signals shown in FIGS. 23a to 23d and filtering the combined signal.
Figure 32:
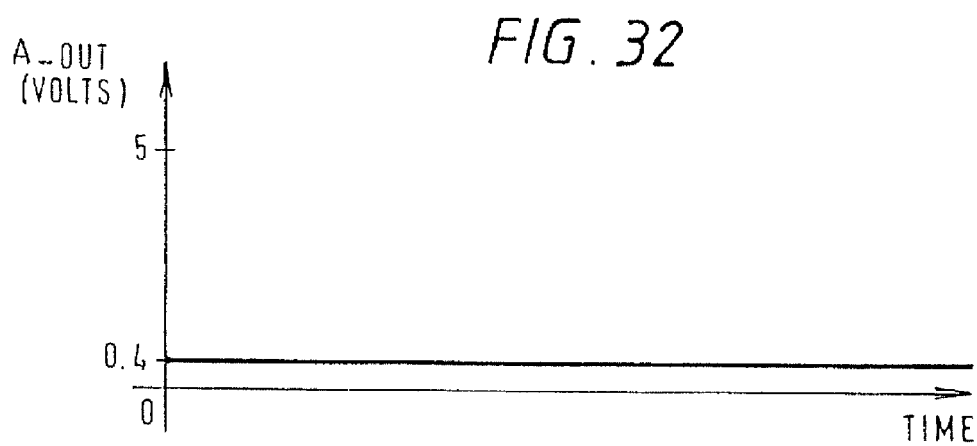
FIG. 32 is a plot of the output voltage obtained by combining the signals shown in FIGS. 31a to 31d and filtering the combined signal.

These filtered signals are then converted into the corresponding square wave signals shown in FIGS. 21a and 21b by passing the filtered signals through the comparators 77 and 79 respectively. FIGS. 22a and 22b show the form of the two reference signals which control the latches 81, 83, 85 and 87, which are the same as the reference signals shown in FIGS. 14a and 14b. FIGS. 23a, 23b, 23c and 23d show the outputs from the respective latches 81, 83, 85 and 87 for the current position of the shaft 1. As shown, by rotating the shaft through 15° from the first position, the duty ratio of the pulse width modulated signals output by the latches has increased. This results in a corresponding increase in the DC voltage output by the low pass filter 93. In this embodiment, at this second position, the output voltage is 3.125 volts, as shown in FIG. 24.

φ=100°

FIGS. 25a and 25b show the signal induced in the sense coils 21 and 23 respectively, when the rotatable shaft 1 is at a position corresponding to φ=100°. As shown in FIG. 25, the peak amplitude of the signal induced in sense coil 23 is greater than the peak amplitude of the signal induced in sense coil 21. This can be confirmed by considering the plot shown in FIG. 4.

The signal shown in FIG. 25a is mixed with the drive signal shown in FIG. 7 and the intermediate frequency signal shown in FIG. 8a to generate the signal shown in FIG. 26a; the signal shown in FIG. 25b is mixed with the drive signal shown in FIG. 7 and the intermediate frequency signal shown in FIG. 8b to generate the signal shown in FIG. 26b; and the signal shown in FIG. 25b is mixed with the drive signal shown in FIG. 7 and the intermediate frequency signal shown in FIG. 8c to generate the signal shown in FIG. 26c.

Figures 27A, 27B:
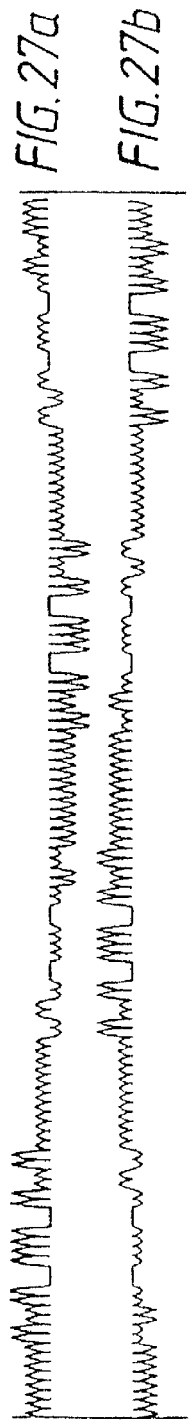
FIG. 27a is a timing diagram illustrating the form of the signal output by the first adder shown in FIG. 5a, when the signals shown in FIGS. 26a and 26b are input to the adder.
FIG. 27b is a timing diagram illustrating the form of the signal output from the second adder shown in FIG. 5a, when the signals shown in FIGS. 26a and 26c are input to the adder.
Figures 28A, 28B:
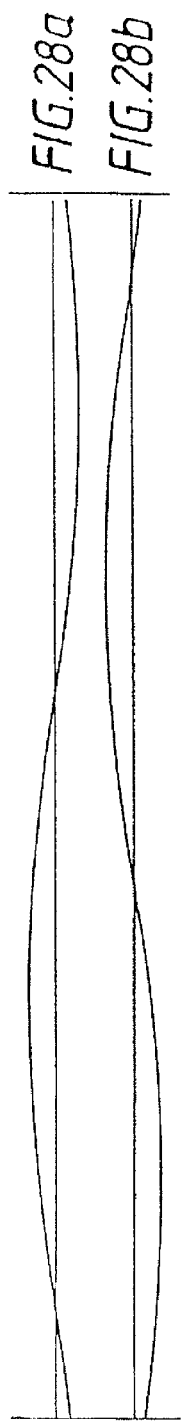
Figures 29A, 29B:
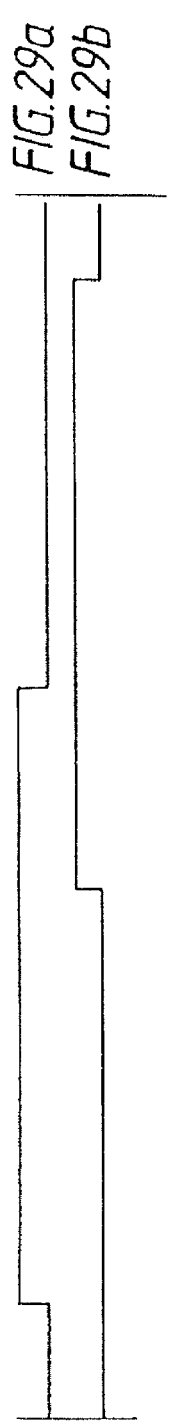
FIG. 29a is a timing diagram illustrating the form of an output signal from the first comparator shown in FIG. 5a obtained by comparing the signal shown in FIG. 28a with ground.
FIG. 29b is a timing diagram illustrating the form of an output signal from the second comparator shown in FIG. 5a obtained by comparing the signal shown in FIG. 28b with ground.
Figures 30A, 30B:
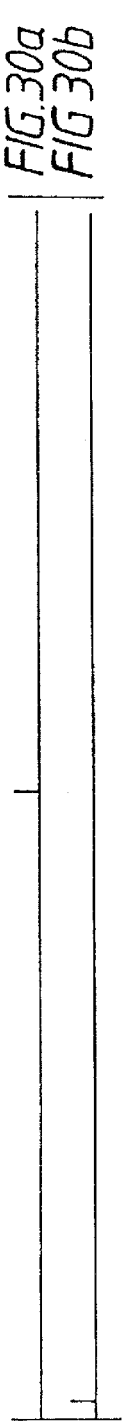

The signal shown in FIGS. 26a and 26b are then added in the adder 69 to generate the signal shown in FIG. 27a and the signals shown in FIGS. 26a and 26c are added in the adder 71 to generate the signal shown in FIG. 27b. These signals are then filtered by the low pass filter 73 and 75 to generate the filtered signals shown in FIGS. 28a and 28b respectively.

These filtered signals are then converted into corresponding square wave signals by comparing them with ground in the comparators 77 and 79. The square wave signals output by the comparators 77 and 79 are then input to the latches 81, 83, 85 and 87 together with the reference signals shown in FIGS. 30a and 30b, which are the same as those shown in FIGS. 14a and 14b. As can be seen from the pulse width modulated signals 31a, 31b, 31c and 31d, representing the output from the latches, the duty ratio of these signals is much smaller at this third position, resulting in a lower DC output level. In this embodiment, at an angular position corresponding to φ=100°, the output voltage is 0.4 volts, as shown in FIG. 24.

Therefore, as those skilled in the art will appreciate, as the angular position of the rotatable shaft 1 is changed, the output voltage (A_OUT) linearly varies with the angular position.

In order to illustrate the effect of an offset in one of the comparators, a description will now be given with reference to FIGS. 33 to 36, which illustrate what happens in the event of the comparator 77 having an offset voltage $V_{OS}$, when the rotatable shaft 1 is in the third angular position described above. In this example, the offset has a value of 30% of the peak sine wave (e.g. $V_{OS}$=3 mV when the peak signal out of the filter 73 has a value of 10 mV). As shown in FIG. 33a, the ground of the comparator 77, as represented by line 102 is shifted relative to the true ground represented by the dashed line 104. This results in the leading edge of the square wave signal output by the comparator 77 moving to the left and the trailing edge moving to the right, as compared with the true positions shown in FIG. 29a. However, since there is no offset in the comparator 79, the signal shown in FIG. 34b, which represents the output from comparator 79, is the same as the signal shown in FIG. 29b. As shown in FIGS. 35a and 35b, the reference signals applied to the latches are the same as those shown in FIGS. 30a and 30b.

Figures 31A, 31B, 31C, 31D:
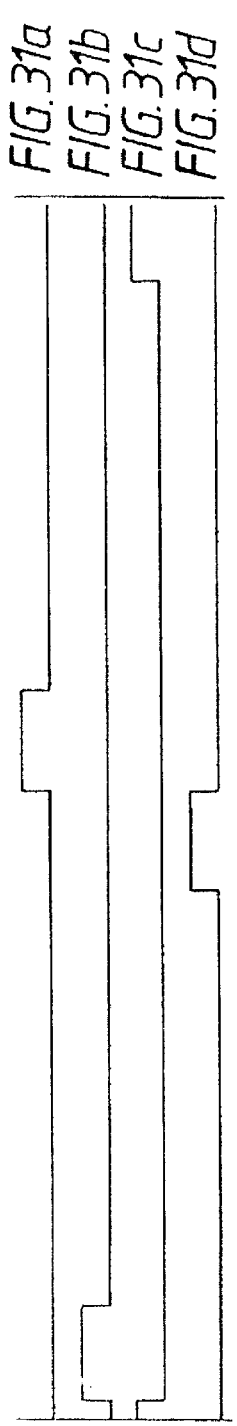
FIG. 31a is a timing diagram illustrating the form of an output signal from the first latch shown in FIG. 5a, when the signal shown in FIG. 29a is applied to a set input of the latch and the reference signal shown in FIG. 30a is applied to the reset input of the latch.
FIG. 31b is a timing diagram illustrating the form of an output signal from the second latch shown in FIG. 5a, when the signal shown in FIG. 29a is applied to a set input of the latch and the reference signal shown in FIG. 30b is applied to the reset input of the latch.
FIG. 31c is a timing diagram illustrating the form of an output signal from the third latch shown in FIG. 5a, when the signal shown in FIG. 29b is applied to a set input of the latch and the reference signal shown in FIG. 30b is applied to the reset input of the latch.
FIG. 31d is a timing diagram illustrating the form of an output signal from the fourth latch shown in FIG. 5a, when the signal shown in FIG. 29b is applied to a set input of the latch and the reference signal shown in FIG. 30a is applied to the reset input of the latch.

Therefore, as can be seen from a comparison of FIGS. 36a and 36b with FIGS. 31a and 31b (which show the pulse width modulated signals output by latches 81 and 83 at the third position when there is no comparator offset), the shifting to the right of the trailing edge of the signal shown in FIG. 34a, results in the duty ratio of the signal shown in FIG. 36a increasing and the shifting to the left of the leading edge of the signal shown in FIG. 34a, results in the duty ratio of the signal shown in FIG. 36b decreasing. Therefore, when these two pulse width modulated signals are added in adder 89, the effect of this comparator offset will be removed, since the increase in the duty ratio of the signal in FIG. 36a will cancel with the decrease in the duty ratio of the signal shown in FIG. 36b.

As those skilled in the art will appreciate, the above embodiment has a number of advantages over the processing electronics described in the applicant's earlier international application WO95/31696. These include:

1) the processing circuitry described above is able to produce an output signal (A_OUT) which continuously changes as the rotational angle of the rotatable shaft 1 changes; whereas, with the processing circuitry described in WO95/31696, an arc-tangent calculation has to be performed each time a position measurement is required;

2) by feeding the output of a comparator into two latches, one triggered on the trailing edge and the other triggered on the leading edge of the comparator output signal, errors due to a voltage offset in the comparator can be removed;

3) by providing a dual channel design, common phase errors introduced by, for example, the low pass filters or the comparators can be removed by subtracting the signals from the two channels; and 4) by using the three level intermediate mixing signals shown in FIG. 8, which are designed to reduce the energy within the lower order harmonics, less complex low pass filters are required in order to reduce the effect of the lower order harmonic terms (the third and fifth harmonics).

Alternative Embodiments

As those skilled in the art will appreciate, whilst each of these advantageous features has been described in a single embodiment, they could be implemented alone or in any combination. For example, the embodiment described above could be modified so that there is only a single channel, with compensation for comparator offset and with an intermediate frequency signal formed by a square wave. Alternatively, the comparator compensation can be omitted and a dual channel design may be provided which also uses a square wave intermediate frequency mixing signal.

A second embodiment will now be described with reference to FIGS. 37 to 48. In the second embodiment, the same position encoder described with reference to FIGS. 1 to 4 is used to generate a pair of phase quadrature signals whose amplitude sinusoidally varies with the rotational position of the shaft 1. The difference in the second embodiment is in the front-end mixing of the received signals. In particular, as those skilled in the art will appreciate from a comparison of FIGS. 10b and 10c, the output $M_{61}$ of the mixer 61 is the inverse of the output $M_{59}$ of the mixer 59, and the second embodiment uses this fact to remove the mixer 61. Instead, the signal output by mixer 59 is input to a subtraction circuit 111 where it is subtracted from the output from mixer 57. This embodiment is preferred since the number of components and complexity of the processing circuitry is reduced.

In this second embodiment, the components which are identical to those used in the first embodiment are given the same reference numerals. It can therefore be seen with a comparison with FIG. 5a, that the only changes in this embodiment are the removal of the mixer 61 and the mixing signal 67, the replacement of the adder 71 with a subtraction circuit 111 and the replacement of the digital waveform generator 51 with the modified digital waveform generator 113. As those skilled in the art will appreciate, the signal output from the subtraction circuit 111 will be identical to the signal output by the adder 71 in the first embodiment, and therefore the processing carried out to the signals thereafter is identical to that carried out in the first embodiment and will not be described again.

A more detailed description of the circuit components which form part of the processing circuitry shown in FIG. 37 will now be described.

FIG. 38 is a schematic block diagram illustrating in more details the components of the digital waveform generator 113. As in the first embodiment, the digital waveform generator 113 receives an 8 MHz clock signal at input terminal 129 from the crystal oscillator 53. The clock signal from the crystal oscillator is input to a D-type flip-flop 131 which outputs inverted and non-inverted signals at 4 MHz which are used as the system clock which clocks the latch 133, the counter 135 and the latch 139, which form part of the digital waveform generator 113.

The counter 135 is clocked by the 4 MHz system clock and outputs a digital number which is incremented once per system clock. The least significant bit of this digital number (which is charging at 2 MHz) is fed to the input of the latch 133, which latches this signal to produce inverted and non-inverted outputs which form the drive signals TXA and TXB at the correct phase, which are supplied to the excitation driver 55. The digital number output by the counter 135 is also supplied to the input of the EPROM 137. The digital number is used to address memory locations within the EPROM 137. In response, the EPROM 137 outputs the values of the reference signals which are applied to the latches 81, 83, 85 and 87 and the mixing signals which are applied to mixers 57 and 59 in the current clock cycle. However, before being output from the digital waveform generator 113, these signals are passed through a latch 139 so as to synchronise any transitions which may occur within the control signals at the current clock cycle.

As shown in FIG. 38, the control signals output by the digital waveform generator 113 include:

DMIX_SIN_A—which is one of the mixing control signals applied to the mixer 57;

DMIX_SIN_B—which is the other mixing control signal applied to mixer 57;

DMIX_COS_A—which is one of the mixing control signals applied to the mixer 59;

DMIX_COS_B—which is the other mixing control signal applied to mixer 59;

RESET P—which is the reference signal 82 applied to latch 81;

RESET Q—which is the reference signal 84 applied to latch 83;

RESET R—which is the reference signal 86 applied to latch 85; and

RESET S—which is the reference signal 88 applied to latch 87.

As in the first embodiment, reference signal 82 is the same as reference signal 88 and reference signals 84 and 86 are the same. Therefore, RESET P and RESET S are the same and RESET Q and RESET R are the same. These reference signals are shown in FIGS. 14a and 14b.

Figure 39:
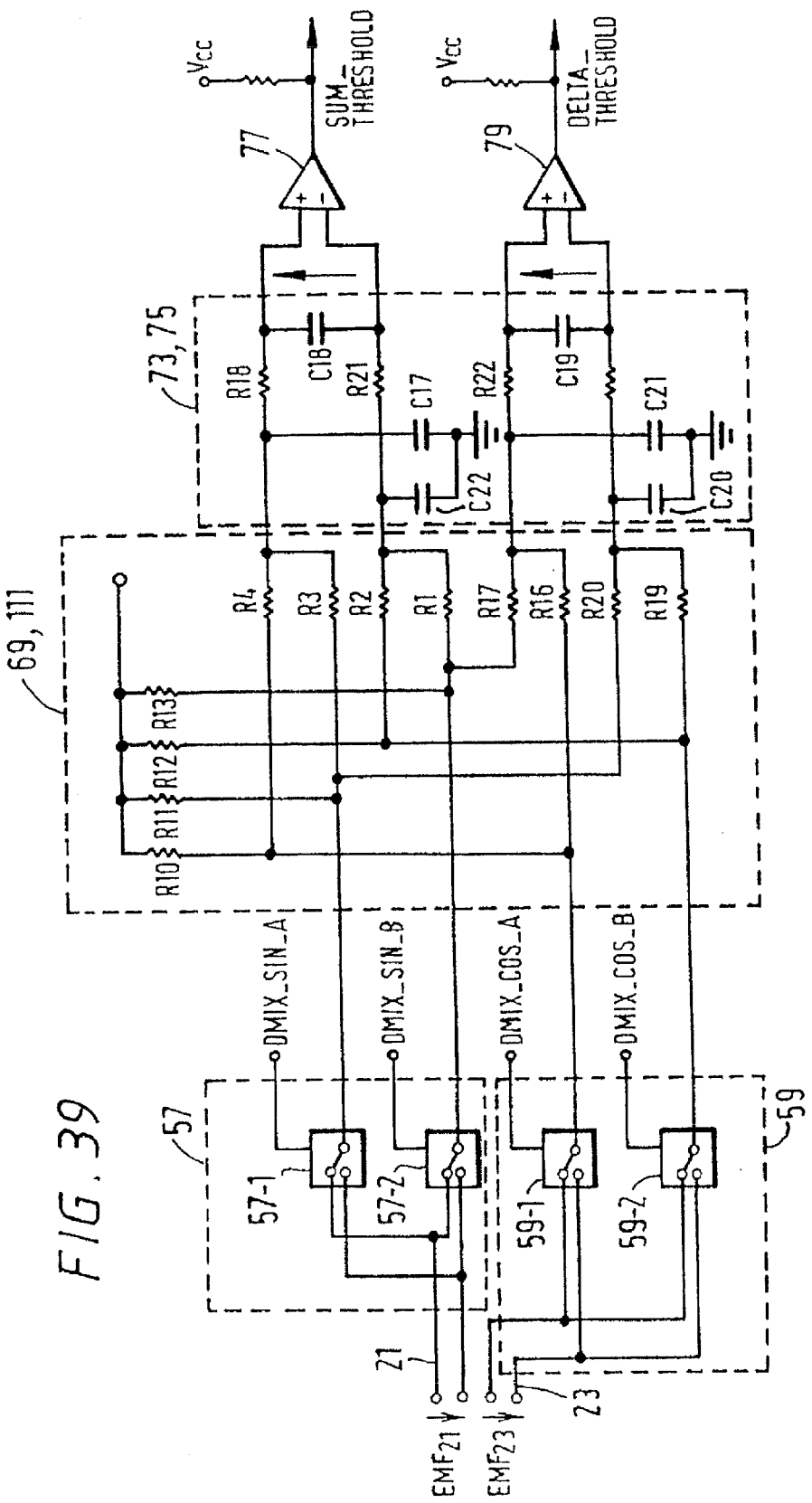
FIG. 39 is a schematic circuit diagram showing the form of processing elements within the processing circuitry shown in FIG. 37.

FIG. 39 shows in more detail, the components of the mixers 57 and 59, the adder 69, the subtraction circuit 111, the low pass filters 73 and 75 and the comparators 77 and 79. As shown, each of the mixers 57 and 59 is implemented by two switches 57-1, 57-2 and 59-1, 59-2, with each switch having two inputs and a single output. Considering first the mixer 57, each end of sense coil 21 is connected to a respective input to the two switches 57-1 and 57-2. Similarly, each end of sense coil 23 is connected to a respective input to the two switches 59-1 and 59-2. The outputs from the switches are input to the adder 69 and subtraction circuit 111.

Figure 40:
FIG. 40 is a timing diagram illustrating the form of an intermediate frequency signal which is mixed with the signal from one of the sense coils shown in FIG. 2.
Figure 41:
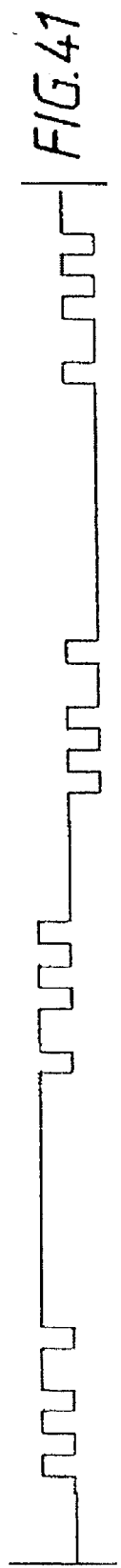
FIG. 41 is a timing diagram illustrating the form of a second intermediate frequency signal which is mixed with the signal from the second sense coil shown in FIG. 2.
Figure 42:
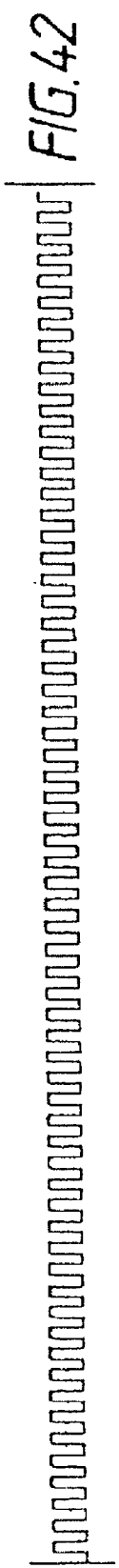
FIG. 42 is a timing diagram which illustrates the form of a mixing signal which is mixed with the signals from both sense coils shown in FIG. 2.

The mixer circuit 57 is operable to mix the signal received from the sense coil 21 with the intermediate frequency signal shown in FIG. 40 (which is the same as the signal shown in FIG. 8a) and with the demodulating signal shown in FIG. 42 (which is the same as the signal shown in FIG. 7). Since the intermediate frequency signal is a three level signal which can be +1, 0 or −1, the switches must be able to allow the signal across their outputs to take the values $EMF_{21}$, $-EMF_{21}$ and 0. Similarly, the mixing circuit 59 is operable to mix the signal received from sense coil 23 with the intermediate frequency signal shown in FIG. 41 (which is the same as the signal shown in FIG. 8b) and with the demodulating signal shown in FIG. 42. Since the intermediate frequency signal shown in FIG. 41 is a three level signal, the switches must be able to allow the signal across their outputs to take the values $EMF_{23}$, $-EMF_{23}$ and 0. To achieve this, two mixing signals (DMIX_A_SIN and DMIX_SIN_B) are used to control the state of the switches 57-1 and 57-2 and two mixing signals (DMIX_COS_A and DMIX_COS_B) are used to control the state of the switches 59-1 and 59-2. The following truth table defines the way in which these control signals achieve this, in this embodiment, for mixer 57.

TABLE 1

| DMIX SIN A | DMIX SIN B | state | MIXOUT sin |
|---|---|---|---|
| 0 | 0 | zero output | = 0 |
| 0 | 1 | negative connection | = $-EMF_{21}$ |
| 1 | 0 | positive connection | = $+EMF_{21}$ |
| 1 | 1 | zero output (not used) | not used |

In order that the control signals achieve the proper mixing of the input signal with the signals shown in FIGS. 40 and 42, a truth table must be generated which relates the states of the above control signals to the states of the mixer signals. The truth table used for the mixing signals shown in FIGS. 40 and 42 is shown below.

TABLE 2

| Inputs | | Outputs | |
|---|---|---|---|
| $MIX_{IF}$ | $MIX_{DMOD}$ | DMIX_sin_A | DMIX_sin_B |
| 0 | 0 | 0 | 0 |
| 0 | 1 | 0 | 0 |
| 1 | 0 | 0 | 1 |
| 1 | 1 | 1 | 0 |
| -1 | 0 | 1 | 0 |
| -1 | 1 | 0 | 1 |

In this truth table, $MIX_{IF}$ shows the three possible states of the intermediate frequency mixing signal shown in FIG. 40 and $MIX_{DMOD}$ shows the two possible states of the demodulating component shown in FIG. 42. In the truth table, the states of this demodulating components are represented as 0 and 1. In practice, the demodulating signal has values +1 and -1.

Figure 43:
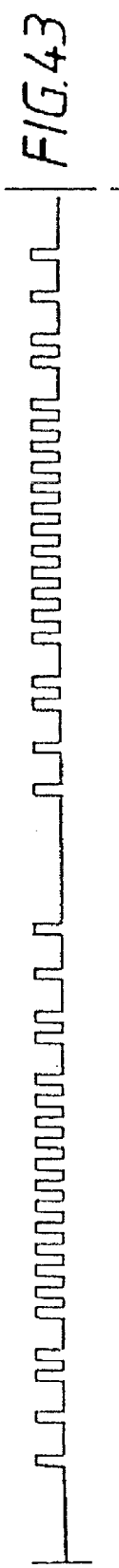
FIG. 43 is a timing diagram illustrating the form of a first control signal used to control the switching of a switch shown in FIG. 39.
Figure 44:
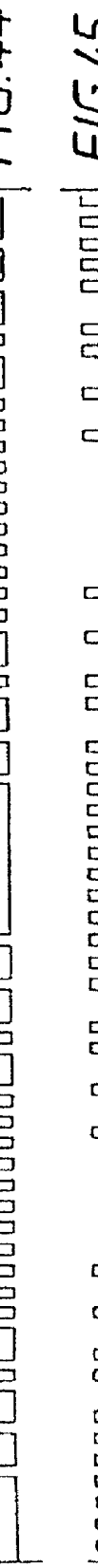
FIG. 44 is a timing diagram illustrating the form of a second control signal used to control the switching of a second switch shown in FIG. 39.

The logic values of the mixing control signals shown in the "outputs" column are generated by considering what the output signal should be at the output of the mixer given the mixing inputs and using Table 1, identifying what the mixing control signals should be. For example, when $MIX_{IF}$ is 1 and $MIX_{DMOD}$ is 0 (representing -1), then the output from the mixer should be the inverse of the input to the mixer. Therefore, referring to Table 1 above, the mixing control signals (DMIX_SIN_A and DMIX_SIN_B) should be 0 and 1 respectively. FIGS. 43 and 44 show the resulting DMIX_SIN_A and DMIX_SIN_B signals generated for the mixing signals shown in FIGS. 40 and 42, using the above Tables.

Figure 45:
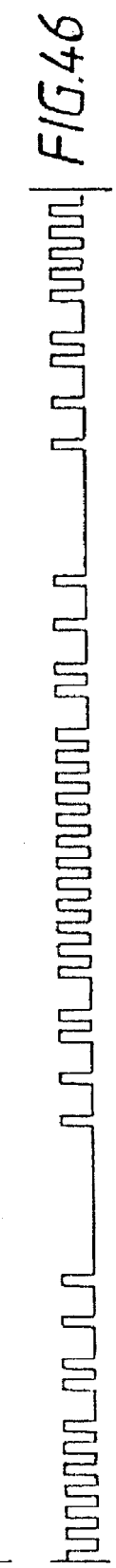
FIG. 45 is a timing diagram illustrating the form of a third control signal used to control the switching of a third switch shown in FIG. 39.
Figure 46:
FIG. 46 is a timing diagram illustrating the form of a fourth control signal used to control the switching of a fourth switch shown in FIG. 39.

A similar truth table is used to generate the control signals (DMIX_COS_A and DMIX_COS_B which control the switches 59-1 and 59-2 in mixer 59. The control signals generated for the mixing signals shown in FIGS. 41 and 42, using the above Tables, are shown in FIGS. 45 and 46 respectively. In this embodiment, the actual values of these control signals used to control the switching of the switches 57-1, 57-2, 59-1 and 59-2 are stored for a whole intermediate frequency period in the EPROM 137 shown in FIG. 38, so that each time the counter 135 cycles through its count, the EPROM outputs the control signals of one period of the intermediate frequency.

Figure 47:
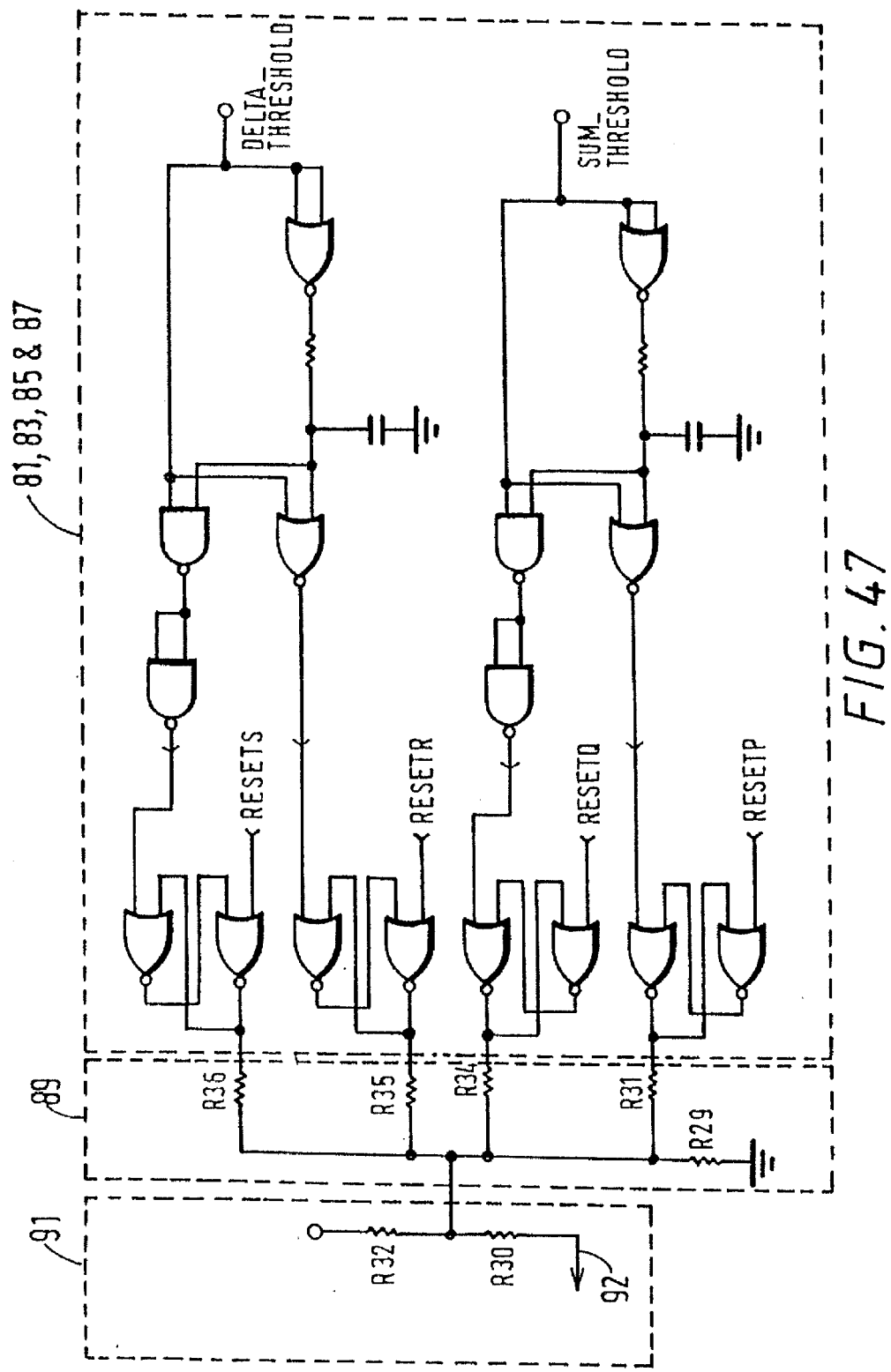
FIG. 47 is a circuit diagram detailing latch circuits, an adder circuit, and a potential divider circuit forming part of the processing circuitry shown in FIG. 37.

As shown in FIG. 39, the outputs from the mixers 57 and 59 are input to the adder 69 and subtraction circuit 111. The subtraction is achieved by inverting the output of the mixter 59 through the resistor network. In FIG. 39, the resistors R10 and R13 bias the mixers and comparators to an operating point in the middle of their linear operating range. The resistors R1 to R4 and R16 to R20, which form the sum and difference signals, are also the first resistance in a two-stage RC filter. Capacitors C16, C17, C20 and C21 are the first set of capacitors in this RC filter. The second stage of the RC filter is formed by resistor R18 and R21 to R23 and capacitors C18 and C19. In this embodiment, the capacitors C18 and C19 are left floating as the comparators 77 and 79 provide sufficient rejection of any common-mode high frequency noise which may be present. Alternatively, the inputs to the comparators may be coupled to ground via further capacitors for improved common mode noise immunity. The output of compartor 77 (labelled SUM_THRESHOLD) and the output of compartor 77 (labelled DELTA_THRESHOLD) are then applied to the inputs of the latch circuits 81, 83, 85 and 87, which are shown in FIG. 47. FIG. 47 also shows the inputs for the reference signals RESET P, RESET Q, RESET R and RESET S, which are used to control the switching points of the pulse width modulated signals output by the latches.

FIG. 47 also shows the adder 89 which is formed by resistor R31, R34, R35 and R36, which are nominally equal. The potential divider function is performed by resistors R29 and R32 in combination with the parallel combination of resistors R31, R34, R35 and R36. If R29 and R32 are omitted, then the output (A_OUT) swings from rail to rail (eg 0 to 5 volts when $V_{CC}$=5 volts). With the sensor pitch of 120° as in this embodiment, then the output sensitivity would be 120° divided by 5 volts which equals to 24° per volt, equivalent to 41.66 mv/°.

Figure 48:
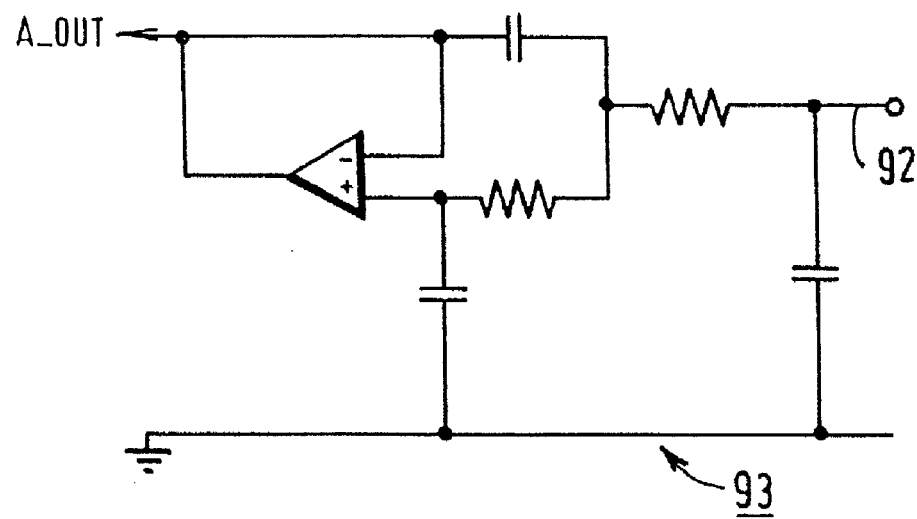
FIG. 48 is a circuit diagram showing in more detail the form of a low pass filter forming part of the processing circuitry shown in FIG. 37.

The output 92 from the potential divider 91 is applied to the input of the low pass filter 93, which is shown in more detail in FIG. 48. The function of the low pass filter shown in FIG. 48 is to generate the output voltage A_OUT, which equals the average value of the phase width modulated outputs from the latches, while retaining a sufficiently fast dynmaic response, and not passing an excessive amount of synchronous noise. In this embodiment, a three pole, unity gain active filter with low offset voltage is used. The low pass filter has approximately Bessel characteristics, with a cut-off frequency of around 100 Hz and a 0-90% step response time of approximately of 5 ms.

Figure 49:
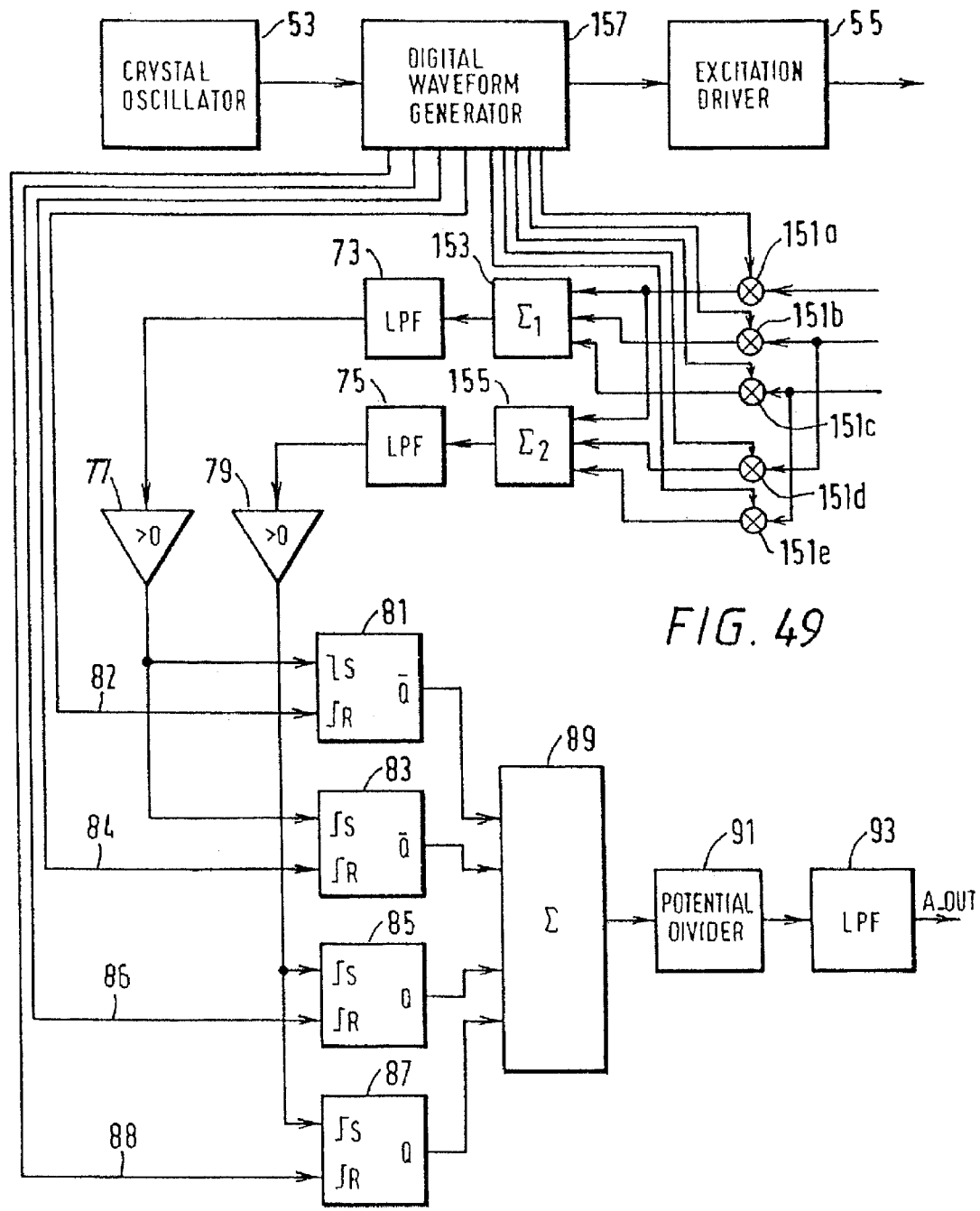
FIG. 49 is a schematic representation of excitation and processing circuitry used for determining the relative position of two relatively moveable members from a position encoder which employs three sense coils.

In the embodiments described above, the signals from two sense coils are processed to provide an indication of the angular position of a rotatable shaft 1. As those skilled in the art will appreciate, the processing circuitry described above can be used to determine the position of two members which more linearly with respect to each other. Additionally, the processing circuitry can also be modified to the cope with signals from any number of sense coils. This will be illustrated for a system which employs these coils. The excitation and processing circuitry employed in this embodiment is shown in FIG. 49. In FIG. 49, the same component as in FIG. 5a are referenced with identical numerals. As can be seen from a comparison of these Figures, this embodiment differs from the first embodiment only in that five mixers 51a to 51e are used instead of three, adders 153 and 155 each add the outputs of three of the mixers and the digital waveform generator 157 supplies the mixing signals to all five mixers 151.

In this embodiment, the sense coils are evenly spaced over the measurement direction and the signals from the three sense coils are electrically separated from each other by 60°. The EMFs induced in the three sense coils can, therefore, be represented by the following equations:

$$EMF_1 = A_0 \text{COS}\left[\frac{2\pi\theta}{\lambda}\right]\text{COS}[2\pi F_0 t] \quad (9)$$

$$EMF_3 = A_0 \text{COS}\left[\frac{2\pi\theta}{\lambda} + \frac{\pi}{3}\right]\text{COS}[2\pi F_0 t]$$

$$EMF_5 = A_0 \text{COS}\left[\frac{2\pi\theta}{\lambda} + \frac{2\pi}{3}\right]\text{COS}[2\pi F_0 t]$$

As shown, there is an additional phase term of π/3 in the amplitude component of $EMF_2$ and 2π/3 in the amplitude component of $EMF_3$, due to spatial offsets between the three sense coils.

As in the previously described embodiments, the signals from the sense coils are input into respective mixers where they are demodulated and remodulated at the intermediate frequency. In particularly, the signals from the three sense coils are input into respective ones of the mixers 151a, 151b and 151c and the phase of the intermediate frequency component applied to each of the mixers 151a, 151b and 151c is chosen such that, when the outputs of the mixers 151a, 151b and 151c are added together in the adder 153, the output of the adder circuit 153 is a signal whose fundamental frequency is at the intermediate frequency and whose phase leads the phase of the reference intermediate frequency signal by an amount (θ) which depends upon the relatively position of the two movable members. Additionally, in this embodiment, the signals input to the mixers 151b and 151c are also input to respective ones of the mixers 151d and 151e and the phase of the intermediate frequency applied to mixers 151d and 151e is chosen such that, when the outputs of the mixers 151a, 151d and 151e are added together in the adder 155, the output of the adder circuit 155 is a signal whose fundamental frequency is at the intermediate frequency and whose phase lags the phase of the reference intermediate frequency signal by the amount (θ) which depends upon the relative position of the two movable members.

As those skilled in the art will realise, the subsequent processing of the signals output from the adders 153 and 155 can proceed in an identical manner to that described for the previously-described embodiments and will not be described further.

As mentioned above, the processing circuitry can be adapted to process the signals from any number of sense coils. Additionally, as those skilled in the art will appreciate, it is not necessary for the coils to be evenly spaced over the measurement path. Further still, a different weighting could be applied to the signals output from the different mixers.

In the general case when there are n sense coils spaced over the measurement path, and where a weighting is applied to the output of each mixer, then the output of the low pass filter after the mixing signals have been added together will have the following general form:

$$V_{OUT} = \begin{aligned} &+\frac{A_0}{4}\text{COS}[2\pi F_{IF} t + \theta](w_0 + w_1\text{COS}[\phi_1 + \psi_1] + \ldots + w_{n-1}\text{COS}[\phi_{n-1} + \psi_{n-1}]) \\ &+\frac{A_0}{4}\text{COS}[2\pi F_{IF} t - \theta](w_0 + w_1\text{COS}[\phi_1 - \psi_1] + \ldots + w_{n-1}\text{COS}[\phi_{n-1} - \psi_{n-1}]) \\ &-\frac{A_0}{4}\text{SIN}[2\pi F_{IF} t + \theta](w_1\text{SIN}[\phi_1 + \psi_1] + \ldots + w_{n-1}\text{SIN}[\phi_{n-1} + \psi_{n-1}]) \\ &-\frac{A_0}{4}\text{SIN}[2\pi F_{IF} t - \theta](w_1\text{SIN}[\phi_1 - \psi_1] + \ldots + w_{n-1}\text{SIN}[\phi_{n-1} - \psi_{n-1}]) \end{aligned} \quad (D)$$

Where $w_i$ is the weighting applied to the output signal from the mixer i; $\phi_i$ is the phase of the intermediate frequency component applied to mixer i and $\psi_i$ is the above-mentioned sense signal phase of the signal received from sense coil i. As those skilled in the art will appreciate, there are many different values of $w_i$, $\phi_i$ and $\psi_i$ which will result in $V_{OUT}$ reducing to a single sinusoidal component which varies with the relative position of the two relatively moveable members. When the weights ($w_i$) are the same, and when the n sense coils are evenly spaced over the measurement path, the following values of $\phi_i$ and $\psi_i$ will result in $V_{OUT}$ reducing to a signal sinusoid whose phase lags the phase of the reference intermediate frequency signal by an amount which is dependent on the relative position (θ) of the two relatively moveable members:

$$\phi_i = +\psi_i = \frac{i\pi}{n} \quad (11)$$

and the following values of $\phi_i$ and $\psi_i$ will result in $V_{OUT}$ reducing to a signal sinusoid whose phase leads the phase of the reference intermediate frequency signal by an amount (θ) which is dependent on relative position (θ) of the two relatively moveable members:

$$\phi_i = -\psi_i = \frac{-i\pi}{n} \quad (12)$$

As has been mentioned previously, by incorporating two channels and processing a first signal whose phase leads the phase of a reference signal by an amount θ (where θ is dependent on the relative position of the relatively moveable members) in one of the channels and processing a second signal whose phase leads the phase of the reference signal by the same amount θ, and subtracting the outputs of the two channels, any errors caused by common phase shifts in the components of each channel cancel out. However, as those skilled in the art will appreciate the signal processed in the second channel need not include the position-dependent component θ, but instead could simply be a reference signal at the intermediate frequency with a fixed phase. However, this embodiment is not preferred because, it is less symmetrical and has lower performance.

A fourth embodiment of the processing and excitation circuitry which can monitor the signals from the position encoder and identify if there is a fault will now be described with reference to FIGS. 50a and 50b. In this embodiment, the processing electronics receives signals from the sense coils 21 and 23 shown in FIG. 2 and from a further pair of sense coils 22 and 24 which have the same form as sense coils 21 and 23 but which are circumferentially staggered by 15° in the direction of rotation of the rotatable shaft relative to the sense coils 21 and 23 respectively. In this way, the signals induced in sense coils 21 and 23 are in phase quadrature, the signals induced in the sense coils 22 and 24 are in phase quadrature, the signal induced in coil 21 will be 45° shifted relative to the signal induced in coil 22 and the signal induced in coil 23 will be 45° shifted relative to the signal induced in coil 24.

Figure 50B:
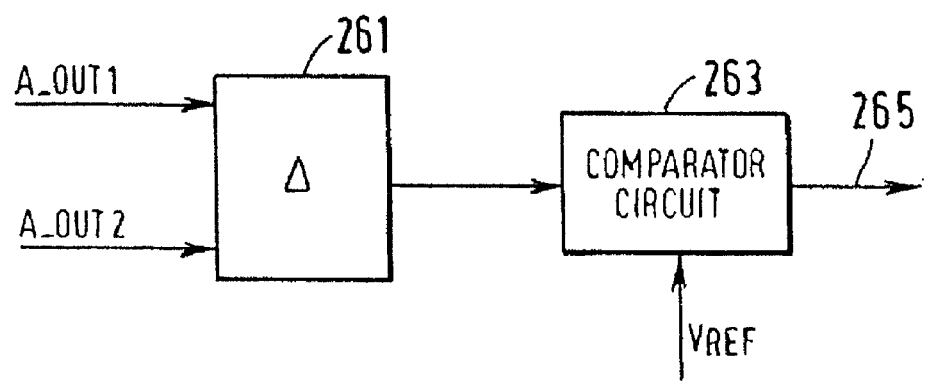
Figure 50A:
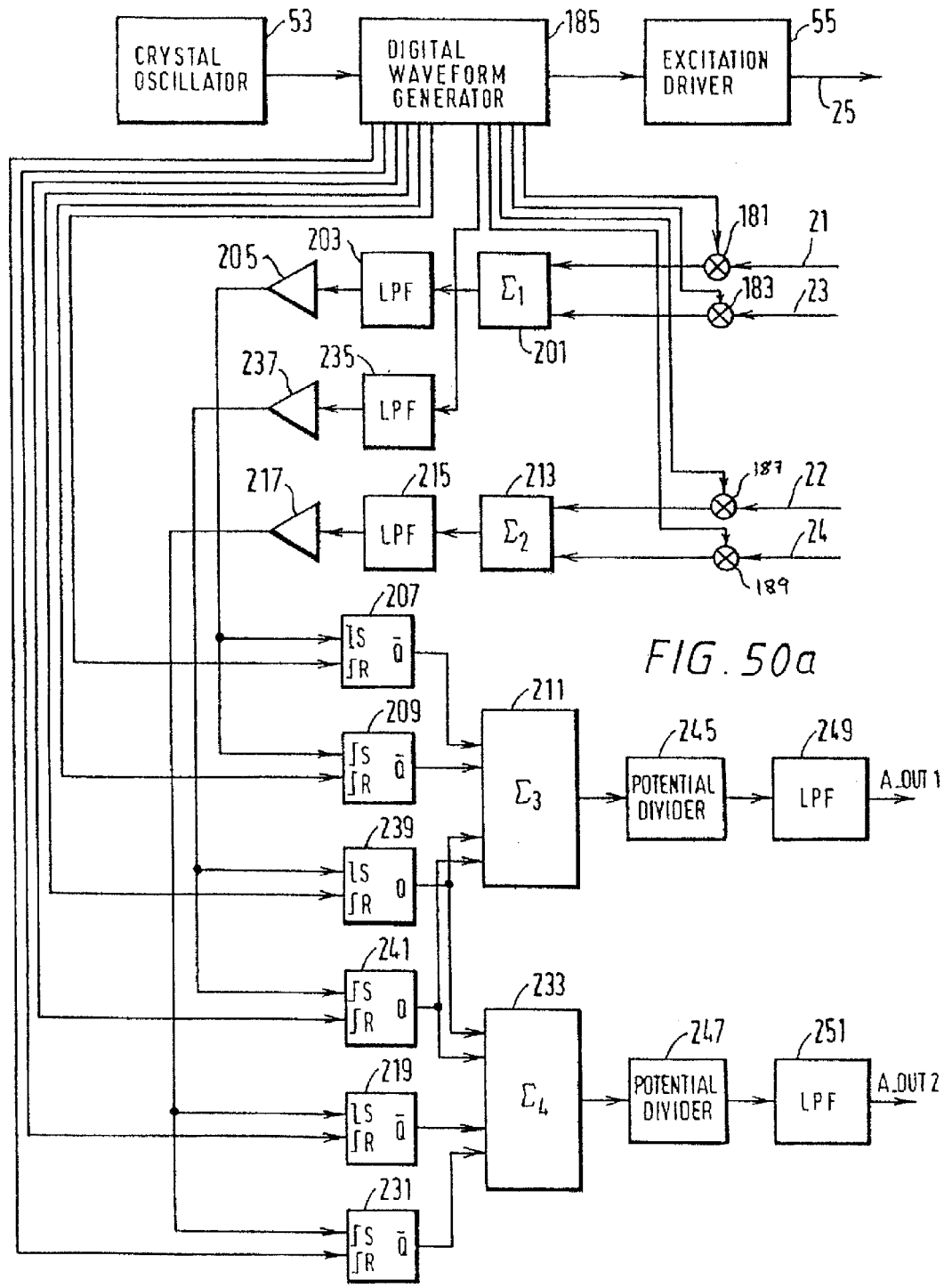
FIG. 50a is a schematic representation of excitation and processing circuitry for determining the relative position of two relatively moveable members from a position encoder which employs four sense coils.

As shown in FIG. 50a, the signals induced in the sense coils 21 and 23 are mixed in mixers 181 and 183 with mixing signals output by the digital waveform generator 185 and their outputs are added in adder 201. Similarly, the signals induced in the sense coils 22 and 24 are mixed in mixers 187 and 189 with mixing signals output by the digital waveform generator 185 and their outputs are added in adder 213. As in the first embodiment, the mixing signals are chosen so that the output from each adder will include only a single component at the intermediate frequency. The signal output from adder 201 is then processed in a first channel (formed by low pass filter 203, comparator 205 and latches 207 and 209) in the same manner as described above to generate two pulse width modulator signals which are input to the adder circuit 211. Similarly, the signal output from adder 213 is processed in a second channel (formed by low pass filter 215, comparator 217 and latches 219 and 231) in the same manner as described above to generate two pulse width modulated signals which are output to adder 233. In this embodiment, a reference intermediate frequency signal having a fixed phase is output by the digital waveform generator 185 and applied to a third channel (formed by low pass filter 235, comparator 237 and latches 239 and 241) to generate two pulse width modulated signals each of which are input to adder 211 and adder 233.

As those skilled in the art will appreciate, the operation of this embodiment is similar to the operation of the first embodiment, in that if there is an offset in one of the comparators, then this will be compensated for due to the action of the two latches associated with the corresponding channel. Similarly, if there is any common phase error due to, for example, the low pass filter or the comparator, then this common phase shift will be cancelled when the non-inverting signals output by latches 239 and 241 are added to the inverting output from latches 207 and 209 in adder 211 or added to the inverting output of latches 219 and 231 in adder 233.

The signal output from each of the adders 211 and 233 are then fed through a respective potential divider 245 and 247 and a respective low pass filter 249 and 251. In this embodiment, the reference signals which are applied to the two latches in each channel and the two potential dividers are arranged so that under normal operating conditions, the output signal (A_OUT1) obtained from the signals induced in sense coils 21 and 23 is nominally the same as the output signal (A_OUT2) obtained by processing the signals induced in sense coils 22 and 24. Therefore, by monitoring the difference between the two output voltages from the low pass filters 249 and 251, the system can automatically detect if there is an error, either with the position encoder or with the processing circuitry, and by adding the two output voltages an averaged position can be determined.

FIG. 50b illustrates one form of the monitoring circuitry which could be employed for this purpose. As shown, in this embodiment, the two output voltages from the low pass filters 249 and 251 are input to a subtracting circuit 261 which calculates the difference between them. This difference is then input to a comparator circuit 263 where it is compared with a reference voltage $V_{REF}$ (which in this embodiment is zero volts) which is the expected value the difference should be. If the comparator circuit 263 determines that the difference is not equal to the reference voltage $V_{REF}$ (plus or minus some tolerance), then it outputs a signal 265 indicating that there is a fault somewhere in the system.

In the above embodiment, the outputs from the comparators were passed through latch circuits to generate pulse width modulated signals. In an alternative embodiment, the leading and trailing edges of the signals output from the comparators 205, 237 and 217 could be used to latch the output of a counter register at the point in the intermediate frequency period where the corresponding edge transition occurred, thus generating six register values representing the phase of each edge of each of the three square wave signals output by the comparators. Digital circuitry, such as a micro-controller or hard wired digital logic could then read the values of these registers and perform the required sum and difference calculations to determine the position information and the fault information.

In the above embodiment, two channels were employed which processed position bearing signals and a third channel fed with a reference signal, was used for removing the common channel offsets which may be introduced into the calculations by, for example, temperature drift of components in the low pass filters. Instead of using three channels in this way, the position bearing signals from the two channels can be subtracted to give the position information and added to give the fault detection signal. However, such an embodiment is not preferred, since it is less accurate because any common phase errors in the two channels are added together in the fault detection signal.

Figure 51:
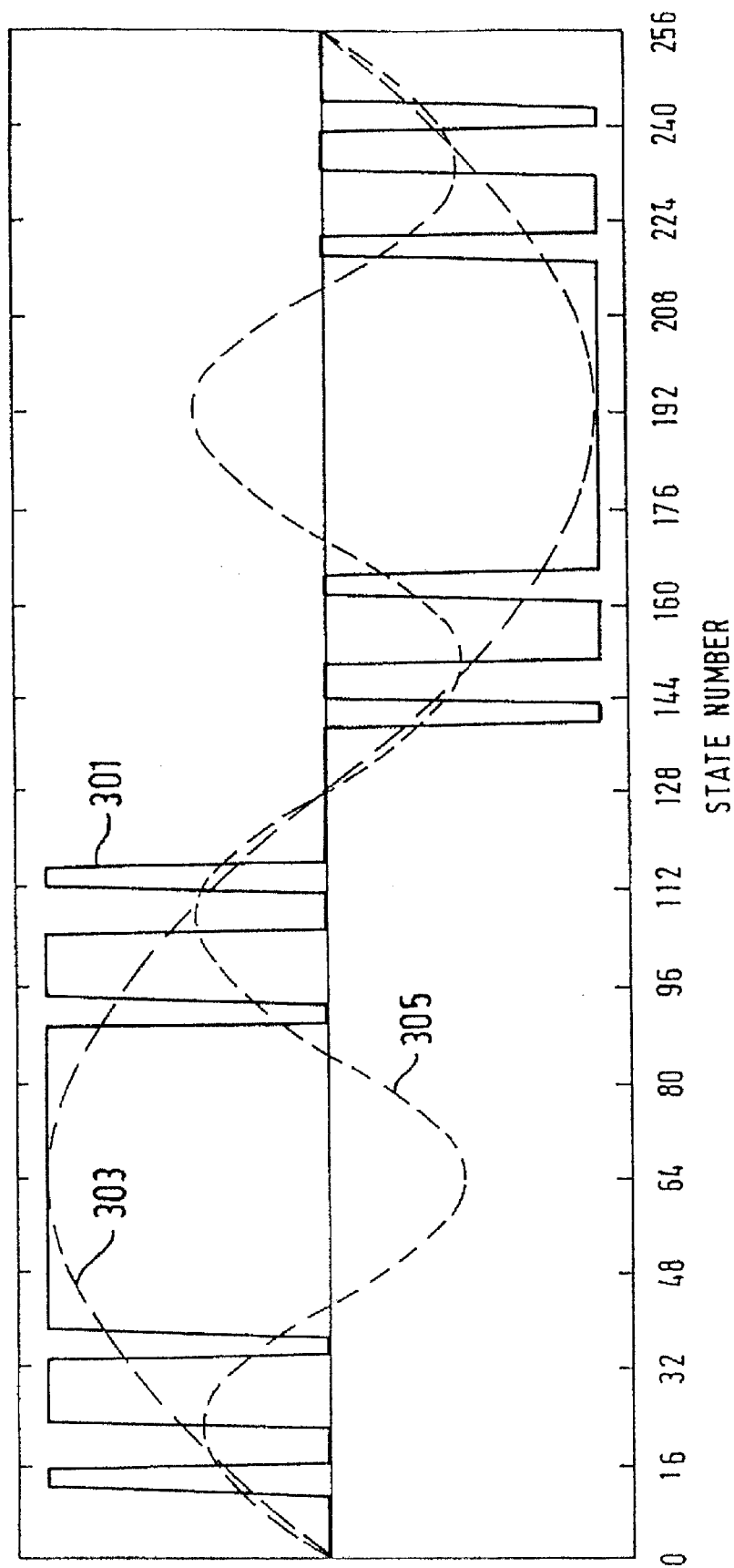
FIG. 51 is a timing diagram illustrating the preferred form of a three-level intermediate frequency mixing signal.

In the above embodiments, a three level intermediate frequency mixing signal was multiplied with the signals induced in the sense coils. As described above, the particular shape of the mixing signal was designed in order to reduce the energy in the low order harmonics of the intermediate frequency ($F_{IF}$) in the mixing signal. FIG. 51 shows in more detail one period of a preferred three level intermediate frequency mixing signal 301, which is employed in the above processing circuitry. FIG. 51 also shows the fundamental frequency component ($F_{IF}$) 303 of this mixing signal and the third harmonic component 305. As described above, the mixing signal is designed to reduce the energy in the lower order harmonics, such as in the third harmonic 305. As can be seen from FIG. 51, this is achieved by providing additional transitions in the mixing signal in the vicinity where the third harmonic component 305 add with the fundamental component. As shown in FIG. 51, successive transitions within each quarter period change the state of the IF mixing signal in the opposite direction, eg from 0 to 1 and then from 1 to 0. The number of transitions and the exact location of the transitions within the intermediate frequency period to achieve the required suppressing of the low order harmonics can be determined utilising computer modelling and optimisation techniques. In the illustrated example, three transitions are provided within each quarter cycle of the intermediate frequency period which successfully reduce the energy content within at least the third, fifth and seventh harmonics.

Figure 52:
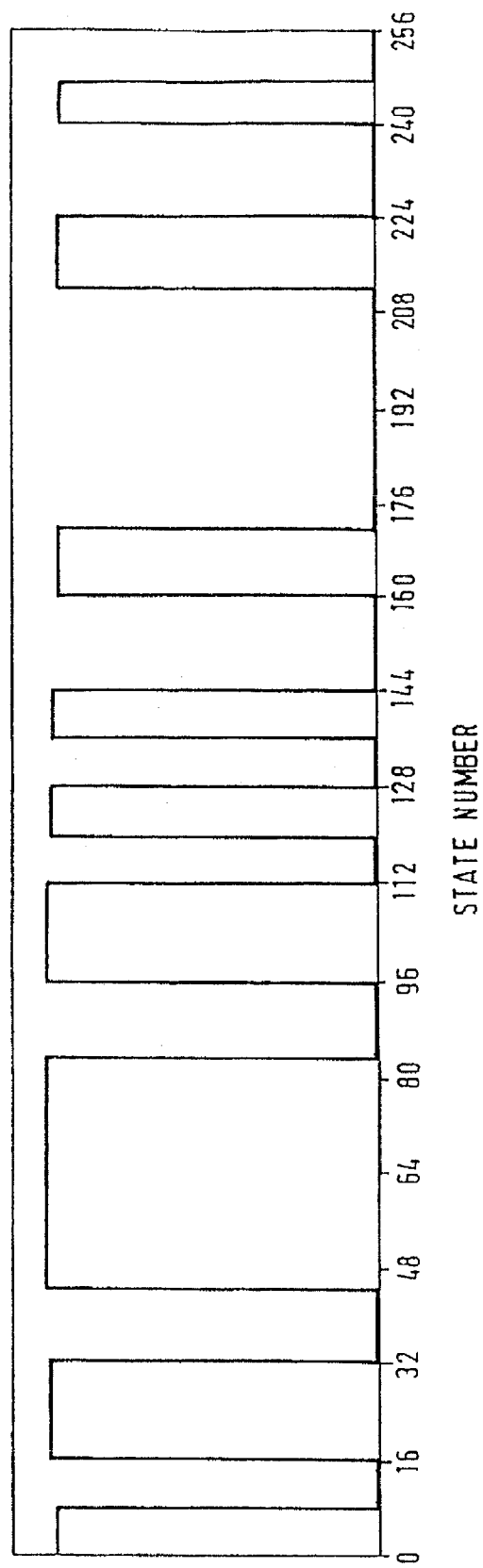
FIG. 52 is a timing diagram illustrating the preferred form of a two-level intermediate frequency mixing signal.

In the above embodiments, a three level intermediate frequency signal was mixed with the signals received from the sense coils. A similar reduction in the low order harmonics can also be achieved by multiplying the signals received from the sense coils with a two level intermediate frequency signal which also has a number of transitions which are designed to reduce the contribution to the signal made by the low order harmonics. An example of such a two level intermediate frequency signal is shown in FIG. 52.

Another, simpler, embodiment of one aspect of the present invention will now be described. In this embodiment, the processing circuitry processes signals from the three periodic sense coils shown in FIG. 53. The rest of the position encoder shown in FIG. 1 is the same and will not be described in detail.

In this embodiment, as shown in FIG. 53a three periodic sense coils are used which extend circumferentially around the circuit board 15. Each sense coil comprises three periods of windings which are circumferentially spaced apart by 20°. FIG. 53a shows the conductors on the printed circuit board 15 which form these three sense coils 321, 323 and 325. Each sense coil 321, 323 and 325 comprises six loops of series connected conductors, connected such that adjacent loops are wound in the opposite sense. This makes the sense coils relatively immune to background electromagnetic interference. The angle over which one period of each sense coil extends is 120°. The ends of the sense coils 321, 323 and 325, are connected to processing circuitry (not shown) by the twisted wire pairs 327, 329 and 331 respectively. FIG. 53a also shows the conductor which forms the excitation coil 333 which is connected to excitation circuitry (not shown) by twisted wire pair 335.

FIGS. 53b and 53c illustrate the way in which the sense coils 321, 323 and 325 and the excitation coil 333 shown in FIG. 53a are formed by a top and bottom layer of printed conductors formed on the printed circuit board 15. The conductors on the top and bottom layers are connected, where appropriate, through via holes, some of which are referenced 337.

In operation, an AC excitation current is applied to the excitation coil 333 for energising the resonant circuit 31 shown in FIG. 3. In response, the resonant circuit 31 generates a magnetic field which induces an Electro-Motive Force (EMF) in each of the sense coils 321, 323 and 325, the amplitude of which varies sinusoidally with the relative position between the resonator and the sense coil. Preferably, the fundamental frequency of the excitation current applied to the excitation coil 333 corresponds with the resonant frequency of the resonant circuit 31, since this provides the maximum signal output. FIG. 54 illustrates the way in which the peak amplitude (E) of the EMF's generated in the sense coils 321, 323 and 325 vary with the rotation angle (θ) of the resonant circuit 31. As shown, the respective peak amplitudes 351, 353 and 355 vary sinusoidally and repeat every third of a revolution of the resonant circuit 31 (and hence of the rotatable shaft 1) and are separated by ⅓₁₆ of a period from each other. Therefore, the angular position of the rotatable shaft 1 can be determined unambiguously through 120° by suitable processing of the induced signals.

FIG. 55 schematically represents excitation and processing circuitry 360 embodying one aspect of the present invention, which is used to excite the excitation coil 333 and to process the signals induced in the sense coils 321, 323 and 325. The excitation signal is generated by the digital waveform generator 361 which receives an oscillating input from a crystal oscillator 363. In this embodiment, the excitation signal is a squarewave voltage having a fundamental frequency $F_0$ (e.g. 1 MHz) which is applied to an excitation driver 365 which drives the excitation coil 333.

As mentioned above, the energisation of the excitation coil energises the resonant circuit 31, which in turn generates a magnetic field which induces an EMF in each of the sense coils. The EMF's induced in the sense coils 321, 323 and 325 will include the components defined in equation 9 above.

The induced EMF's are applied to mixers 371, 373 and 375 respectively, where they are multiplied with signals 381, 383 and 385 respectively. Each of the mixing signals 381, 383 and 385 comprises two periodic time varying components. In this embodiment the first component ($V_1$) is a squarewave corresponding to the squarewave voltage applied to the excitation coil 333 but having a 90° offset to compensate for the phase change due to the resonator 31. In this embodiment, the second component ($V_2$) is also a squarewave signal but has a lower fundamental frequency $F_{IF}$ (e.g. 10.417 KHz) and, in this embodiment, a phase the same as the above mentioned sense signal phase from the corresponding sense coil 321, 323 or 325. The first component effectively demodulates the amplitude modulated EMF induced in the corresponding sense coil and the second component re-modulates it to an intermediate frequency $F_{IF}$.

The advantage of using squarewave signals for mixing with the incoming signal from the corresponding sense coil is that the digital waveform generator 361 can multiply these two signals together by simply performing an exclusive-or (XOR) function on the two squarewave components. This is because the high level of the squarewave signal represents positive one and the low level represents negative one. This can be easily verified by considering the truth table of an XOR gate. Additionally, by using squarewave mixing signals, the mixers 371, 373 and 375 can be implemented using an analog CMOS IC switch.

The signals output by the mixers 371, 373 and 375 are then added together in the adder 393 to give:

$$V_{OUT} = \frac{3A_0}{4}(COS[2\pi F_{IF}t - \theta]) \tag{13}$$

Therefore the output signal from the adder 393 includes a single sinusoid at the intermediate frequency whose phase varies with the angular position of the rotatable shaft. As those skilled in the art will appreciate, the other intermediate frequency components cancel due to the particular choice of the phase of each of the intermediate frequency mixing signals. The output $V_{OUT}$ from the adder will also contain high frequency odd harmonic components, but these are removed by the low pass filter 395. The single intermediate frequency component in $V_{OUT}$ is then supplied to the comparator 397, where it is converted into a corresponding squarewave by comparing it with a reference voltage $V_{REF}$.

In order to measure the phase of this single intermediate component, the squarewave signal output by the comparator 397 is applied to the resent input (R) of a set-reset latch 399. The set input (S) of the latch 399 receives a squarewave signal 3100 generated by the digital waveform generator 361. In this embodiment, the squarewave signal 3100 has the same fundamental frequency $F_{IF}$ and phase as the second mixing component $V_2$ applied to mixer 371. The squarewave signal 3100 may be passed through a low pass filter corresponding to low pass filter 395 and then compared with the reference voltage $V_{REF}$ prior to being applied to the set input of the latch 399. This reduces the effect of offset errors caused by temperature drift of the electronic components, since both signals applied to the input of the latch 399 will have been processed by similar electronics.

FIG. 56a shows the resulting Q output signal 3101 from the latch 399. As shown, output signal 3101 is a periodic squarewave signal having a period ($T_{IF}$) the same as the second mixing components $V_2$ applied to the mixers 371, 373 and 375 and a duty ratio which varies linearly with the angular position (φ) of the rotable shaft 1.

FIG. 56b illustrates the way in which the duty ratio of the output signal 101 ($V_{101}$) varies with the rotation angle of the rotatable shaft. As shown, the duty ratio varies in a sawtooth manner, repeating every 120° of rotation of the rotatable shaft 1.

If this embodiment the output signal 3101 from the latch 399 is also applied to the input of a low pass filter 3103 which removes all the time varying components to leave in output signal 3105 representing the amount of DC signal present in the output signal 3101. As shown in FIG. 56c, the ratio of the output signal 105 ($V_{105}$) to the supply voltage $V_{supply}$ also varies in a sawtooth manner (with a maximum value of 0.6), repeating every 120° of rotation of the rotatable shaft 1.

FIGS. 57a–57d illustrate a circuit diagram of the excitation and processing circuitry 360 schematically shown in FIG. 55. In particular, FIG. 57a is a circuit diagram showing the crystal oscillator 363 and the digital waveform generator 361. As shown, the crystal oscillator 363 generates a 4 MHz signal which is applied to various counters and logic gates of the digital waveform generator 361. The waveform generator 361 outputs two signals TXA and TXB which are applied to the excitation driver 365 shown in FIG. 57b and signals 3100, 381, 383 and 385 which are used in the processing circuitry. FIG. 57b illustrates the circuit diagram of the excitation driver 365 which receives the signals TXA and TXB from the digital waveform generator 361 and outputs the excitation signal to the twisted wire pair 335 which, as shown in FIG. 53a, is connected to the excitation coil 333.

FIG. 57c is a circuit diagram showing part of the processing circuitry shown in FIG. 55. As shown, the ends of the twisted wire pairs 327, 329 and 331 are connected to the input of a triple change over CMOS switch which forms the mixers 371, 373 and 375. The CMOS switch also receives signals 381, 383 and 385 output from the digital waveform generator 361 shown in FIG. 57a. FIG. 57c also shows the adder 393 which adds the signals from the mixers 371, 373 and 375, the low pass filter 395 which filters out the high frequency odd harmonic components from the output of the adder 393 and the comparator 397 which compares the filtered output signal with a reference voltage $V_{REF}$. As illustrated in FIG. 57c, the reference voltage $V_{REF}$ equal 2.5 volts, since the input signal varies between zero and positive five volts.

FIG. 57d shows a circuit diagram of the rest of the processing circuitry shown in FIG. 55. In particular, FIG. 57d shows the set-reset latch 399 and the low pass filter 3103 used to filter the output signal 3101 from the latch 399 to produce the output signal 3105.

In the second embodiment described above, the EPROM 137 stored the values of the reference signal and the reset signals for a whole period of the intermediate frequency. This is not essential for all signals. In particular, as can be seen from FIGS. 43 to 46, the signals used to control the switches in the mixers are symmetrical and are based on repeating units of a quarter of the intermediate frequency period. Therefore, if a more sophisticated control circuit is used to control the addressing of the EPROM, then the EPROM can be made to cyclically regenerate this repeating quarter frame in the appropriate order, in order to regenerate the control signals. Alternatively still, these signals may be generated from counters and control logic which cyclically generate the signals at the intermediate frequency.

In the first embodiment, two drive signals TXA and TXB were applied differentially across the ends of the excitation coil 25. In an alternative embodiment, one end of the excitation coil 25 could be grounded and one of the drive signals TXA or TXB could be applied to the other end. However, differential drive is preferred, since power supply ripple current is lower and the circuit is better balanced, resulting in better EMC performance.

In the first embodiment, the reference signal 82 was the same as reference signal 88 and reference signal 84 was the same as reference signal 86. This is not essential. Indeed, the positions of the peaks in these reference signals may be varied in order to vary the angular position of the shaft 1 which will correspond to an output voltage of 0 volts. The relative position of the peaks in these reference signals within an intermediate frequency period are set by the phases of the intermediate frequency filters 73 and 75 and the output offset required (e.g. what value φ takes at what phase width modulation output ratio, and hence output voltage). The reference signals shown in FIGS. 14a represent the special case where the phase shift of the low pass filters 73 and 75 are both 90° and a mid-range output voltage of 2.5 volts is required at φ=90°. In the embodiments described above, the pulses on the reference signals 82 and 84 (and similarly 86 and 88) are always half an intermediate frequency period apart, because the output from the comparators are arranged to have a nominal 50% duty ratio. If this is not the case, then the timing between these reference signals would be adjusted accordingly.

As those skilled in the art will appreciate, the excitation and processing circuitry described above can be implemented in a single application specific integrated device. In this case, the low pass filter used to output the output voltage A_OUT and the intermediate frequency filters may be implemented using switched capacitor filter techniques. Such an application specific integrated circuit solution would lead to significant reduction in cost if the processing circuitry is mass produced. The dual channel technique described above (to remove common phase errors from the channels) would be of particular benefit in such an embodiment, since it is easier to match two components using semiconductors than it is to guarantee absolute stability of an individual component.

In the above embodiments, a crystal oscillator has been used to generate the system clock signal. Such a crystal oscillator has the advantage of high frequency stability. The frequency stability requirement is governed mainly by the need to match the excitation frequency to the resonant frequency of the resonator. This would not be the case if a conductive screen based sensor device were used, where the frequency stability may be relaxed considerably. Additionally, since the low pass filters have frequency dependent phase errors, a crystal oscillator is generally required. However, if the dual channel approach which removes common phase errors is employed, then a less expensive oscillator such as a ceramic or RC oscillator can be used.

In applications, where a digital output signal is required, such as in machine tool applications, the processing circuits described above can be modified by using the leading and trailing edges of the signals output from the comparator 77 and 79 to latch the output of a counter register at the point in the intermediate frequency frame where the corresponding edge transition occurred, thus generating four registers representing the phase of each edge of each of the two square wave signals output by the comparators 77 and 79. A digital circuit such as a micro-controller or hard wired digital logic can then read the values of the registers and perform the required sum and difference calculations where were previously performed with analogue electronics, in order to determine the position of the two relatively moveable members. For high resolution, a phase counter with a large number of bits and a high frequency clock would be used. The use of a micro-controller means that the position output can be continuous at the transitions between one period and another, so that a high quality incremental system with multiple periods can be formed. The micro-controller may process the spatial phase information from the received signals in order to determine position as is known in the art. Additionally, where more than one set of quadrature windings having different periods are provided over the measurement path, the micro-controller can perform a Vernier-type calculation to determine absolute position of the two relatively moveable members.

Although the embodiments described above use a non-contact inductive position encoder, as those skilled in the art will appreciate, the above processing circuitry can be used to process signals from a position encoder which uses capacitive coupling or to process the signals from a position encoder which has direct contact between the two relatively moveable members. Indeed, the processing circuitry described above can be used to process the signals from any system which employs amplitude modulated signals with the information being sinusoidally modulated onto the amplitude of the carrier signal. The processing circuitry can be used, for example, to process signals from optical apparatuses, resolvers, microwave systems and potentiometers. In some of these applications, DC signals may be input to the mixers, in which case the demodulation component of the mixing signal will be omitted.

In the above embodiments, the pulse width modulated signals output by the latches were added together and filtered to generate an output DC voltage whose value monotonically varies with the angular position of the rotatable shaft. This is not essential. Some applications may use the combined pulse width modulated signal output from the adder 89 or the potential divider 91.

What is claimed is:

1. A position detector comprising:

first and second members mounted for relative movement in a measurement path, said first member comprising a plurality of sensing circuits, each extending along said measurement path and being offset from each other in said measurement path and said second member comprising generating means for generating, in each of said sensing circuits, a time varying periodic carrier signal whose amplitude varies sinusoidally with the relative position between said generating means and the respective sensing circuit and wherein, due the offset between said sensing circuits, the sinusoidal variation of the amplitude of the signals generated in said sensing circuits are out of phase with respect to each other;

means for combining a first periodic time varying signal having the same period as said carrier signal with a respective one of a plurality of second periodic time varying signals, each having the same predetermined period which is greater than the period of said carrier signal and each having a different predetermined phase, to generate a plurality of combined time varying signals;

means for multiplying each of the signals generated in said plurality of sensing circuits with a respective one of the plurality of combined signals generated by said combining means; and means for adding the signals from said multiplying means to provide an output signal;

wherein said predetermined phases of said plurality of second periodic time varying signals are determined so that said output signal from said adding means contains a single periodic component having the same predetermined period as said second periodic time varying signals and whose phase varies with the relative position between said first and second members.

2. A position detector according to claim 1, wherein the predetermined phases of said plurality of second periodic time varying signals are determined such that their magnitude equals the phase of the corresponding received signal with which it is multiplied.

3. A position detector according to claim 1, further comprising a waveform generator which is arranged to generate said first and second periodic time varying signals.

4. A position detector according to claim 3, wherein said first and second periodic time varying signals are squarewave signals.

5. A position detector according to claim 4, wherein said combining means is arranged to combine the two different periodic time varying signals prior to multiplication with the respective received signals using an XOR gate.

6. A position detector according to claim 4, wherein said multiplying means comprises a CMOS IC switch.

7. A position detector according to claim 1, further comprising means for filtering said output signal to remove components not having the same predetermined period as said second periodic time varying signals.

8. A position detector according to claim 7, wherein the output of said filtering means is substantially sinusoidal having said predetermined period, and wherein said apparatus further comprises means for converting said sinusoidal signal into a squarewave signal having said predetermined period and said phase which varies with said relative position.

9. A position detector according to claim 8, wherein said converting means comprises a comparator for comparing said sinusoidal signal with a reference signal.

10. A position detector according to claim 8, further comprising means for processing said squarewave signal having said predetermined period whose phase varies with said relative position to output a different squarewave signal whose duty ratio varies with said relative phase.

11. A position detector according to claim 10, wherein said processing means comprises a set-reset latch.

12. A position detector according to claim 1, wherein said plurality of sensing circuits are inductively coupled to said generator means.

13. A position detector according to claim 1, wherein said sensing circuits are capacitively coupled to said generator means.

14. A position detector according to claim 1, wherein said sensing circuits extend over a linear path.

15. A position detector according to claim 1, wherein said sensing circuits extend in a rotary path.

16. A position detector according to claim 1, wherein said sensing circuits extend in a radial path.

17. A position detector according to claim 1, wherein the modulus of the phase of said second periodically varying signals is given by $(i\pi)/n$, where n is the number of sensing circuits.

18. A method of determining the relative position between first and second members which are relatively moveable in a measurement path, said first member comprising a plurality of sensing circuits, each extending along said measurement path and being offset from each other in said measurement path, said method comprising the steps of:

using a generator on said second member to generate, in each of said sensing circuits, a time varying periodic carrier signal whose amplitude varies sinusoidally with the relative position between the second member and the respective sensing circuit on the first member, and wherein, due to the offset between said sensing circuits, the sinusoidal variation of the amplitude of the signals generated in said sensing circuits are out of phase with respect to each other;

combining a first periodic time varying signal having the same period as said carrier signal with a respective one of a plurality of second periodic time varying signals, each having the same predetermined period which is greater than the period of said carrier signal and each having a different predetermined phase, to generate a plurality of combined time varying signals;

multiplying each of the signals generated in said plurality of sensing circuits with a respective one of the plurality of combined signals generated in said combining step; and adding the signals from said multiplying step to provide an output signal;

wherein said predetermined phases of said plurality of second periodic time varying signals are determined so that said output signal from said adding means contains a single periodic component having the same predetermined period as said second periodic time varying signals and whose phase varies with the relative position between said first and second members.

19. A method according to claim 18, wherein the predetermined phases of said plurality of second periodic time varying signals are determined such that their modulus equals the phase of the corresponding received signal with which it is multiplied.

20. A method according to claim 18, comprising the step of using a signal generator to generate each of said periodic time varying signals.

21. A method according to claim 20, wherein said first and second periodic time varying signals are squarewave signals.

22. A method according to claim 21, wherein said combining step uses an XOR gate to combined said first and second periodic time varying signals prior to multiplication with the respective received signal.

23. A method according to claim 21, wherein a CMOS IC switch is used to multiply said time varying signals.

24. A method according to claim 18, further comprising the step of filtering said output signal to remove components not having the same predetermined period as said second periodic time varying signals.

25. A method according to claim 24, wherein the output of said filtering step is a sinusoidal signal having said predetermined period, and wherein said method further comprises the step of converting said sinusoidal signal into a squarewave signal having said predetermined period and said phase which varies with said relative position.

26. A method according to claim 25, wherein said converting step compares said sinusoidal signal with a reference signal.

27. A method according to claim 25, further comprising the step of processing said squarewave signal having said predetermined period whose phase varies with said relative position to output a different squarewave signal whose duty ratio varies with said relative phase.

28. A method according to claim 27, wherein said processing step uses a set-reset latch.

29. A processing apparatus for processing a plurality of signals received from a position encoder used to encode the relative positions of two relatively movable members, wherein each of said plurality of signals varies sinusoidally with said relative position and out of phase with respect to each other, the apparatus comprising:

means for combining a first periodic time varying signal having a first period with a respective one of a plurality of second periodic time varying signals, each having the same predetermined period which is greater than the period of said first periodic time varying signal and each having a different predetermined phase, to generate a plurality of combined time varying signals;

means for multiplying each of said received signals with a respective one of the plurality of combined signals generated by said combining means; and means for adding the signals from said multiplying means to provide an output signal, and wherein said predetermined phases of said periodically varying signals are determined so that, in use, the output signal from said adding means contains a single period whose phase varies with the relative position of the relatively moveable members.

30. An apparatus according to claim 29, wherein each of said periodic time varying signals comprises a digital signal having a fundamental frequency component corresponding to said predetermined period and higher order harmonics; and wherein each period of said periodic time varying signals includes a plurality of transitions between levels within the digital signal which are arranged so that the energy within at least the third harmonic is reduced as compared with that of the third harmonic in a square wave signal having the same fundamental frequency component.

31. An apparatus according to claim 29, wherein each of said plurality of signals received from a position encoder amplitude modulates a periodic time varying carrier signal having a period substantially equal to said first period.

32. An apparatus according to claim 29, further comprising a waveform generator for generating each of said periodic time varying signals.

33. An apparatus according to claim 32, wherein each of said periodic time varying signals are two or three level digital signals.

34. An apparatus according to claim 33, wherein said waveform generator is arranged to combine the two different periodic time varying signals prior to multiplication with the respective input signal.

35. An apparatus according to claim 29, wherein said multiplying means comprises at least one CMOS IC switch.

36. An apparatus according to claim 29, wherein the predetermined phases of said periodic time varying signals are determined such that their magnitude equals the phase of the corresponding received signal with which it is multiplied.

37. An apparatus according to claim 29, further comprising means for filtering said output signal to remove components not having said predetermined period.

38. An apparatus according to claim 37, wherein the output of said filtering means is substantially sinusoidal having said predetermined period and wherein said apparatus further comprises means for converting said sinusoidal signal into a square wave signal having said predetermined period and said phase which varies with said relative position.

39. An apparatus according to claim 38, wherein said converting means comprises a comparator for comparing said sinusoidal signal with a reference signal.

40. An apparatus according to claim 29, wherein the modulus of the phase of each of said periodically varying signals is given by $(i\pi/)/n$, where n is the number of received signals.

41. An apparatus according to claim 30, wherein said transitions are located within said period in the vicinity where said fundamental component and at least said third harmonic component add together.

42. An apparatus according to claim 29, wherein said periodic time varying signals each comprise a three level digital signal and wherein said multiplying means comprises at least two switches.

43. An apparatus according to claim 42, comprising a digital waveform generator operable for generating at least two control signals for controlling a respective one of said switches based upon said three level digital signal.

44. An apparatus according to claim 29, further comprising processing means for processing said output signal from said combining means to generate another signal having a characteristic different from said phase which monotonically varies with the value of said variable.

45. An apparatus according to claim 44, wherein said processing circuitry comprises:
   a comparator for comparing the output signal from said combining means with a reference signal to generate a square wave signal whose phase varies with the value of said variable;
   a first circuit responsive to the leading edge of said square wave signal to generate a first signal having a value which monotonically varies with the phase of the output signal from said combining means and hence with the value of said variable over one period of said sinusoidal variation;
   a second circuit responsive to the trailing edge of said square wave signal to generate a second signal having a value which monotonically varies with the phase of said output signal from said combining means and hence with the value of said variable over one period of said sinusoidal variation; and
   an adding circuit or a subtracting circuit for combining the first and second output signal values from said first and second circuits to provide a resultant output signal having a value which monotonically varies with the value of said variable over one period of said sinusoidal variation.

46. An apparatus according to claim 44, wherein said processing means comprises first processing circuitry for processing said output signal from said combining means to generate said another signal having said characteristic different from said phase which monotonically varies with the value of said variable and second processing circuitry for processing a periodic time varying signal having said predetermined period to generate an output signal having a value which monotonically varies with the phase of the periodic time varying signal being processed; and
   second combining means for combining the output signal value from said first processing circuitry with the output signal value from said second processing circuitry to provide a combined output signal having a value which monotonically varies with the value of said variable over one period of said sinusoidal variation.

47. An apparatus according to claim 29, wherein said combining means is a first combining means and further comprising:
   a comparator for comparing said output signal with a reference voltage to generate a square wave signal whose phase varies with said variable;
   a first circuit responsive to the leading edge of said square wave signal to generate a first signal having a value which monotonically varies with the phase of the output signal from said first combining means and hence with the value of said variable over one period of said sinusoidal variation;
   a second circuit responsive to the trailing edge of said square wave signal to generate a second signal having a value which monotonically varies with the phase of the output signal from said first combining means and hence with the value of said variable over one period of said sinusoidal variation; and
   second means for combining the first and second output signal values from said first and second circuits to provide a combined output signal having a value which monotonically varies with the value of said variable over one period of said sinusoidal variation.

48. An apparatus according to claim 47, wherein said first and second circuits each comprise a latch circuit which is operable to output a pulse width modulated time varying signal whose DC level monotonically varies with the value of said variable.

49. An apparatus according to claim 48, further comprising filter means for filtering out the time varying component of said pulse width modulated signal to provide a DC output whose value monotonically varies with the value of said variable.

50. An apparatus according to claim 47, wherein said first and second circuits each comprise a counter which is operable to output a count which monotonically varies with the value of said variable.

51. An apparatus according to claim 29, wherein said combining means is a first combining means and further comprising:
   first processing circuitry for processing said output signal from said first combining means to generate an output signal having a value which monotonically varies with the phase of the output signal from said first combining means and hence with the value of said variable over one period of said sinusoidal variation;
   second processing circuitry for processing a periodic time varying signal having said predetermined period to generate an output signal having a value which monotonically varies with the phase of the periodic time varying signal processed; and
   second means for combining the output signal value from said first processing circuitry with the output signal value from said processing circuitry to provide a combined output signal having a value which monotonically varies with the value of said variable over one period of said sinusoidal variation.

52. An apparatus according to claim 51, wherein said first and second processing circuitry comprises a comparator for comparing the output signal from said first combining means with a reference signal to generate a square wave signal whose phase varies with the value of said variable.

53. An apparatus according to claim 52, wherein each of said first and second processing circuitry comprises pulse width modulation means responsive to the square wave signal output from said comparator, for generating a pulse width modulating signal whose duty ratio varies with the value of said variable.

54. An apparatus according to claim 53, wherein said pulse width modulation means is responsive to the leading edge of said square wave signal to generate a first pulse width modulated signal whose duty ratio varies with the value of said variable, and wherein each of said first and second processing circuitry further comprises a second pulse width modulating means responsive to the trailing edge of said square wave signal output by said comparator for generating a second pulse width modulated signal whose duty ratio varies with the value of said variable.

55. An apparatus according to claim 53, wherein each of said pulse width modulating means comprises a latch.

56. An apparatus according to claim 54, wherein said second combining means is operable to combine the signals from each of said pulse width modulating means to generate a combined output signal having a value which is less sensitive to voltage offsets in said comparator.

57. An apparatus according to claim 46, wherein said signal processed by said second processing circuitry is a reference periodic time varying signal having said predetermined period and a predetermined phase.

58. An apparatus according to claim 46, wherein said signal processed by said second processing circuitry comprises a single periodic component having said predetermined period, the phase of said component varying with the value of said variable and wherein the variation of the phase of the signal processed by the first processing circuitry varies in the opposite sense to the variation in phase of the signal processed by said second processing circuitry.

59. An apparatus according to claim 58, wherein the signal processed by the first and second processing circuits are obtained from different input signals.

60. An apparatus according to claim 58, wherein the signal processed by said first and second processing circuits are obtained using at least one common input signal.

61. An apparatus according to claim 38, further comprising means for processing said square wave signal having said predetermined period whose phase varies with said relative position to input a different square wave signal whose duty ratio varies with said relative phase.

62. An apparatus according to claim 29, wherein said periodic time varying signals comprise a two or a three level digital signal having a number of spaced transitions within the period, the location of the spacings being to arrange to reduce the energy within at least the low order harmonics of the time varying signals.

63. A position detecting method comprising the steps of:
providing first and second members that are movable relative to each other along a measurement path, said first member comprising a plurality of sensing circuits, each extending along said measurement path and being offset from each other in said measurement path and said second member comprising generating means for generating, in each of said sensing circuits, a time varying periodic carrier signal whose amplitude varies sinusoidally with the relative position between said generating means and the respective sensing circuit and wherein, due to the offset between said sensing circuits, the sinusoidal variation of the amplitude of the signals generated in said sensing circuits are out of phase with respect to each other;
combining a first periodic time varying signal having the same period as said carrier signal with a respective one of a plurality of second periodic time varying signals, each having the same predetermined period which is greater than the period of said carrier signal and each having a different predetermined phase, to generate a plurality of combined time varying signals;
multiplying each of the signals generated in said plurality of sensing circuits with a respective one of the plurality of combined signals generated by said combining means;
adding the signals from said multiplying step to provide an output signal; and
determining the relative position of said first and second members using said output signal;
wherein said predetermined phases of said plurality of second periodic time varying signals are determined so that said output signal from said adding step contains a single periodic component having the same predetermined period as said second periodic time varying signals and whose phase varies with the relative position between said first and second members.

64. A method of processing a plurality of signals received from a position encoder used to encode the relative positions of two relatively movable members, wherein each of the plurality of signals varies sinusoidally with said relative position and out of phase with respect to each other, the method comprising the steps of:
combining a first periodic time varying signal having a first period with a respective one of a plurality of second periodic time varying signals, each having the same predetermined period which is greater than the period of said first periodic time varying signal and each having a different predetermined phase to generate a plurality of combined time varying signals;
multiplying each of the received signals with a respective one of the plurality of combined signals generated in said combining step; and
adding the signals from said multiplying step to provide an output signal, and wherein said predetermined phases of said periodically varying signals are determined so that the output signal from said adding step contains a single periodic component having said predetermined period whose phase varies with the relative position of the relatively movable members.

* * * * *

UNITED STATES PATENT AND TRADEMARK OFFICE
CERTIFICATE OF CORRECTION

PATENT NO. : 6,788,221 B1
DATED : September 7, 2004
INVENTOR(S) : Ely et al.

It is certified that error appears in the above-identified patent and that said Letters Patent is hereby corrected as shown below:

Column 33,
Line 41, delete "combined" and insert -- combine --.

Signed and Sealed this

Eleventh Day of April, 2006

JON W. DUDAS
*Director of the United States Patent and Trademark Office*